(12) United States Patent
Couture et al.

(10) Patent No.: US 11,579,327 B2
(45) Date of Patent: *Feb. 14, 2023

(54) HANDHELD BACKSCATTER IMAGING SYSTEMS WITH PRIMARY AND SECONDARY DETECTOR ARRAYS

(71) Applicant: American Science and Engineering, Inc., Billerica, MA (US)

(72) Inventors: Aaron J. Couture, Reading, MA (US); Jeffrey M. Denker, Woburn, MA (US)

(73) Assignee: American Science and Engineering, Inc., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/124,260

(22) Filed: Dec. 16, 2020

(65) Prior Publication Data

US 2021/0132239 A1 May 6, 2021

Related U.S. Application Data

(60) Continuation of application No. 16/855,683, filed on Apr. 22, 2020, which is a continuation of application
(Continued)

(51) Int. Cl.
*G01N 23/20008* (2018.01)
*G01N 23/203* (2006.01)
(Continued)

(52) U.S. Cl.
CPC .......... *G01V 5/0025* (2013.01); *G01N 23/04* (2013.01); *G01N 23/083* (2013.01); *G01N 23/10* (2013.01);
(Continued)

(58) Field of Classification Search
CPC .... G01T 1/00; G01T 1/16; G01T 1/20; G01T 1/2006; G01T 1/201; G01T 1/2018;
(Continued)

(56) References Cited

U.S. PATENT DOCUMENTS 663,072 A 12/1900 Coy
2,831,123 A 4/1958 Daly
(Continued)

FOREIGN PATENT DOCUMENTS

CN 1270318 A 10/2000
CN 1493176 A 4/2004
(Continued)

OTHER PUBLICATIONS

Rose, Kathryn, "NuMl Off-Axis Experiment" Datasheet (online). University of Oxford & Rutherford Appleton Laboratory, 2003. <URL: https://slideplayer.com/slide/8765673/>.
(Continued)

*Primary Examiner* — Thomas R Artman
(74) *Attorney, Agent, or Firm* — Novel IP

(57) ABSTRACT

The present specification provides a detector for an X-ray imaging system. The detector includes at least one high resolution layer having high resolution wavelength-shifting optical fibers, each fiber occupying a distinct region of the detector, at least one low resolution layer with low resolution regions, and a single segmented multi-channel photo-multiplier tube for coupling signals obtained from the high resolution fibers and the low resolution regions.

60 Claims, 37 Drawing Sheets

Related U.S. Application Data

No. 16/382,951, filed on Apr. 12, 2019, now Pat. No. 10,670,740, which is a continuation-in-part of application No. 16/242,163, filed on Jan. 8, 2019, now abandoned, which is a continuation of application No. 15/490,787, filed on Apr. 18, 2017, now Pat. No. 10,209,372, which is a continuation of application No. 15/050,894, filed on Feb. 23, 2016, now Pat. No. 9,658,343, which is a division of application No. 13/758,189, filed on Feb. 4, 2013, now Pat. No. 9,285,488.

(60) Provisional application No. 61/607,066, filed on Mar. 6, 2012, provisional application No. 61/598,521, filed on Feb. 14, 2012, provisional application No. 61/598,576, filed on Feb. 14, 2012.

(51) Int. Cl.
| | | |
|---|---|---|
| *G01V 5/00* | (2006.01) | |
| *G01T 1/20* | (2006.01) | |
| *G01N 23/04* | (2018.01) | |
| *G01N 23/083* | (2018.01) | |
| *G01N 23/10* | (2018.01) | |
| *H01L 27/146* | (2006.01) | |
| *G01T 1/203* | (2006.01) | |
| *G01T 7/00* | (2006.01) | |
| *G01T 5/08* | (2006.01) | |
| *G01T 3/06* | (2006.01) | |

(52) U.S. Cl.
CPC ..... *G01N 23/203* (2013.01); *G01N 23/20008* (2013.01); *G01T 1/203* (2013.01); *G01T 1/2006* (2013.01); *G01T 1/2018* (2013.01); *G01V 5/0016* (2013.01); *H01L 27/14601* (2013.01); *H01L 27/14658* (2013.01); *G01N 2223/053* (2013.01); *G01N 2223/1013* (2013.01); *G01N 2223/1016* (2013.01); *G01N 2223/1066* (2013.01); *G01N 2223/301* (2013.01); *G01N 2223/3301* (2013.01); *G01N 2223/40* (2013.01); *G01N 2223/501* (2013.01); *G01N 2223/5055* (2013.01); *G01N 2223/639* (2013.01); *G01T 1/20* (2013.01); *G01T 1/2008* (2013.01); *G01T 3/06* (2013.01); *G01T 5/08* (2013.01); *G01T 7/00* (2013.01); *H01L 27/146* (2013.01); *H01L 27/14643* (2013.01)

(58) Field of Classification Search
CPC ......... G01T 1/202; G01T 1/203; G01T 1/208; G01T 1/24; G01T 3/06; G01T 5/08; G01T 7/00; H01L 27/142; H01L 27/144; H01L 27/146; H01L 27/14601; H01L 27/14643; H01L 27/14658; H01L 27/14665; H01L 27/14676; G01V 5/0016
See application file for complete search history.

(56) References Cited

U.S. PATENT DOCUMENTS

| | | | |
|---|---|---|---|
| 2,972,430 A | 2/1961 | Johnson | |
| 3,766,387 A | 10/1973 | Heffan | |
| 3,780,291 A | 12/1973 | Stein | |
| 3,784,837 A | 1/1974 | Holmstrom | |
| 3,961,186 A | 6/1976 | Leunbach | |
| 3,971,948 A | 7/1976 | Pfeiler | |
| 4,031,401 A | 6/1977 | Jacob | |
| 4,045,672 A | 8/1977 | Watanabe | |
| 4,047,035 A | 9/1977 | Dennhoven | |
| 4,064,440 A | 12/1977 | Roder | |
| 4,139,771 A | 2/1979 | Dennhoven | |
| 4,180,737 A | 12/1979 | Kingsley | |
| 4,200,800 A | 4/1980 | Swift | |
| 4,210,811 A | 7/1980 | Dennhoven | |
| 4,216,499 A | 8/1980 | Dennhoven | |
| 4,242,583 A | 12/1980 | Annis | |
| 4,259,582 A | 3/1981 | Albert | |
| 4,260,898 A | 4/1981 | Annis | |
| 4,267,446 A | 5/1981 | Brown | |
| 4,315,146 A | 2/1982 | Rudin | |
| 4,342,914 A | 8/1982 | Bjorkholm | |
| 4,366,382 A | 12/1982 | Kotowski | |
| 4,380,817 A | 4/1983 | Harding | |
| 4,420,182 A | 12/1983 | Kaneshiro | |
| 4,430,568 A | 2/1984 | Yoshida | |
| 4,472,822 A | 9/1984 | Swift | |
| 4,494,001 A * | 1/1985 | Peck | G01N 23/203 250/358.1 |
| 4,497,062 A | 1/1985 | Mistretta | |
| 4,503,332 A | 3/1985 | Annis | |
| 4,511,799 A | 4/1985 | Bjorkholm | |
| 4,525,854 A | 6/1985 | Molbert | |
| 4,566,113 A | 1/1986 | Doenges | |
| 4,599,740 A | 7/1986 | Cable | |
| 4,620,099 A | 10/1986 | Schoenig | |
| 4,641,330 A | 2/1987 | Herwig | |
| 4,646,339 A | 2/1987 | Rice | |
| 4,692,937 A | 9/1987 | Sashin | |
| 4,718,075 A | 1/1988 | Horn | |
| 4,736,401 A | 4/1988 | Donges | |
| 4,788,436 A | 11/1988 | Koechner | |
| 4,788,704 A | 11/1988 | Donges | |
| 4,799,247 A | 1/1989 | Annis | |
| 4,809,312 A | 2/1989 | Annis | |
| 4,825,454 A | 4/1989 | Annis | |
| 4,839,913 A | 6/1989 | Annis | |
| 4,864,142 A | 9/1989 | Gomberg | |
| 4,870,670 A | 9/1989 | Geus | |
| 4,884,289 A | 11/1989 | Glockmann | |
| 4,979,202 A | 12/1990 | Siczek | |
| 4,991,189 A | 2/1991 | Boomgaarden | |
| 5,022,062 A | 6/1991 | Annis | |
| 5,056,129 A | 10/1991 | Steinmeyer | |
| 5,065,418 A | 11/1991 | Bermbach | |
| 5,068,883 A * | 11/1991 | DeHaan | G01N 23/203 378/86 |
| 5,077,771 A | 12/1991 | Skillicorn | |
| 5,091,924 A | 2/1992 | Bermbach | |
| 5,098,640 A | 3/1992 | Gozani | |
| 5,103,099 A | 4/1992 | Bourdinaud | |
| 5,179,581 A | 1/1993 | Annis | |
| 5,181,234 A | 1/1993 | Smith | |
| 5,182,764 A | 1/1993 | Peschmann | |
| 5,224,144 A | 6/1993 | Annis | |
| 5,237,598 A | 8/1993 | Albert | |
| 5,247,561 A | 9/1993 | Kotowski | |
| 5,253,283 A | 10/1993 | Annis | |
| 5,281,820 A | 1/1994 | Groh | |
| 5,289,510 A | 2/1994 | Mihalczo | |
| 5,302,817 A | 4/1994 | Yokota | |
| 5,313,511 A | 5/1994 | Annis | |
| 5,319,547 A | 6/1994 | Krug | |
| 5,338,927 A | 8/1994 | De Groot | |
| 5,343,046 A | 8/1994 | Smith | |
| 5,367,552 A | 11/1994 | Peschmann | |
| 5,376,795 A | 12/1994 | Hasegawa | |
| 5,379,334 A | 1/1995 | Zimmer | |
| 5,391,878 A | 2/1995 | Petroff | |
| 5,394,454 A | 2/1995 | Harding | |
| 5,420,959 A | 5/1995 | Walker | |
| 5,430,787 A | 7/1995 | Norton | |
| 5,446,288 A | 8/1995 | Tumer | |
| 5,493,596 A | 2/1996 | Annis | |
| 5,524,133 A | 6/1996 | Neale | |
| 5,548,123 A | 8/1996 | Perez-Mendez | |
| 5,550,380 A | 8/1996 | Sugawara | |
| 5,600,144 A | 2/1997 | Worstell | |
| 5,600,303 A | 2/1997 | Husseiny | |
| 5,600,700 A | 2/1997 | Krug | |
| 5,629,515 A | 5/1997 | Maekawa | |

(56) References Cited

U.S. PATENT DOCUMENTS

| | | | |
|---|---|---|---|
| 5,629,523 A | 5/1997 | Ngo |
| 5,638,420 A | 6/1997 | Armistead |
| 5,642,393 A | 6/1997 | Krug |
| 5,642,394 A | 6/1997 | Rothschild |
| 5,665,969 A | 9/1997 | Beusch |
| 5,666,393 A | 9/1997 | Annis |
| 5,687,210 A | 11/1997 | Maitrejean |
| 5,692,028 A | 11/1997 | Geus |
| 5,692,029 A | 11/1997 | Husseiny |
| 5,696,806 A | 12/1997 | Grodzins |
| 5,734,166 A | 3/1998 | Czirr |
| 5,751,837 A | 5/1998 | Watanabe |
| 5,763,886 A * | 6/1998 | Schulte ............... G01N 23/203 |
| | | | 378/57 |
| 5,764,683 A | 6/1998 | Swift |
| 5,768,334 A | 6/1998 | Maitrejean |
| 5,783,829 A | 7/1998 | Sealock |
| 5,784,507 A | 7/1998 | Holm-Kennedy |
| 5,787,145 A | 7/1998 | Geus |
| 5,805,660 A | 9/1998 | Perion |
| 5,838,759 A | 11/1998 | Armistead |
| 5,856,673 A | 1/1999 | Ikegami |
| 5,866,907 A | 2/1999 | Drukier |
| 5,903,623 A | 5/1999 | Swift |
| 5,910,973 A | 6/1999 | Grodzins |
| 5,930,326 A | 7/1999 | Rothschild |
| 5,936,240 A | 8/1999 | Dudar |
| 5,940,468 A | 8/1999 | Huang |
| 5,968,425 A | 10/1999 | Bross |
| 5,974,111 A | 10/1999 | Krug |
| 6,018,562 A | 1/2000 | Willson |
| 6,031,890 A | 2/2000 | Bermbach |
| 6,055,111 A | 4/2000 | Nomura |
| 6,058,158 A | 5/2000 | Eiler |
| 6,067,344 A | 5/2000 | Grodzins |
| 6,078,052 A | 6/2000 | DiFilippo |
| 6,081,580 A | 6/2000 | Grodzins |
| 6,094,472 A | 7/2000 | Smith |
| 6,151,381 A | 11/2000 | Grodzins |
| 6,188,747 B1 | 2/2001 | Geus |
| 6,192,101 B1 | 2/2001 | Grodzins |
| 6,192,104 B1 | 2/2001 | Adams |
| 6,195,413 B1 | 2/2001 | Geus |
| 6,198,795 B1 | 3/2001 | Naumann |
| 6,203,846 B1 | 3/2001 | Ellingson |
| 6,212,251 B1 | 4/2001 | Tomura |
| 6,218,943 B1 | 4/2001 | Ellenbogen |
| 6,236,709 B1 | 5/2001 | Perry |
| 6,249,567 B1 | 6/2001 | Rothschild |
| 6,252,929 B1 | 6/2001 | Swift |
| 6,256,369 B1 | 7/2001 | Lai |
| 6,278,115 B1 | 8/2001 | Annis |
| 6,282,260 B1 | 8/2001 | Grodzins |
| 6,292,533 B1 | 9/2001 | Swift |
| 6,301,326 B2 | 10/2001 | Bjorkholm |
| 6,320,933 B1 | 11/2001 | Grodzins |
| 6,333,502 B1 | 12/2001 | Sumita |
| 6,356,620 B1 | 3/2002 | Rothschild |
| 6,407,392 B1 | 6/2002 | Tsuyuki |
| 6,421,420 B1 | 7/2002 | Grodzins |
| 6,424,695 B1 | 7/2002 | Grodzins |
| 6,434,219 B1 | 8/2002 | Rothschild |
| 6,435,715 B1 | 8/2002 | Betz |
| 6,442,233 B1 | 8/2002 | Grodzins |
| 6,445,765 B1 | 9/2002 | Frank |
| 6,453,003 B1 | 9/2002 | Springer |
| 6,453,007 B2 | 9/2002 | Adams |
| 6,456,684 B1 | 9/2002 | Mun |
| 6,459,761 B1 | 10/2002 | Grodzins |
| 6,459,764 B1 | 10/2002 | Chalmers |
| 6,473,487 B1 | 10/2002 | Le |
| RE37,899 E | 11/2002 | Grodzins |
| 6,483,894 B2 | 11/2002 | Hartick |
| 6,507,025 B1 | 1/2003 | Verbinski |
| 6,532,276 B1 | 3/2003 | Hartick |
| 6,542,574 B2 | 4/2003 | Grodzins |
| 6,542,578 B2 | 4/2003 | Ries |
| 6,542,580 B1 | 4/2003 | Carver |
| 6,543,599 B2 | 4/2003 | Jasinetzky |
| 6,546,072 B1 | 4/2003 | Chalmers |
| 6,552,346 B2 | 4/2003 | Verbinski |
| 6,556,653 B2 | 4/2003 | Hussein |
| 6,563,903 B2 | 5/2003 | Kang |
| 6,567,496 B1 | 5/2003 | Sychev |
| 6,580,778 B2 | 6/2003 | Meder |
| 6,584,170 B2 | 6/2003 | Aust |
| 6,597,760 B2 | 7/2003 | Beneke |
| 6,606,516 B2 | 8/2003 | Levine |
| 6,621,888 B2 | 9/2003 | Grodzins |
| 6,636,581 B2 | 10/2003 | Sorenson |
| 6,637,266 B1 | 10/2003 | Froom |
| 6,645,656 B1 | 11/2003 | Chen |
| 6,645,657 B2 | 11/2003 | Huang |
| 6,653,588 B1 | 11/2003 | Gillard-Hickman |
| 6,658,087 B2 | 12/2003 | Chalmers |
| 6,663,280 B2 | 12/2003 | Doenges |
| 6,665,373 B1 | 12/2003 | Kotowski |
| 6,665,433 B2 | 12/2003 | Roder |
| 6,687,326 B1 | 2/2004 | Bechwati |
| 6,747,705 B2 | 6/2004 | Peters |
| 6,763,635 B1 | 7/2004 | Lowman |
| 6,785,357 B2 | 8/2004 | Bernardi |
| 6,812,426 B1 | 11/2004 | Kotowski |
| 6,816,571 B2 | 11/2004 | Bijjani |
| 6,837,422 B1 | 1/2005 | Meder |
| 6,839,403 B1 | 1/2005 | Kotowski |
| 6,843,599 B2 | 1/2005 | Le |
| 6,859,607 B2 | 2/2005 | Sugihara |
| 6,876,719 B2 | 4/2005 | Ozaki |
| 6,879,657 B2 | 4/2005 | Hoffman |
| 6,909,770 B2 | 6/2005 | Schramm |
| 6,920,197 B2 | 7/2005 | Kang |
| 6,922,457 B2 | 7/2005 | Nagata |
| 6,965,662 B2 | 11/2005 | Eppler |
| 7,010,094 B2 | 3/2006 | Grodzins |
| 7,039,159 B2 | 5/2006 | Muenchau |
| 7,067,079 B2 | 6/2006 | Bross |
| 7,072,440 B2 | 7/2006 | Mario |
| 7,099,434 B2 | 8/2006 | Adams |
| 7,103,137 B2 | 9/2006 | Seppi |
| 7,110,493 B1 | 9/2006 | Kotowski |
| 7,115,875 B1 | 10/2006 | Worstell |
| RE39,396 E | 11/2006 | Swift |
| 7,162,005 B2 | 1/2007 | Bjorkholm |
| 7,190,758 B2 | 3/2007 | Hagiwara |
| 7,203,276 B2 | 4/2007 | Arsenault |
| 7,207,713 B2 | 4/2007 | Lowman |
| 7,215,737 B2 | 5/2007 | Li |
| 7,217,929 B2 * | 5/2007 | Hirai ..................... G01T 1/169 |
| | | | 250/370.01 |
| 7,218,704 B1 | 5/2007 | Adams |
| 7,233,645 B2 * | 6/2007 | Feda ..................... H05G 1/46 |
| | | | 378/102 |
| 7,253,727 B2 | 8/2007 | Jenkins |
| 7,308,076 B2 | 12/2007 | Studer |
| 7,322,745 B2 | 1/2008 | Agrawal |
| 7,326,933 B2 | 2/2008 | Katagiri |
| 7,333,587 B2 | 2/2008 | De |
| 7,333,588 B2 | 2/2008 | Mistretta |
| 7,366,282 B2 | 4/2008 | Peschmann |
| 7,369,463 B1 | 5/2008 | Van Dullemen |
| 7,369,643 B2 | 5/2008 | Kotowski |
| 7,379,530 B2 | 5/2008 | Hoff |
| 7,400,701 B1 | 7/2008 | Cason |
| 7,403,588 B2 | 7/2008 | Bruder |
| 7,409,033 B2 | 8/2008 | Zhu |
| 7,409,042 B2 | 8/2008 | Bertozzi |
| 7,417,440 B2 | 8/2008 | Peschmann |
| 7,486,768 B2 | 2/2009 | Allman |
| 7,496,178 B2 * | 2/2009 | Turner ................. A61B 6/4405 |
| | | | 378/102 |
| 7,505,556 B2 | 3/2009 | Chalmers |
| 7,505,562 B2 | 3/2009 | Dinca |

(56) References Cited

U.S. PATENT DOCUMENTS

| | | | |
|---|---|---|---|
| 7,508,910 | B2 * | 3/2009 | Safai .................. G01N 23/203 378/57 |
| 7,517,149 | B2 | 4/2009 | Agrawal |
| 7,519,148 | B2 | 4/2009 | Kotowski |
| 7,538,325 | B2 | 5/2009 | Mishin |
| 7,551,715 | B2 | 6/2009 | Rothschild |
| 7,551,718 | B2 | 6/2009 | Rothschild |
| 7,555,099 | B2 | 6/2009 | Rothschild |
| 7,579,845 | B2 | 8/2009 | Peschmann |
| 7,583,779 | B2 | 9/2009 | Tkaczyk |
| 7,593,506 | B2 | 9/2009 | Cason |
| 7,593,510 | B2 | 9/2009 | Rothschild |
| 7,630,472 | B2 | 12/2009 | Tsuyuki |
| 7,672,422 | B2 | 3/2010 | Seppi |
| 7,711,090 | B2 | 5/2010 | Schweizer |
| 7,720,195 | B2 | 5/2010 | Allman |
| 7,742,557 | B2 | 6/2010 | Brunner |
| 7,742,568 | B2 | 6/2010 | Smith |
| 7,783,004 | B2 | 8/2010 | Kotowski |
| 7,783,005 | B2 | 8/2010 | Kaval |
| 7,796,733 | B2 | 9/2010 | Hughes |
| 7,796,734 | B2 | 9/2010 | Mastronardi |
| 7,809,109 | B2 | 10/2010 | Mastronardi |
| 7,817,776 | B2 | 10/2010 | Agrawal |
| 7,848,480 | B2 | 12/2010 | Nakanishi |
| 7,856,079 | B2 | 12/2010 | Nielsen |
| 7,856,081 | B2 | 12/2010 | Peschmann |
| 7,864,920 | B2 | 1/2011 | Rothschild |
| 7,876,880 | B2 | 1/2011 | Kotowski |
| 7,924,979 | B2 | 4/2011 | Rothschild |
| 7,963,695 | B2 | 6/2011 | Kotowski |
| 7,995,705 | B2 | 8/2011 | Allman |
| 7,995,707 | B2 | 8/2011 | Rothschild |
| 8,000,436 | B2 | 8/2011 | Seppi |
| 8,045,781 | B2 | 10/2011 | Nakanishi |
| 8,054,938 | B2 | 11/2011 | Kaval |
| 8,094,774 | B2 | 1/2012 | Noshi |
| 8,135,110 | B2 | 3/2012 | Morton |
| 8,135,112 | B2 | 3/2012 | Hughes |
| 8,138,770 | B2 | 3/2012 | Peschmann |
| 8,148,693 | B2 | 4/2012 | Ryge |
| 8,194,822 | B2 | 6/2012 | Rothschild |
| 8,199,996 | B2 | 6/2012 | Hughes |
| 8,275,091 | B2 | 9/2012 | Morton |
| 8,275,092 | B1 | 9/2012 | Zhang |
| 8,300,763 | B2 | 10/2012 | Shedlock |
| 8,325,871 | B2 | 12/2012 | Grodzins |
| 8,331,535 | B2 | 12/2012 | Morton |
| 8,345,819 | B2 | 1/2013 | Mastronardi |
| 8,389,942 | B2 | 3/2013 | Morton |
| 8,401,147 | B2 | 3/2013 | Ryge |
| 8,428,217 | B2 | 4/2013 | Peschmann |
| 8,433,036 | B2 | 4/2013 | Morton |
| 8,439,565 | B2 | 5/2013 | Mastronardi |
| 8,442,186 | B2 | 5/2013 | Rothschild |
| 8,451,974 | B2 | 5/2013 | Morton |
| 8,457,274 | B2 | 6/2013 | Arodzero |
| 8,483,356 | B2 | 7/2013 | Bendahan |
| 8,503,605 | B2 | 8/2013 | Morton |
| 8,503,606 | B2 | 8/2013 | Rothschild |
| 8,532,823 | B2 | 9/2013 | McElroy |
| 8,576,982 | B2 | 11/2013 | Gray |
| 8,582,720 | B2 | 11/2013 | Morton |
| 8,605,859 | B2 | 12/2013 | Mastronardi |
| 8,638,904 | B2 | 1/2014 | Gray |
| 8,668,386 | B2 | 3/2014 | Morton |
| 8,690,427 | B2 | 4/2014 | Mastronardi |
| 8,731,137 | B2 | 5/2014 | Arroyo |
| 8,735,833 | B2 | 5/2014 | Morto |
| 8,750,452 | B2 | 6/2014 | Kaval |
| 8,750,454 | B2 | 6/2014 | Gozani |
| 8,774,357 | B2 | 7/2014 | Morton |
| 8,774,362 | B2 | 7/2014 | Hughes |
| 8,798,232 | B2 | 8/2014 | Bendahan |
| 8,804,899 | B2 | 8/2014 | Morton |
| 8,824,632 | B2 | 9/2014 | Mastronardi |
| 8,831,176 | B2 | 9/2014 | Morto |
| 8,842,808 | B2 | 9/2014 | Rothschild |
| 8,861,684 | B2 | 10/2014 | Al-Kofahi |
| 8,884,236 | B2 | 11/2014 | Rothschild |
| 8,885,794 | B2 | 11/2014 | Morton |
| 8,903,045 | B2 | 12/2014 | Schubert |
| 8,903,046 | B2 | 12/2014 | Morton |
| 8,908,831 | B2 | 12/2014 | Bendahan |
| 8,923,481 | B2 | 12/2014 | Schubert |
| 8,929,509 | B2 | 1/2015 | Morton |
| 8,958,526 | B2 | 2/2015 | Morton |
| 8,971,487 | B2 | 3/2015 | Mastronardi |
| 8,993,970 | B2 | 3/2015 | Morton |
| 8,995,619 | B2 | 3/2015 | Gray |
| 9,014,339 | B2 | 4/2015 | Grodzins |
| 9,020,100 | B2 | 4/2015 | Mastronardi |
| 9,020,103 | B2 | 4/2015 | Grodzins |
| 9,042,511 | B2 | 5/2015 | Peschmann |
| 9,052,271 | B2 | 6/2015 | Grodzins |
| 9,052,403 | B2 | 6/2015 | Morton |
| 9,057,679 | B2 | 6/2015 | Morton |
| 9,069,084 | B2 | 6/2015 | Frank |
| 9,069,101 | B2 | 6/2015 | Arroyo, Jr. |
| 9,099,279 | B2 | 8/2015 | Rommel |
| 9,117,564 | B2 | 8/2015 | Rommel |
| 9,121,958 | B2 | 9/2015 | Morton |
| 9,128,198 | B2 | 9/2015 | Morton |
| 9,146,201 | B2 | 9/2015 | Schubert |
| 9,158,030 | B2 | 10/2015 | Morton |
| 9,182,516 | B2 | 11/2015 | Gray |
| 9,183,647 | B2 | 11/2015 | Morton |
| 9,194,828 | B2 * | 11/2015 | Turner ............. G01N 23/20008 |
| 9,207,195 | B2 | 12/2015 | Gozani |
| 9,208,988 | B2 | 12/2015 | Morton |
| 9,223,050 | B2 | 12/2015 | Kaval |
| 9,251,915 | B2 | 2/2016 | Lai |
| 9,257,208 | B2 | 2/2016 | Rommel |
| 9,268,058 | B2 | 2/2016 | Peschmann |
| 9,285,325 | B2 | 3/2016 | Gray |
| 9,285,488 | B2 | 3/2016 | Arodzero |
| 9,291,582 | B2 | 3/2016 | Grodzins |
| 9,291,741 | B2 | 3/2016 | Gray |
| 9,306,673 | B1 | 4/2016 | Macrae |
| 9,316,760 | B2 | 4/2016 | Bendahan |
| 9,417,060 | B1 | 8/2016 | Schubert |
| 9,442,083 | B2 * | 9/2016 | Turner ................. G01N 23/083 |
| 9,465,135 | B2 | 10/2016 | Morton |
| 9,466,456 | B2 | 10/2016 | Rommel |
| 9,535,019 | B1 | 1/2017 | Rothschild |
| 9,541,510 | B2 | 1/2017 | Arodzero |
| 9,562,866 | B2 | 2/2017 | Morton |
| 9,576,766 | B2 | 2/2017 | Morton |
| 9,606,245 | B1 | 3/2017 | Czarnecki |
| 9,606,259 | B2 | 3/2017 | Morton |
| 9,618,630 | B2 | 4/2017 | Kross |
| 9,632,205 | B2 | 4/2017 | Morton |
| 9,658,343 | B2 | 5/2017 | Arodzero |
| 9,791,590 | B2 | 10/2017 | Morton |
| 9,823,201 | B2 | 11/2017 | Morton |
| 9,841,386 | B2 | 12/2017 | Grodzins |
| 9,915,752 | B2 | 3/2018 | Peschmann |
| 9,958,569 | B2 | 5/2018 | Morton |
| 10,134,254 | B2 | 11/2018 | Jarvi |
| 10,168,445 | B2 | 1/2019 | Morton |
| 10,209,372 | B2 | 2/2019 | Arodzero |
| 10,228,487 | B2 | 3/2019 | Mastronardi |
| 10,266,999 | B2 | 4/2019 | Rothschild |
| 10,295,483 | B2 | 5/2019 | Morton |
| 10,408,967 | B2 | 9/2019 | Morton |
| 10,670,740 | B2 | 6/2020 | Couture |
| 10,724,192 | B2 | 7/2020 | Rothschild |
| 10,762,998 | B2 | 9/2020 | Rothschild |
| 10,770,195 | B2 | 9/2020 | Rothschild |
| 10,794,843 | B2 | 10/2020 | Rothschild |
| 10,830,911 | B2 | 11/2020 | Couture |
| 10,976,465 | B2 | 4/2021 | Morton |
| 11,143,783 | B2 | 10/2021 | Morton |
| 11,448,606 | B2 * | 9/2022 | Rothschild ....... G01N 23/20008 |

(56) References Cited

U.S. PATENT DOCUMENTS

| | | |
|---|---|---|
| 2001/0016028 A1 | 8/2001 | Adams |
| 2001/0046275 A1 | 11/2001 | Hussein |
| 2002/0082492 A1 | 6/2002 | Grzeszczuk |
| 2002/0085674 A1 | 7/2002 | Price |
| 2002/0117625 A1 | 8/2002 | Pandelisev |
| 2002/0121604 A1 | 9/2002 | Katagiri |
| 2003/0002628 A1 | 1/2003 | Wilson |
| 2003/0223549 A1 | 12/2003 | Winsor |
| 2004/0004482 A1 | 1/2004 | Bouabdo |
| 2004/0057554 A1 | 3/2004 | Bjorkholm |
| 2004/0086078 A1 | 5/2004 | Adams |
| 2004/0104347 A1 | 6/2004 | Bross |
| 2004/0109653 A1 | 6/2004 | Kerr |
| 2004/0136493 A1 | 7/2004 | Konno |
| 2004/0140431 A1 | 7/2004 | Schmand |
| 2004/0141584 A1 | 7/2004 | Bernardi |
| 2004/0218714 A1 | 11/2004 | Faust |
| 2004/0251415 A1 | 12/2004 | Verbinski |
| 2004/0256565 A1 | 12/2004 | Adams |
| 2005/0018814 A1 | 1/2005 | Kerschner |
| 2005/0053199 A1 | 3/2005 | Miles |
| 2005/0073740 A1 | 4/2005 | Phillips |
| 2005/0078793 A1 | 4/2005 | Ikeda |
| 2005/0100124 A1 | 5/2005 | Hsieh |
| 2005/0135560 A1 | 6/2005 | Dafni |
| 2005/0185757 A1 | 8/2005 | Kresse |
| 2005/0190878 A1 | 9/2005 | De Man |
| 2005/0226371 A1 | 10/2005 | Kautzer |
| 2005/0236577 A1 | 10/2005 | Katagiri |
| 2006/0078091 A1 | 4/2006 | Lasiuk |
| 2006/0251211 A1 | 11/2006 | Grodzins |
| 2007/0009088 A1 | 1/2007 | Edic |
| 2007/0019781 A1 | 1/2007 | Haras |
| 2007/0029493 A1 | 2/2007 | Kniss |
| 2007/0098142 A1 | 5/2007 | Rothschild |
| 2007/0206726 A1 | 9/2007 | Lu |
| 2007/0222981 A1 | 9/2007 | Ponsardin |
| 2007/0235655 A1 | 10/2007 | Rhiger |
| 2007/0237294 A1 | 10/2007 | Hoff |
| 2007/0258562 A1 | 11/2007 | Dinca |
| 2007/0280417 A1 | 12/2007 | Kang |
| 2008/0002806 A1 | 1/2008 | Nishide |
| 2008/0037707 A1 | 2/2008 | Rothschild |
| 2008/0043913 A1 | 2/2008 | Annis |
| 2008/0099692 A1 | 5/2008 | Poreira |
| 2008/0152081 A1 | 6/2008 | Cason |
| 2008/0197279 A1 | 8/2008 | Kang |
| 2008/0219804 A1 | 9/2008 | Chattey |
| 2008/0273652 A1 | 11/2008 | Arnold |
| 2009/0067575 A1 | 3/2009 | Seppi |
| 2009/0086907 A1 | 4/2009 | Smith |
| 2009/0103686 A1 | 4/2009 | Rothschild |
| 2009/0116617 A1 | 5/2009 | Mastronardi |
| 2009/0188379 A1 | 7/2009 | Hiza |
| 2009/0230295 A1 | 9/2009 | Waring |
| 2009/0230925 A1 | 9/2009 | Nathan |
| 2009/0257555 A1 | 10/2009 | Chalmers |
| 2009/0268871 A1 | 10/2009 | Rothschild |
| 2009/0274270 A1 | 11/2009 | Kotowski |
| 2009/0309034 A1 | 12/2009 | Yoshida |
| 2010/0061509 A1 | 3/2010 | D Ambrosio |
| 2010/0069721 A1 | 3/2010 | Webler |
| 2010/0072398 A1 | 3/2010 | Fruehauf |
| 2010/0108859 A1 | 5/2010 | Andressen |
| 2010/0270462 A1 | 10/2010 | Nelson |
| 2010/0276602 A1 | 11/2010 | Clothier |
| 2010/0314546 A1 | 12/2010 | Ronda |
| 2011/0079726 A1 | 4/2011 | Kusner |
| 2011/0110490 A1 | 5/2011 | Samant |
| 2011/0204243 A1* | 8/2011 | Bendahan .......... H01J 40/04 250/367 |
| 2011/0206179 A1 | 8/2011 | Bendahan |
| 2011/0215222 A1 | 9/2011 | Eminoglu |
| 2011/0309253 A1 | 12/2011 | Rothschild |
| 2011/0309257 A1 | 12/2011 | Menge |
| 2012/0033791 A1 | 2/2012 | Mastronardi |
| 2012/0061575 A1 | 3/2012 | Dunleavy |
| 2012/0076257 A1 | 3/2012 | Star-Lack |
| 2012/0104265 A1 | 5/2012 | Workman |
| 2012/0147987 A1 | 6/2012 | Calderbank |
| 2012/0148020 A1 | 6/2012 | Arroyo, Jr. |
| 2012/0199753 A1 | 8/2012 | Chuang |
| 2012/0241628 A1 | 9/2012 | Hesser |
| 2012/0280132 A1 | 11/2012 | Nakamura |
| 2012/0298864 A1* | 11/2012 | Morishita .......... H01J 49/067 250/310 |
| 2013/0039463 A1 | 2/2013 | Mastronardi |
| 2013/0156156 A1 | 6/2013 | Roe |
| 2013/0195248 A1 | 8/2013 | Rothschild |
| 2013/0202089 A1 | 8/2013 | Schubert |
| 2013/0208857 A1 | 8/2013 | Arodzero |
| 2013/0315368 A1* | 11/2013 | Turner .......... G01V 5/0025 378/87 |
| 2013/0315369 A1* | 11/2013 | Turner .......... G01N 23/20008 378/87 |
| 2014/0105367 A1 | 4/2014 | Horvarth |
| 2014/0133631 A1 | 5/2014 | Wood |
| 2014/0182373 A1 | 7/2014 | Sbihli |
| 2015/0016794 A1 | 1/2015 | Mori |
| 2015/0055751 A1 | 2/2015 | Funk |
| 2015/0060673 A1 | 3/2015 | Zimdars |
| 2015/0168589 A1 | 6/2015 | Morton |
| 2015/0377803 A1* | 12/2015 | Turner .......... G01N 23/203 378/41 |
| 2016/0025888 A1 | 1/2016 | Peschmann |
| 2016/0025889 A1 | 1/2016 | Morton |
| 2016/0033426 A1 | 2/2016 | Georgeson |
| 2016/0106384 A1 | 4/2016 | Park |
| 2016/0170044 A1 | 6/2016 | Arodzero |
| 2016/0170077 A1 | 6/2016 | Morton |
| 2016/0223706 A1 | 8/2016 | Franco |
| 2017/0023695 A1 | 1/2017 | Zhang |
| 2017/0045630 A1 | 2/2017 | Simon |
| 2017/0059739 A1 | 3/2017 | Mastronardi |
| 2017/0184516 A1 | 6/2017 | Chen |
| 2017/0245819 A1 | 8/2017 | Rothschild |
| 2017/0299526 A1 | 10/2017 | Morton |
| 2017/0299764 A1 | 10/2017 | Morton |
| 2017/0315242 A1 | 11/2017 | Arodzero |
| 2017/0358380 A1 | 12/2017 | Rothschild |
| 2018/0038969 A1 | 2/2018 | McCollough |
| 2018/0038988 A1 | 2/2018 | Morton |
| 2018/0128935 A1 | 5/2018 | Morton |
| 2018/0136340 A1 | 5/2018 | Nelson |
| 2018/0252841 A1 | 9/2018 | Grodzins |
| 2018/0284316 A1 | 10/2018 | Morton |
| 2018/0286624 A1 | 10/2018 | Rommel |
| 2018/0294066 A1 | 10/2018 | Rothschild |
| 2018/0313770 A1 | 11/2018 | Morton |
| 2018/0328861 A1 | 11/2018 | Grodzins |
| 2019/0139385 A1 | 5/2019 | Jarvi |
| 2019/0242834 A1* | 8/2019 | Rothschild ....... G01N 23/20008 |
| 2019/0293810 A1 | 9/2019 | Couture |
| 2019/0346382 A1 | 11/2019 | Rothschild |
| 2019/0383953 A1 | 12/2019 | Arodzero |
| 2019/0391280 A1 | 12/2019 | Couture |
| 2020/0025955 A1 | 1/2020 | Gozani |
| 2020/0033274 A1 | 1/2020 | Couture |
| 2020/0073008 A1 | 3/2020 | Parikh |
| 2020/0103357 A1 | 4/2020 | Morton |
| 2020/0103547 A1 | 4/2020 | Morton |
| 2020/0158908 A1 | 5/2020 | Morton |
| 2020/0191991 A1 | 6/2020 | Morton |
| 2020/0233100 A1 | 7/2020 | Rothschild |
| 2020/0326291 A1 | 10/2020 | Rothschild |
| 2020/0326436 A1 | 10/2020 | Couture |
| 2020/0355631 A1 | 11/2020 | Yu |
| 2020/0355632 A1 | 11/2020 | Morton |
| 2021/0018650 A1 | 1/2021 | Morton |

(56) References Cited

U.S. PATENT DOCUMENTS

| | | | |
|---|---|---|---|
| 2021/0132239 A1* | 5/2021 | Couture | G01T 1/2006 |
| 2022/0003693 A1* | 1/2022 | Rothschild | G01N 23/20008 |
| 2022/0091054 A1* | 3/2022 | Rothschild | G01V 5/0025 |

FOREIGN PATENT DOCUMENTS

| | | |
|---|---|---|
| CN | 1745296 A | 3/2006 |
| CN | 101142497 A | 3/2008 |
| CN | 101166469 A | 4/2008 |
| CN | 101578534 A | 11/2009 |
| CN | 102519988 A | 6/2012 |
| CN | 104204854 A | 12/2014 |
| CN | 107193034 A | 9/2017 |
| CN | 107209282 A | 9/2017 |
| DE | 2639631 A1 | 3/1978 |
| DE | 4017100 A1 | 12/1990 |
| DE | 102013102749 A1 | 10/2013 |
| EP | 113291 A1 | 7/1984 |
| EP | 0261984 A2 | 3/1988 |
| EP | 0813692 | 12/1997 |
| EP | 0813692 A1 | 12/1997 |
| EP | 0864884 A2 | 9/1998 |
| EP | 0971215 A1 | 1/2000 |
| EP | 1113291 A1 | 7/2001 |
| EP | 1168249 A1 | 1/2002 |
| EP | 1135700 | 3/2005 |
| EP | 1254384 | 1/2008 |
| EP | 2054741 | 5/2009 |
| EP | 1733213 | 2/2010 |
| EP | 2049888 | 5/2014 |
| EP | 3271709 A1 | 1/2018 |
| FR | 2492159 A1 | 4/1982 |
| GB | 1505498 A | 3/1978 |
| GB | 2084829 A | 4/1982 |
| GB | 2150526 A | 7/1985 |
| GB | 2277013 A | 10/1994 |
| GB | 2400480 A | 10/2004 |
| GB | 2482024 A | 1/2012 |
| JP | 58103678 | 6/1983 |
| JP | 62147349 A | 7/1987 |
| JP | S63299100 | 12/1988 |
| JP | 10232284 A | 2/1997 |
| JP | H09318757 A | 12/1997 |
| JP | H10185842 | 7/1998 |
| JP | H10232284 A | 9/1998 |
| JP | 2000515629 | 11/2000 |
| JP | 2002071816 A | 3/2002 |
| JP | 2004045250 A | 2/2004 |
| JP | 2006505805 | 2/2006 |
| JP | 2013205122 | 10/2013 |
| JP | 3195776 | 2/2015 |
| WO | 9701089 | 1/1997 |
| WO | 1997001089 A1 | 1/1997 |
| WO | 9802763 A | 1/1998 |
| WO | 1998002763 A1 | 1/1998 |
| WO | 1998003889 A1 | 1/1998 |
| WO | 9805946 A1 | 2/1998 |
| WO | 1998020366 A1 | 5/1998 |
| WO | 9913323 A2 | 3/1999 |
| WO | 1999039189 A2 | 8/1999 |
| WO | 2000033060 A | 6/2000 |
| WO | 2000037928 A2 | 6/2000 |
| WO | 0159485 A1 | 8/2001 |
| WO | 0173415 A2 | 10/2001 |
| WO | 02091023 A2 | 11/2002 |
| WO | 03075037 A1 | 9/2003 |
| WO | 2004010127 A1 | 1/2004 |
| WO | 2004043740 A2 | 5/2004 |
| WO | 2005079437 A2 | 9/2005 |
| WO | 2005098400 A2 | 10/2005 |
| WO | 2005103759 | 11/2005 |
| WO | 2005103759 A1 | 11/2005 |
| WO | 2006111323 | 10/2006 |
| WO | 2006111323 A2 | 10/2006 |
| WO | 2006137932 A2 | 12/2006 |
| WO | 2007051092 A2 | 5/2007 |
| WO | 2008021807 A2 | 2/2008 |
| WO | 2008024825 A2 | 2/2008 |
| WO | 2008063695 A2 | 5/2008 |
| WO | 2008105782 A2 | 9/2008 |
| WO | 2009027667 A2 | 3/2009 |
| WO | 2009067394 A2 | 5/2009 |
| WO | 2010129926 A1 | 11/2010 |
| WO | 2011008718 A1 | 1/2011 |
| WO | 2011011583 A1 | 1/2011 |
| WO | 2011014445 A1 | 2/2011 |
| WO | 2011053972 A2 | 5/2011 |
| WO | 2011149566 A2 | 12/2011 |
| WO | 2011163108 | 12/2011 |
| WO | 2011163108 A2 | 12/2011 |
| WO | 2012058207 A2 | 5/2012 |
| WO | 2012109307 A1 | 8/2012 |
| WO | 2012142453 A2 | 10/2012 |
| WO | 2012142456 A2 | 10/2012 |
| WO | 2012174265 A1 | 12/2012 |
| WO | 2013112819 A1 | 8/2013 |
| WO | 2013116058 A1 | 8/2013 |
| WO | 2013122763 A1 | 8/2013 |
| WO | WO-2013116549 A1 * | 8/2013 ............ G01N 23/04 |
| WO | 2014058495 A2 | 4/2014 |
| WO | 2016003547 A1 | 1/2016 |
| WO | 2016081881 A1 | 5/2016 |
| WO | 2018064434 | 4/2018 |
| WO | 2019217596 A1 | 11/2019 |
| WO | 2020041161 A1 | 2/2020 |

OTHER PUBLICATIONS

International Search Report for PCT/US2019/027252, dated Aug. 2, 2019.

Williams et al.: "PET Detector Using Waveshifting Optical Fibers and Microchannel Plate PMT with Delay Line Readout", IEEE Transactions on Nuclear Science, IEEE Service Center, New York, NY, US, vol. 45, No. 2, Apr. 1, 1998 (Apr. 1, 1998), pp. 195-205, XP011087844, ISSN: 0018-9499, DOI: 10.1109/23.664171.

Beznosko et al., "FNAL-NICADD Extruded Scintillator," FERMILAB-CONF-04-216-E, pp. 1-4 (Sep. 2004).

Case et al., "Wavelength-shifting fiber readout of LaC13 and LaBr3 scintillators," Proc. of SPIE, vol. 5898, UV, X-Ray, and Gamma-Ray Space Instrumentation for Astronomy XIV, pp. 58980K-1-58980K-8 (2005).

Gundiah, "Scintillation properties of $Eu^{2+}$-activated barium fluoroiodide," Lawrence Berkeley National Laboratory, pp. 1-10 (Feb. 2011).

Hutchinson et al., "Optical Readout for Imaging Neutron Scintillation Detectors," Engineering Science and Technology Division, Oak Ridge National Laboratory, Oak Ridge, Tennessee, 6 pages. (Nov. 2002).

Keizer, "The optimal cosmic ray detector for High-Schools," 21 pages (2011).

Maekawa et al., "Thin Beta-ray Detectors using Plastic Scintillator Combined with Wavelength-shifting Fibers for Surface Contamination Monitoring," J. Nucl. Sci. Technol., vol. 35, No. 12, pp. 886-894 (Dec. 1998).

Moiseev et al., "High-efficiency plastic scintillator detector with wavelength-shifting fiber readout for the GLAST Large Area Telescope," Nucl. Instrum. Meth. Phys. Res. A, vol. 583, pp. 372-381 (2007).

Nishikido et al. "X-ray detector made of plastic scintillators and WLS fiber for real-time dose distribution monitoring in interventional radiology," IEEE Nuclear Science Symposium and Medical Imaging Conference Record.

Pla-Dalmau et al., "Extruded Plastic Scintillator for MINERvA," FERMILAB-CONF-05-506-E, pp. 1298-1300 (2005).

Yoshimura et al., "Plastic scintillator produced by the injection-molding technique," Nucl. Instr. Meth. Phys. Res. A, vol. 406, pp. 435-441 (1998).

Jae Yul Ahn, Authorized officer Korean Intellectual Property Office, International Search Report—Application No. PCT/US2013/024585, dated Jun. 2, 2013, along with Written Opinion of the International Searchi.

(56) References Cited

OTHER PUBLICATIONS

Nishikido et al. "X-ray detector made of plastic scintillators and WLS fiber for real-time dose distribution monitoring in interventional radiology," IEEE Nuclear Science Symposium and Medical Imaging Conference Reco, pp. 1272-1274 (2012).
International Search Report for PCT/US17/54211, dated Jan. 18, 2018.
International Search Report for PCT/US2019/027242, dated Jul. 17, 2019.
International Search Report for PCT/US2013/024585, dated Jun. 2, 2013.
https://en.wikipedia.org/wiki/ISM_band#Common_non-ISM_uses., downloaded from Internet Nov. 23, 2020.
International Search Report for PCT/US2013/023125, dated May 15, 2013.
International Search Report for PCT/US99/29185, dated Sep. 27, 2000.
International Search Report for PCT/US2016/023240, dated Jul. 12, 2016.
Nittoh et al., "Discriminated neutron and X-ray radiography using multi-color scintillation detector," Nuclear Instruments and Methods in Physics Research A, vol. 428, pp. 583-588 (1999).
Novikov, "A method for monitoring of Gd concentration in Gd-loaded scintillators," Nuclear Instruments and Methods in Physics Research A, vol. 366, pp. 413-414 (1995).
Osswald et al. "Injection Molding Handbook", p. 394, Chemical Industry Press, Mar. 31, 2005.
Yoshiaki et al. "Development of ultra-high sensitivity bioluminescent enzyme immunoassay for prostate-specific antigen (PSA) using firefly luciferas", Abstract, Luminescence, vol. 16, Issue 4, Jul. 31, 2001.
International Search Report for PCT/US01/09784, dated Jan. 28, 2002.
International Search Report for PCT/US02/13595, dated Aug. 6, 2002.
International Search Report for PCT/US03/35232, dated Nov. 8, 2004.
International Search Report for PCT/US03/05958, dated Jun. 27, 2003.
International Search Report for PCT/US2005/011382, dated Oct. 21, 2005.
International Seach Report for PCT/US2008/083741, dated Oct. 30, 2009.
International Search Report for PCT/US2007/066936, dated Sep. 30, 2008.
International Search Report for PCT/US2006/060158, dated Jul. 5, 2007.
International Search Report for PCT/US2007/076497, dated Jul. 28, 2008.
International Search Report for PCT/US2007/075323, dated Feb. 5, 2008.
International Search Report for PCT/US2010/043201, dated Oct. 29, 2010.
International Search Report for PCT/US2012/024248, dated Jul. 9, 2012.
International Search Report for PCT/US11/23143, dated Nov. 25, 2011.
International Search Report for PCT/US2012/033581, dated Oct. 31, 2012.
International Search Report for PCT/US2011/041033, dated Feb. 17, 2012.
International Search Report for PCT/US2012/033585, dated Nov. 29, 2012.
International Search Report for PCT/US2013/022715, dated May 15, 2013.
International Search Report for PCT/US2015/031115, dated Jul. 29, 2015.
Chou, C, "Fourier coded-aperture imaging in nuclear medicine", IEEE Proc. Sci. Meas. Technol., vol. 141. No. 3, May 1994, pp. 179-184.
Mertz, L.N., et al, "Rotational aperture synthesis for x rays", Journal. Optical Society of America, vol. 3, Dec. 1986, pp. 2167-2170.
International Bureau of WIPO, International Preliminary Report on Patentability, PCT/US2005/011382, dated Oct. 19, 2006, 7 pages.
International Search Report and Written Opinion for PCT/US2010/041757, dated Oct. 12, 2010.
European Patent Office, International Search Report, International Application No. PCT/US99/28266, dated Sep. 6, 2000, 3 pages.
Written Opinion of the International Searching Authority, PCT/US2007/066936, dated Sep. 30, 2008, 7 pages.
International Search Report, PCT/US1999/028035, dated Sep. 15, 2000, 6 pages.
International Search Report, PCT/US1998/18642, dated Jul. 7, 1999, 4 pages.
International Search Report, PCT/US2007/066936; dated Sep. 30, 2008, 5 pages.
European Patent Office, International Search Report and Written Opinion of the International Searching Authority, PCT/US2005/011382, dated Oct. 21, 2005.
International Search Report for PCT/US20/61866, dated Feb. 11, 2021.
Roderick D. Swift, Roy P. Lindquist, "Medium energy x-ray examination of commercial trucks", Proc. SPIE 2276, Cargo Inspection Technologies, (Oct. 6, 1994); doi: 10.1117/12.189174.
Zhang et al., "A multi-beam x-ray imaging system based on carbon nanotube field emitters", Proceedings of SPIE vol. 6142, 614204, (2006), doi: 10.1117/12.654006.
U.S. Pat. No. 7,505,562 Prosecution File History.
Declaration of Richard Lanza, Ph.D. , Case No. IPR2022-00028; U.S. Pat. No. 7,505,562, Oct. 28, 2021.
Cheng et al., "Dynamic radiography using a carbonnanotube-based field emission x-ray source," Review of Scientific Instruments, vol. 75, No. 10. Oct. 2004.
Zhang et al., "Stationary scanning x-ray source based on carbon nanotube field emitters", Applied Physics Letters 86, 184104 (2005).
Zhang et al., "A nanotube-based field emission x-ray source for microcomputed tomography", Review of Scientific Instruments 76, 094301 (2005).
U.S. Appl. No. 60/737,471, filed Mar. 31, 2006.
U.S. Appl. No. 60/787,810, filed Apr. 1, 2005.
AS& E's Opposition to Viken's Motion for Rule 11 Sanctions, Case 1:20-cv-11883 (Dist. Of Mass.), Feb. 26, 2021.
Viken's Memorandum of Law In Support of Defendant's Motion for Rule 11 Sanctions, Case 1:20-cv-11883 (Dist. Of Mass.), Feb. 8, 2021.
Motion Hearing Transcript, dated Aug. 16, 2021, Case 1:20-cv-11883 (Dist. Of Mass.).
Waiver of the Service of Summons, Oct. 20, 2020; Case 1:20-cv-11883, (Dist. Of Mass.).
Evans, R. D., The Atomic Nucleus, Ch. 23-25, & Appendix A, TATA McGraw-Hill, Bombay, New Delhi (1955).
Knoll, G. F., Radiation Detection and Measurements, Ch. 2, 4, 8, & 9, Third Edition, John Wiley & Sons, Inc. New York (2000).
American Science and Engineering, Inc. 2002 Annual Report.
*American Science & Engineering, Inc. v. Viken Detection Corp.*, U.S.D.C. (D. Mass.) Case No. 1:20-cv-11883-LTS, Joint Proposed Scheduling Order (Doc. 63), filed Oct. 12, 2021.
*Viken Detection Corporation v. AS&E* , Case No. IPR2022-00028, Petition for Inter Partes Review of U.S. Pat. No. 7,505,562, Oct. 28, 2021.
U.S. Pat. No. 7,400,701 Prosecution File History.
Declaration of Richard C. Lanza, Ph.D.,, Case No. IPR2021-01585; U.S. Pat. No. 7,400,701, Sep. 29, 2021.
Tateno, Y, & Tanaka, H., "Low-Dosage X-Ray Imaging System Employing Flying Spot X-Ray Microbeam (DynamicScanner)1," Radiation Physics, 121(1):189-195 (1976).
*Vike Detection Corporationv. AS&E*, Case No. IPR2021-01585, Petition for Inter Partes Review of U.S. Pat. No. 7,400,701, Sep. 30, 2021.
U.S. Pat. No. 8,300,763 Prosecution File History.
Declaration of Richard C. Lanza, Ph.D., Case No. IPR2022-00027, U.S. Pat. No. 8,300,763, Oct. 20, 2021.

(56) References Cited

OTHER PUBLICATIONS

U.S. Appl. No. 61/228,335 (priority document for '763 Patent), dated Jul. 24, 2009.
Chapter 10, Ghilani, Adjustment Computations: Spatial Data Analysis, Sixth Edition, 2017 John Wiley & Sons, Inc. ("Weights Of Observations").
Chambers Dictionary of Science and Tech. (1999) (definition of "weighting observation").
U.S. Appl. No. 61/423,582 ("Gray '582"), Dec. 15, 2010.
*Viken Detection Corporation* v. *AS&E*, Petition for Inter Partes Review, Case No. IPR2022-00027, U.S. Pat. No. 8,300,763, Oct. 20, 2021.
*AS&E* v. *Viken*, Defendant Viken Detection Corp.'s Preliminary Patent Related DisclosuresCase No. 1:20-cv-11833-LTS, United States District Court for the District of Massachusetts, Jan. 7, 2022.
Appendix C—U.S. Pat. No. 7,505,562 Invalidity Claim Chart.
Appendix D—U.S. Pat. No. 8,300,763 Claim Charts.
Z Portal for Trucks & Cargo, Multi-View, Multi-Technology, Cargo and Vehicle Screening System, 2022 downloaded from the following URL: https://www.rapiscan-ase.com/products/portal/z-portal-for-trucks-cargoscreening.
Defense Dept, contracts for X-ray tech, Apr. 7, 2009 downloaded from the following URL https://www.upi.com/Defense-News/2009/04/07/Defense-Dept-contracts-for-X-ray-tech/61051239114877/.
AS&E pulls in $4.4M deal from U.S. agency, Apr. 27, 2009, downloaded from the following URL https://www.bizjournals.com/boston/blog/mass-high-tech/2009/04/ase-pulls-in-44m-deal-from-us-agency.html.

\* cited by examiner

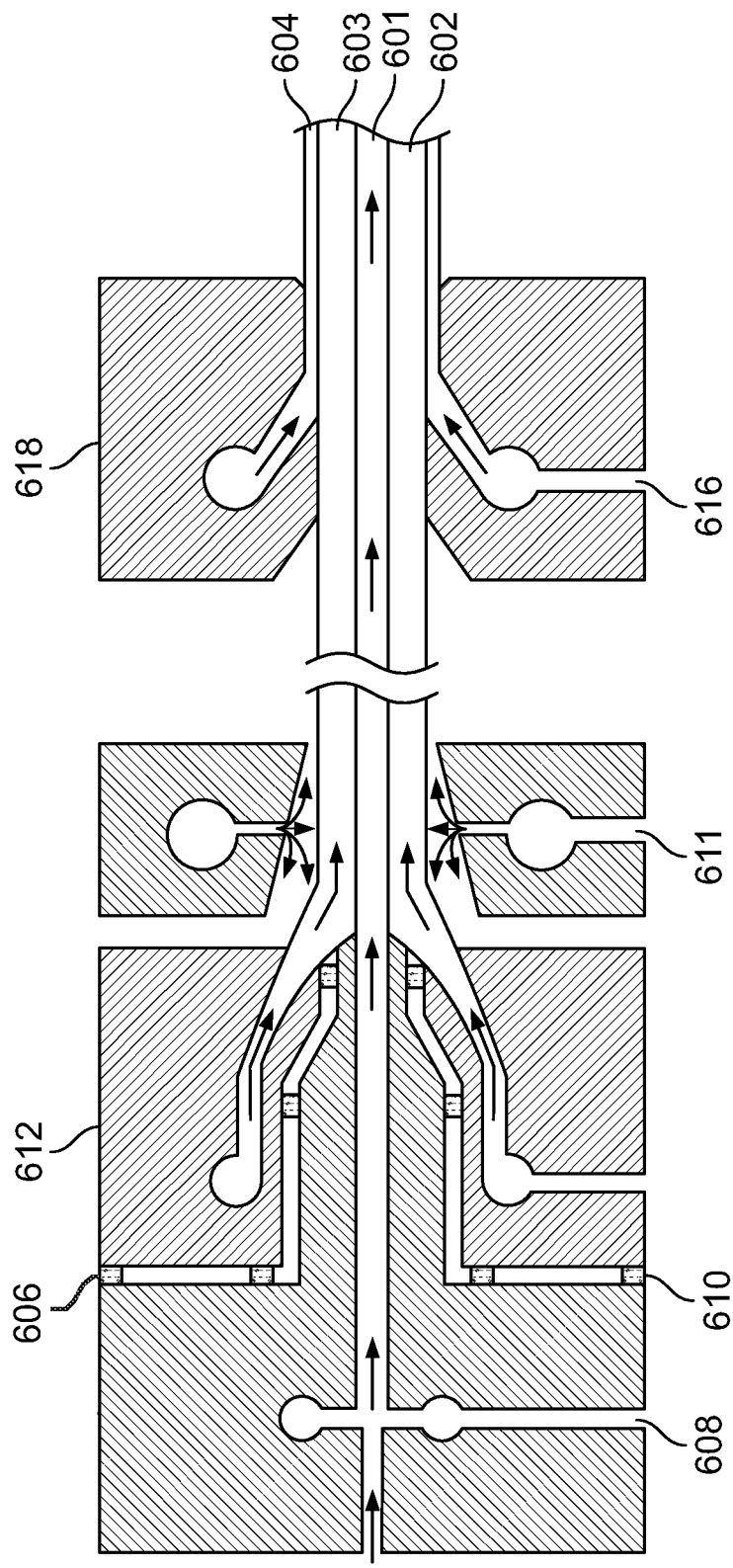

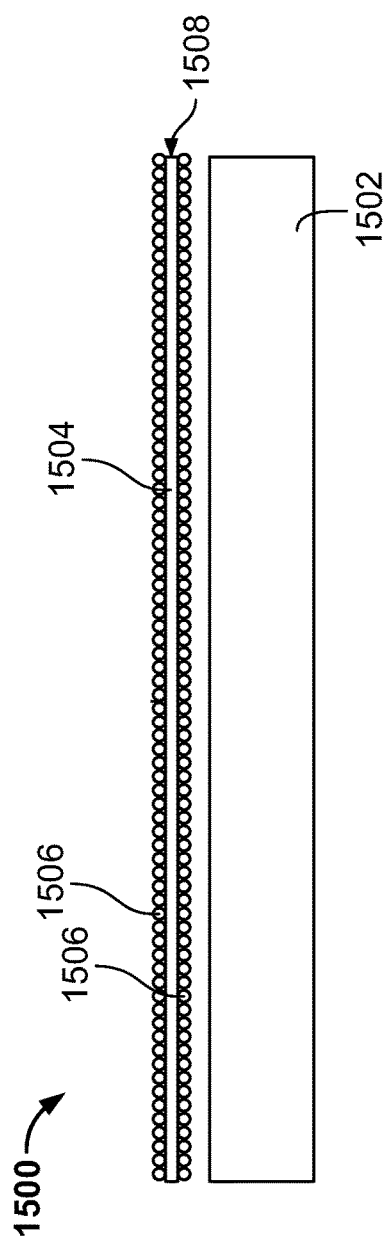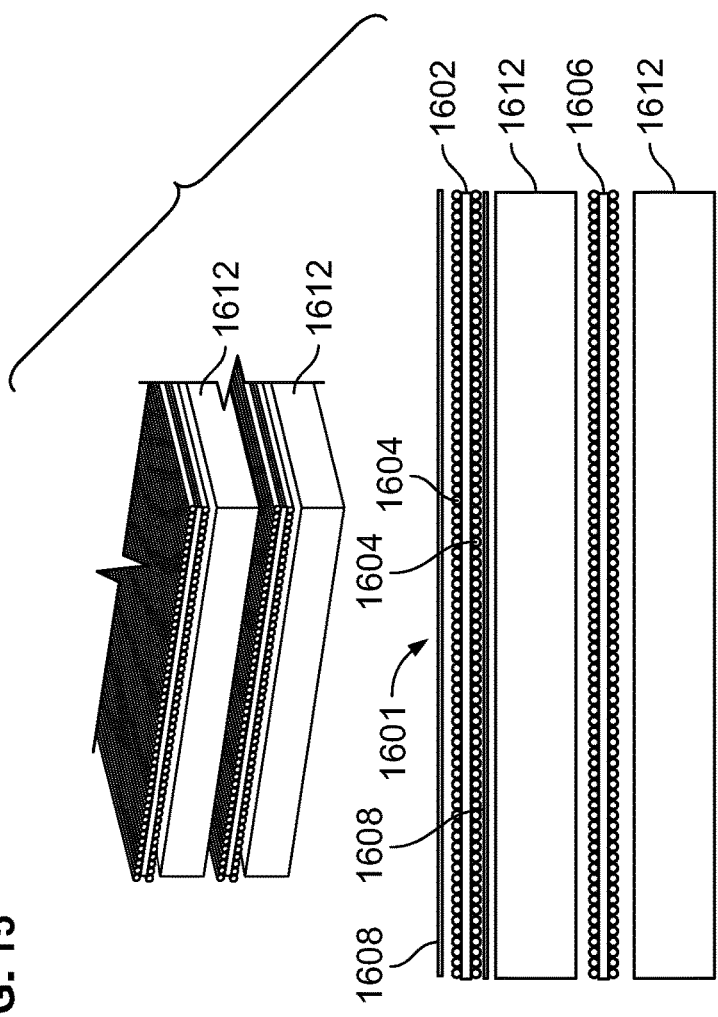

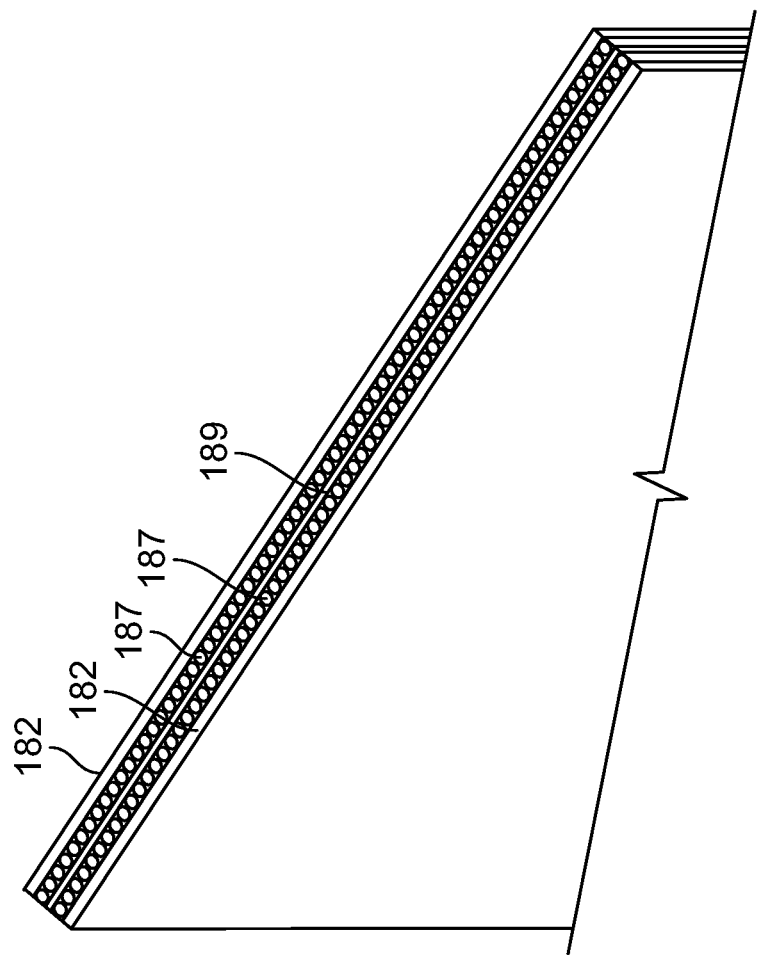
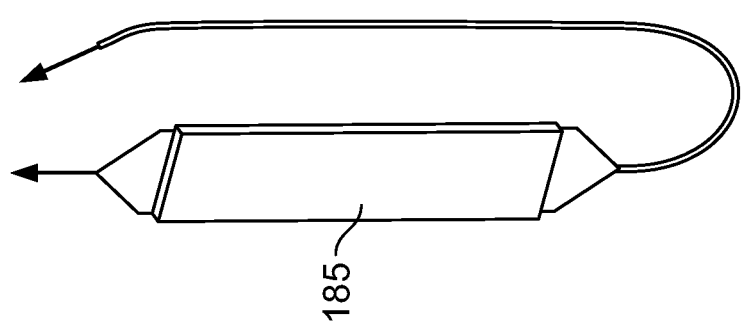
FIG. 18B
FIG. 18A

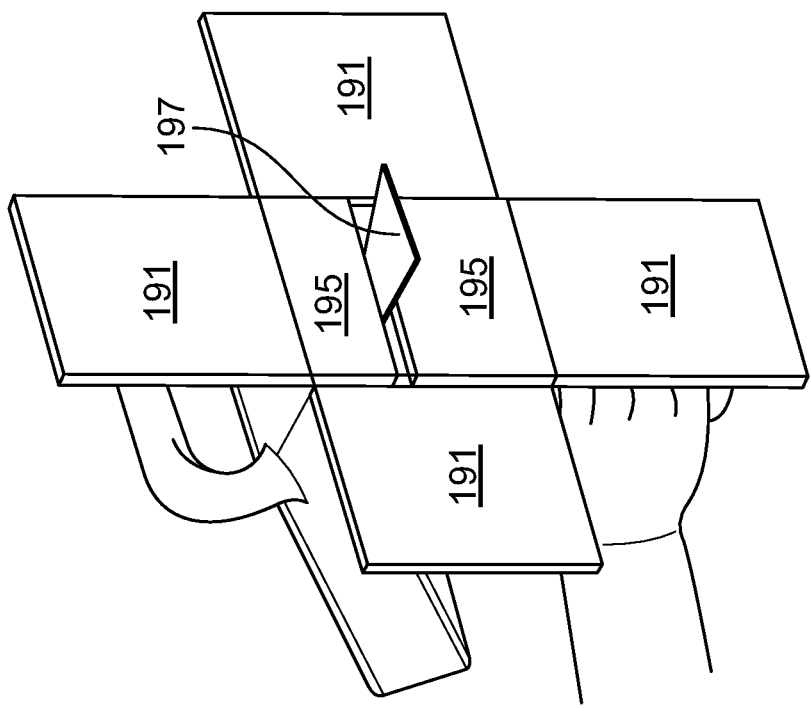
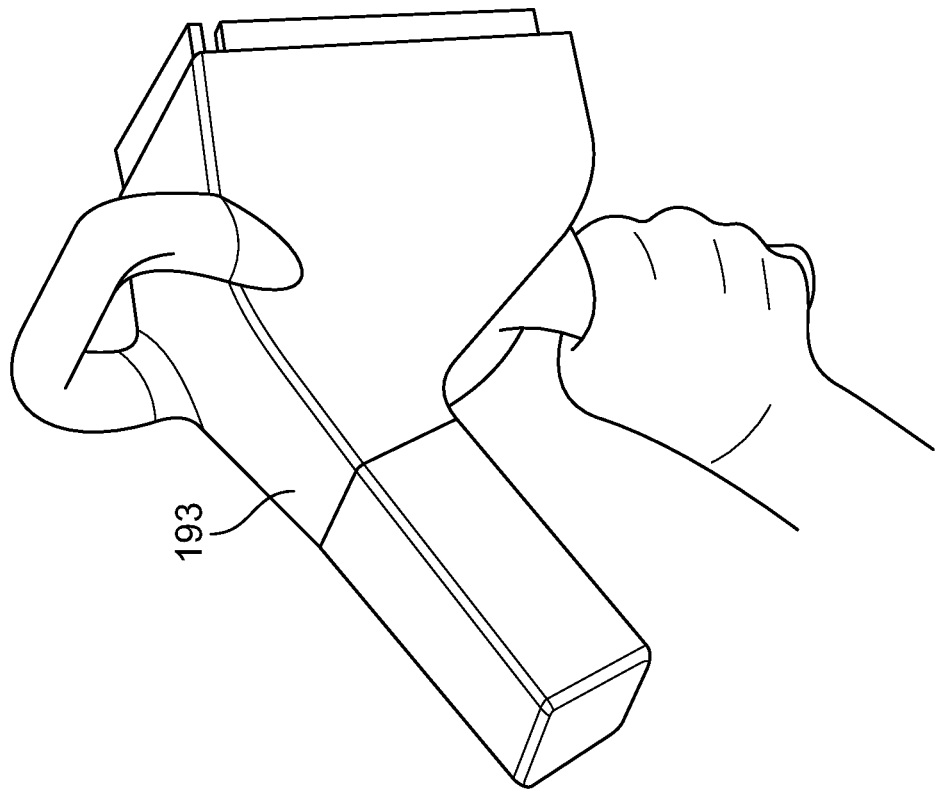

| Multi-channel PMT | | | |
|---|---|---|---|
| 1 | 5 | 1 | 5 |
| 2 | 6 | 2 | 6 |
| 3 | 7 | 3 | 7 |
| 4 | 8 | 4 | 8 |
| High resolution channels | | Low resolution channels | |

FIG. 24A

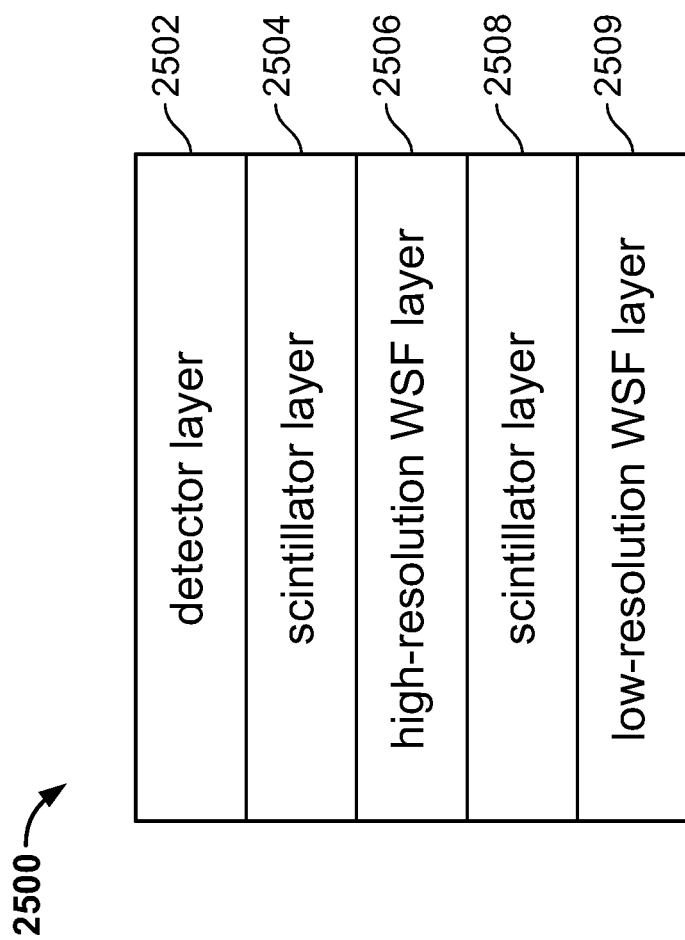

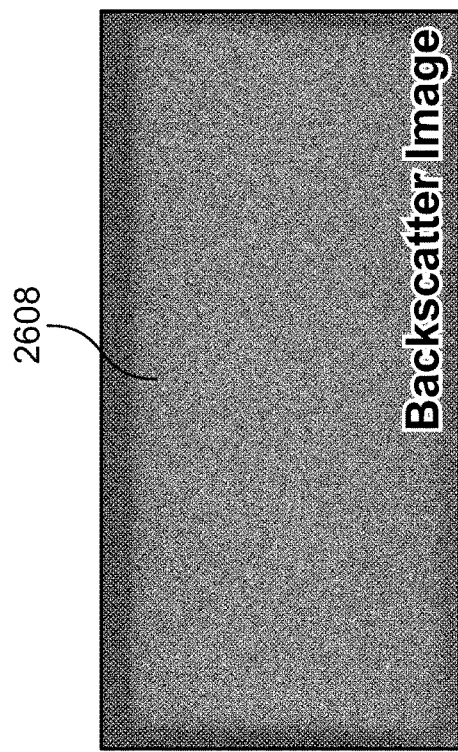
FIG. 26A
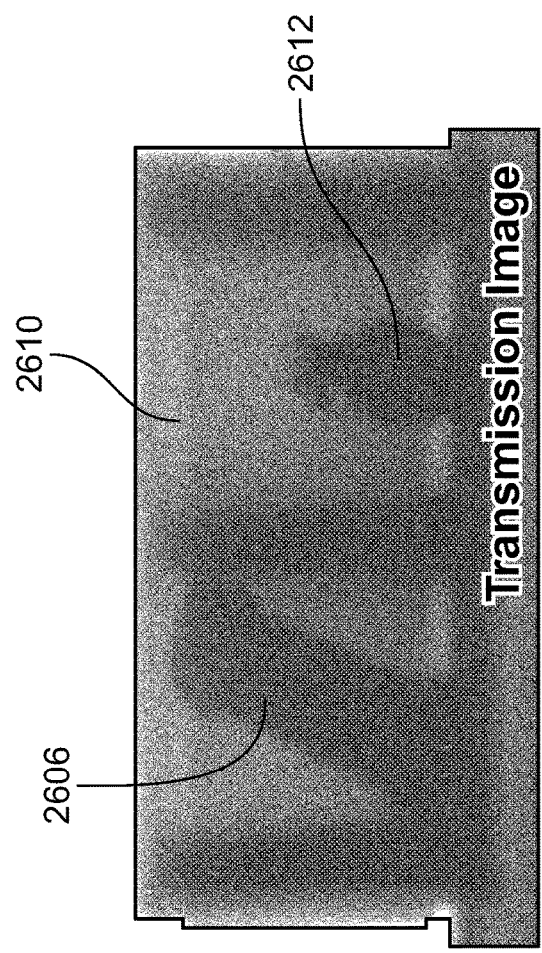
FIG. 26B
FIG. 26C

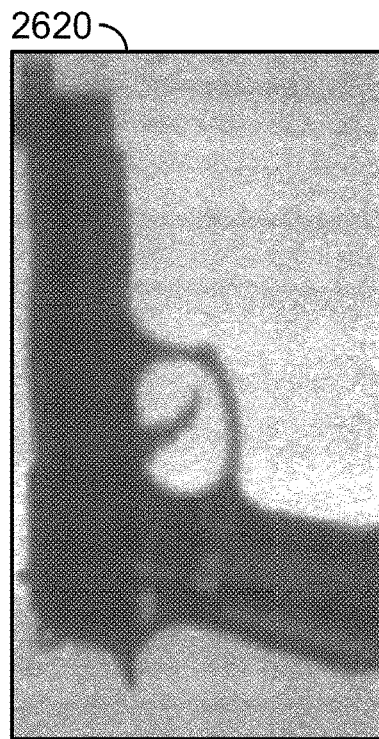
1/8" (3.2 mm)
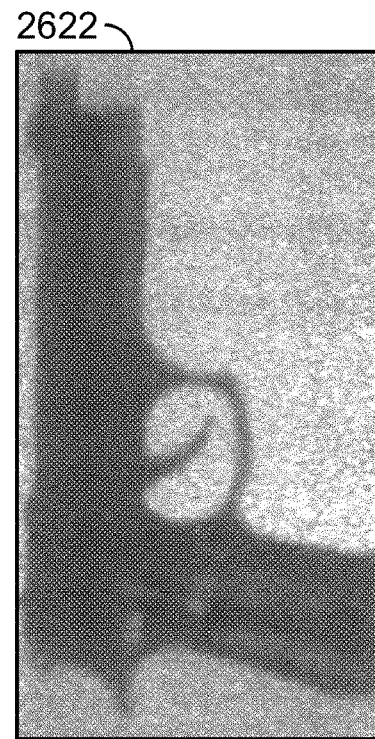
1/4" (6.4 mm)
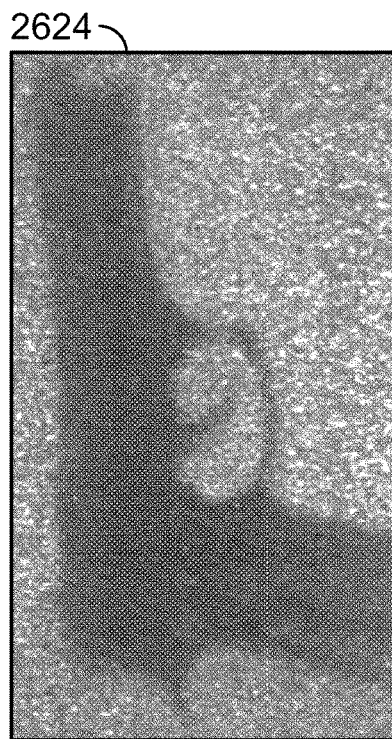
1/2" (12.7 mm)
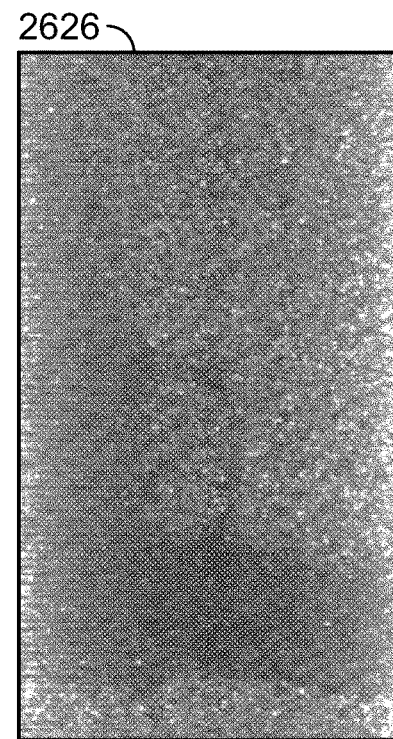
3/4" (19.1 mm)
FIG. 26D

HANDHELD BACKSCATTER IMAGING SYSTEMS WITH PRIMARY AND SECONDARY DETECTOR ARRAYS

CROSS-REFERENCE

The present application is a continuation application of U.S. patent application Ser. No. 16/855,683, entitled "Spectral Discrimination Using Wavelength-Shifting Fiber-Coupled Scintillation Detectors" and filed on Apr. 22, 2020, which is a continuation application of U.S. patent application Ser. No. 16/382,951, of the same title, filed on Apr. 12, 2019, and issued as U.S. Pat. No. 10,670,740 on Jun. 2, 2020, which is a continuation-in-part application of U.S. patent application Ser. No. 16/242,163, entitled "Spectral Discrimination using Wavelength-Shifting Fiber-Coupled Scintillation Detectors" and filed on Jan. 8, 2019, which is a continuation application of U.S. patent application Ser. No. 15/490,787, of the same title, filed on Apr. 18, 2017, and issued as U.S. Pat. No. 10,209,372 on Feb. 19, 2019, which, in turn, is a continuation application of U.S. patent application Ser. No. 15/050,894, of the same title, filed on Feb. 23, 2016, and issued as U.S. Pat. No. 9,658,343 (the "'343 patent") on May 23, 2017.

The '343 patent is a division of U.S. patent application Ser. No. 13/758,189, entitled "X-Ray Inspection Using Wavelength-Shifting Fiber-Coupled Scintillation Detectors", filed on Feb. 4, 2013, and issued as U.S. Pat. No. 9,285,488 (the '488 patent), on Mar. 15, 2016. The '488 patent, in turn, claims priority from the following applications:

U.S. Patent Provisional Application No. 61/607,066, entitled "X-Ray Inspection using Wavelength-Shifting Fiber-Coupled Detectors", filed on Mar. 6, 2012;

U.S. Patent Provisional Application No. 61/598,521, entitled "Distributed X-Ray Scintillation Detector with Wavelength-Shifted Fiber Readout", and filed on Feb. 14, 2012; and U.S. Patent Provisional Application No. 61/598,576, entitled "X-Ray Inspection Using Wavelength-Shifting Fiber-Coupled Detectors", and filed on Feb. 14, 2012.

The above-mentioned applications are incorporated herein by reference in their entirety.

FIELD

The present specification relates to fiber-coupled scintillation detectors and to methods of their manufacture, and to systems and methods of X-ray inspection employing fiber-coupled scintillation detectors for efficient detection of X-rays.

BACKGROUND

Fiber-coupled scintillation detectors of radiation and particles have been employed over the course of the past 30 years. In some cases, the scintillator is pixelated, consisting of discrete scintillator elements, and in other cases, other stratagems are employed (such as orthogonally crossed coupling fibers) in order to provide spatial resolution. Examples of fiber-coupled scintillation detectors are provided by U.S. Pat. No. 6,078,052 (to DiFilippo) and U.S. Pat. No. 7,326,9933 (to Katagiri et al.), both of which are incorporated herein by reference. Detectors described both by DiFilippo and Katagiri et al. employ wavelength-shifting fibers (WSF) such that light reemitted by the core material of the fiber may be conducted, with low attenuation, to photo-detectors disposed at a convenient location, often distant from the scintillator itself. Spatial resolution is of particular value in applications such as neutron imaging. Spatial resolution is also paramount in the Fermi Large Area Space Telescope (formerly, GLAST) where a high-efficiency segmented scintillation detector employs WSF readout for detection of high-energy cosmic rays, as described in Moiseev, et al., *High efficiency plastic scintillator detector with wavelength-shifting fiber readout for the GLAST Large Area Telescope, Nucl. Instr. Meth. Phys. Res. A*, vol. 583, pp. 372-81 (2007), which is incorporated herein by reference.

Because of the contexts in which fiber-coupled scintillator detectors have been employed to date, all known fiber-coupled scintillator detectors have counted pulses produced by individual interactions of particles (photons or massive particles) with the scintillator, thereby allowing the energy deposited by the incident particle to be ascertained based on the cumulative flux of light reemitted by the scintillator.

The detection requirements of X-ray backscatter inspection systems, however, are entirely different from the requirements addressed by existing fiber-coupled scintillation detectors. Backscatter X-ray inspection systems have been used for more than 25 years to detect organic materials concealed inside baggage, cargo containers, in vehicles, and on personnel. Because organic materials in bulk preferentially scatter X rays (by Compton scattering) rather than absorb them, these materials appear as brighter objects in backscatter images. Insofar as incident X-rays are scattered into all directions, sensitivity far overrides spatial resolution as a requirement, and in most scatter applications, detector spatial resolution is of no concern at all, since resolution is governed by the incident beam rather than by detection.

The specialized detection requirements of large area and high sensitivity posed by X-ray scatter systems are particularly vexing in the case of "conventional" scintillation detectors 100 of the type shown in a side cross-section in FIG. 1A and in a front cross-section in FIG. 1B. An example of such a detector is described in U.S. Pat. No. 5,302,817 (to Yokota), and is incorporated herein by reference. Typically, a light-tight box 102 is lined with scintillating screens 103 where incident X-ray radiation 101 is converted to scintillation light, typically in the UV, visible, or longer wavelength, portions of the electromagnetic (EM) spectrum. Large-photocathode-area photomultiplier tubes (PMTs) 105 are coupled to receive scintillation light via portholes 108. One problem lies in that a fraction of the scintillation light originating within the screen is transmitted from the screen into the enclosed volume. The remaining scintillation light is lost in the screen material. Scintillating screens 103 are designed to maximize the fraction of emitted light, which is tantamount to ensuring a large transmission coefficient T for the interface between screen 103 and the medium (typically air) filling the detector volume. However, in a conventional backscatter detector of the sort depicted in FIGS. 1A and 1B, the scintillation screens 103 should also serve as good reflectors because scintillation light, once emitted into the volume of box 102, typically needs multiple reflections until it reaches a photo-detector 105. So, the reflection coefficient R of the screen surface should also be large; however, since the sum of T and R is constrained to be unity, both T and R cannot be maximized simultaneously, and a compromise must be struck. As a result, the light collection efficiency of the conventional backscatter detector is inherently low, with only a few percent of the generated scintillation light collected into the photo detectors.

For an imaging detector, the photon statistical noise is calculated in terms of the photons absorbed by the detector and used to generate the image. Any photons which pass through the detector without being absorbed, or even those that are absorbed without generating image information, are wasted and do not contribute to reducing noise in the image. Since photons cannot be subdivided, they represent the fundamental quantum level of a system. It is common practice to calculate the statistical noise in terms of the smallest number of quanta used to represent the image anywhere along the imaging chain. The point along the imaging chain where the fewest number of quanta are used to represent the image is called a "quantum sink". The noise level at the quantum sink determines the noise limit of the imaging system. Without increasing the number of information carriers (i.e., quanta) at the quantum sink, the system noise limit cannot be improved. Poor light collection can possibly create a secondary quantum sink, which is to say that it will limit the fraction of incident X rays resulting in PMT current. Moreover, it will increase image noise. Light collection efficiency can be improved by increasing the sensitive area of the photo-detectors, however, that path to efficiency is costly.

The structure of a scintillating screen typically employed in prior art X-ray scintillation detectors is now described with reference to FIG. 2. A layer of composite scintillator 202 is sandwiched between a backer sheet 204 for structural support and a thin, transparent protective film 206 composed of polyester, for example. The composite scintillator consists of typically micron-size inorganic crystals in an organic matrix or resin. The crystals are the actual scintillating material. Barium fluoro-chloride (BaFCl, or "BFC") or gadolinium oxysulfide ($Gd_2O_2S$, or "Gadox") doped with rare earth elements are common choices for these. The stopping power of the screen is determined by the thickness of the composite scintillator layer 202, which is typically measured in milligrams of scintillator crystal per unit area. Because the inorganic scintillators (such as BFC or Gadox) suffer from high self-absorption, the composite scintillator layer has to be kept rather thin in order to extract a good fraction of the scintillation light. This limits the useful stopping power of the screen and makes it suitable only for the detection of X rays with energies up to around 100 keV. It would be advantageous to have scintillation detectors for X-ray scatter detection applications that provide for more efficient extraction, collection, and detection of scintillation light.

Scintillator structures have been produced using many manufacturing technologies, including, for example, die-casting, injection molding (as described by Yoshimura et al., *Plastic scintillator produced by the injection-molding technique*, Nucl. Instr. Meth. Phys. Res. A, vol. 406, pp. 435-41 (1998), and extrusion, (as described in U.S. Pat. No. 7,067,079, to Bross, et al.), both of which references are incorporated herein by reference.

As briefly discussed above, wavelength-shifting fibers (WSF) have long been employed for scintillation detection. Wavelength shifting fibers consist of a core with relatively high refractive index, surrounded by one or more cladding layers of lower refractive index. The core contains wavelength-shifting material, also referred to as dye. Scintillation light which enters the fiber is absorbed by the dye which, in turn, emits light with a longer wavelength. The longer wavelength light is emitted isotropically in the fiber material. Total internal reflection traps a fraction of that light and conducts it over long distances with relatively low loss. This is possible, as described with reference to FIG. 3A, because the absorption 304 and emission 302 wavelength ranges of the dye effectively do not overlap so that the wavelength-shifted light is not reabsorbed. The captured fraction is determined by the ratio of the refractive indices at surfaces of the fiber. An additional advantage of WSF is that the wavelength shifting can bring the scintillation light 306 into the sensitive wavelength range of the photo detector (PMT, silicon photomultiplier (SiPM), or Multiple-Pixel Photon-Counter (MPPC), or otherwise).

The use of WSF detectors in a flying spot X ray imaging system is known. A flying-spot scanner (FSS) uses a scanning source that is a spot of light, such as but not limited to, a high-resolution, high-light-output, low-persistence cathode ray tube (CRT), to scan an image. In contrast with film or digital X-ray detectors which have spatially sensitive detectors that establish the system resolution, flying spot X-ray systems are limited by the illumination beam spot size. The illumination beam spot size is determined by a number of factors including the X-ray focal spot size, the collimation length, the aperture size and the distance to the target.

The beam spot is the pinhole image of the focal spot, geometrically blurred by the relatively large size of the pinhole or aperture. In general, the shape of the aperture is substantially similar to the shape of the focal spot but typically larger. Accordingly, any internal structure is blurred out and only the overall dimension of the focal spot is relevant. The ideal beam spot is a sharp disk or rectangle. In reality, however, the edges are blurred. The umbra region is obtained by the projection of the aperture from the equivalent/virtual point source, which is, however, only well-defined for the case of round disk-shaped focal spot. The umbra region is defined as the region in which the entirety of the light source is obscured by the occluding body being imaged; while the penumbra is the image region where in which only a portion of the light source is obscured by the occluding body.

The actual two-dimensional intensity distribution describing the beam spot is controlled by the combination of both the focal spot and the collimator. Known collimation designs strive to minimize the size of the penumbra, as shown in FIG. 3B, which illustrates the relationship between focal length and umbra and penumbra diameters with the light and dark regions reversed. As shown, a width 310 of the penumbra correlates to and scales with the ratio of a focal spot 312 size to collimation length 314, which is the distance between focal spot 312 and aperture 322, as defined by the source 318 and the target 320. Consequently, a small focal spot allows for a shorter collimator (more compact and lighter design) and/or better collimation (smaller penumbra).

Mathematically, an umbra diameter (UD) 320 and a penumbra width (PW) 310 are related to the diameter of focal spot 312 (FS), the diameter of the aperture (AD) 322, collimation length (CL) 314, and target distance (TD) 324 through the following equations:

$$UD = AD + \frac{TD}{CL}(AD - FS) \quad (1)$$

$$PW = FS * \frac{TD}{CL} \quad (2)$$

The resolution of currently available flying spot X-ray imaging systems is limited by the size of the flying spot. The detection system has little to no spatial sensitivity, and as a result, the spatial information is created by moving the spot across the detector with synchronization to the detector readout over time. The minimum spot size is limited by the X-ray source spot size and the collimation system used to generate the spot. Typically, in cargo imaging systems, the spot is 7-10 mm in size at the detector. As shown by the equations (1) and (2) above, reducing the size of the focal spot enables designing short length collimators for flying spot X-ray imaging systems and obtaining sharper images.

In light of the above, there is clearly a need for increased spatial sensitivity for X-ray detectors in a flying spot imaging system. There is also a need to develop a WSF system that is capable of determining both the high resolution content of an image as well as the low resolution mapping of the coarse location of the spot. Furthermore, there is a need to be able to generate a high resolution image with a minimum of individual channels, thus saving cost and complexity of the system. Finally, there is a need for an improved detection system that could be effectively used in any flying spot x-ray system and configured to generate improved resolution in one or two dimensions.

SUMMARY

The following embodiments and aspects thereof are described and illustrated in conjunction with systems, tools and methods, which are meant to be exemplary and illustrative, and not limiting in scope. The present application discloses numerous embodiments.

In accordance with various embodiments of the present specification, systems and methods are provided that apply fiber-coupled scintillation detectors to problems in backscatter and transmission X-ray inspection.

For convenience of notation, a wavelength-shifted fiber-coupled scintillation detector may be referred to herein as an "Sc-WSF" detector.

The present specification discloses a handheld backscatter imaging system having a first detector configuration and a second detector configuration, comprising: a housing having a body and a handle attached to the body; a first backscatter detector positioned within a first plane of the housing; and a second plurality of backscatter detectors configured to attach to one or more edges positioned around the first backscatter detector, wherein, in the first detector configuration, the second plurality of backscatter detectors are not positioned within the first plane and wherein, in the second detector configuration, the second plurality of backscatter detectors are positioned within the first plane.

Optionally, the second plurality of detectors are configured to be moved to the first plane to detect threat materials.

Optionally, each of the second plurality of backscatter detectors is comprised of individual detectors having a length dimension of approximately 10 cm, a width dimension of approximately 10 cm, and a thickness of approximately 5 mm.

Optionally, a ratio of a) a square of a thickness of each of the second plurality of backscatter detectors to b) an active detector area of each of the second plurality of backscatter detectors is less than 0.001.

Optionally, at least one of the first backscatter detector or the second plurality of detectors has a total weight ranging from 0.5 Kg to 1 Kg.

Optionally, the handheld backscatter imaging system has a backscatter detection area of at least 2,000 $cm^2$.

Optionally, the housing further comprises a radiation source adapted to emit at least one of a fan beam or a pencil beam. Optionally, the radiation source comprises an opening adapted to permit radiation to be emitted from the handheld backscatter imaging system and wherein the first backscatter detector is positioned to straddle the opening.

Optionally, each of the second plurality of detectors is foldably attached to the one or more edges positioned around the first backscatter detector wherein, when not positioned within the first plane, the second plurality of detectors are in a folded configuration.

Optionally, each of the second plurality of detectors is slidably attached to the one or more edges positioned around the first backscatter detector.

The present specification also discloses a handheld backscatter imaging system, comprising: a housing having a body; a first backscatter detector positioned within the housing and defining a first plane; and at least one second backscatter detector having a first configuration and a second configuration, wherein, in a first configuration, the at least one second backscatter detector is not positioned within the first plane, wherein, in a second detector configuration, the at least one second backscatter detector is positioned within the first plane, and wherein the at least one second backscatter detector is configured to attach to one or more edges of the housing positioned around the first backscatter detector and configured to be moved relative to the first backscatter detector.

Optionally, the housing further comprises a handle.

Optionally, each of the second plurality of backscatter detectors is comprised of individual detectors having a length dimension of approximately 10 cm, a width dimension of approximately 10 cm, and a thickness of approximately 5 mm. Optionally, a ratio of a) a square of a thickness of each of the second plurality of backscatter detectors to b) an active detector area of each of the second plurality of backscatter detectors is less than 0.001.

Optionally, at least one of the first backscatter detector or the at least one second backscatter detector has a total weight ranging from 0.5 Kg to 1 Kg.

Optionally, the handheld backscatter imaging system has a backscatter detection area of at least 2,000 $cm^2$.

Optionally, the housing further comprises a radiation source adapted to emit at least one of a fan beam or a pencil beam. Optionally, the radiation source comprises an opening adapted to permit radiation to be emitted from the handheld backscatter imaging system and wherein the first backscatter detector is positioned to straddle the opening.

Optionally, the at least one second backscatter detector is foldably attached to the one or more edges of the housing positioned around the first backscatter detector wherein, when not positioned within the first plane, the at least one second backscatter detector is in a folded configuration.

Optionally, the at least one second backscatter detector is slidably attached to the one or more edges of the housing positioned around the first backscatter detector.

The present specification also discloses a handheld backscatter imaging system, comprising: a housing having a body; a first backscatter detector positioned within the housing and defining a first plane; and more than one second backscatter detectors having a first configuration and a second configuration, wherein, in a first configuration, the more than one second backscatter detectors are not positioned within the first plane, wherein, in a second detector configuration, the more than one second backscatter detectors are positioned within the first plane, and wherein the more than one second backscatter detectors are configured to attach to one or more edges positioned around the first backscatter detector and configured to be moved relative to the first backscatter detector.

Optionally, the housing further comprises a handle.

Optionally, each of the second plurality of backscatter detectors is comprised of individual detectors having a length dimension of approximately 10 cm, a width dimension of approximately 10 cm, and a thickness of approximately 5 mm. Optionally, a ratio of a) a square of a thickness of each of the second plurality of backscatter detectors to b) an active detector area of each of the second plurality of backscatter detectors is less than 0.001.

Optionally, at least one of the first backscatter detector or the more than one second backscatter detectors has a total weight ranging from 0.5 Kg to 1 Kg.

Optionally, the handheld backscatter imaging system has a backscatter detection area of at least 2,000 cm$^2$.

Optionally, the housing further comprises a radiation source adapted to emit at least one of a fan beam or a pencil beam. Optionally, the radiation source comprises an opening adapted to permit radiation to be emitted from the handheld backscatter imaging system and wherein the first backscatter detector is positioned to straddle the opening.

Optionally, the more than one second backscatter detectors are foldably attached to the one or more edges positioned around the first backscatter detector and wherein, when not positioned within the first plane, the more than one second backscatter detectors are in a folded configuration.

Optionally, the more than one second backscatter detectors are slidably attached to the one or more edges positioned around the first backscatter detector.

The present specification also discloses a detector for an X-ray imaging system, the detector comprising: at least one high resolution layer comprising a plurality of high resolution wavelength-shifting optical fibers placed parallel to each other, wherein each of the fibers extends through and out of a detection region and loops back into the detection region under a scintillation screen covering the high resolution wavelength-shifting optical fibers, wherein each of the plurality of high resolution wavelength-shifting optical fibers occupies a distinct region of the detector; at least one low resolution layer comprising a plurality of low resolution regions having a plurality of low resolution optical fibers laid out in a parallel configuration, wherein each of the plurality of low resolution optical fibers is configured to shift received wavelengths; and a segmented multi-channel photomultiplier tube (PMT) for coupling signals obtained from the high resolution fibers and the low resolution regions.

Optionally, the plurality of high resolution fibers comprises a range of 0.2 mm to 2 mm high resolution fibers.

Optionally, the plurality of low resolution regions comprises a range of 1 mm to 3 mm low resolution fibers.

Optionally, the PMT comprises 8 to 16 channels.

Optionally, the detector comprises at least one scintillator layer optically coupled to the at least one high resolution layer.

Optionally, each of the plurality of high resolution fibers and each of the plurality of low resolution fibers are made of plastic.

Optionally, a diameter of each of the plurality of high resolution fibers and each of the plurality of low resolution fibers is less than 200 micro meters.

Optionally, each of the plurality of high resolution fibers and each of the plurality of low resolution fibers are coated with a scintillating material.

Optionally, the detector further comprises a scintillator layer positioned between the at least one high resolution layer and the at least one low resolution layer.

Optionally, the detector further comprises one or more scintillator filters embedded in at least one of the at least one high resolution layer or the at least one low resolution layer.

The present specification also discloses a detector for an X-ray imaging system, the detector comprising: a plurality of wavelength shifting fibers, wherein each of the plurality of wavelength shifting fibers has a first edge and a second edge; a first rigid strip connected to the first edges of each of the plurality of wavelength shifting fibers and configured to provide mechanical support to each of the plurality of wavelength shifting fibers; and a second rigid strip connected to the second edges of each of the plurality of wavelength shifting fibers and configured to provide mechanical support to each of the plurality of wavelength shifting fibers, wherein the plurality of wavelength shifting fibers are physically bound together by the first and second rigid strips to form a sheet and wherein the second edges of the plurality of wavelength shifting fibers are optically coupled with a photomultiplier tube.

Optionally, each of the plurality of wavelength shifting fibers are positioned adjacent each other without a space in between each of the plurality of wavelength shifting fibers.

Optionally, each of the plurality of wavelength shifting fibers are covered with a scintillating material to form a scintillation screen for incident detecting X rays.

Optionally, a diameter of each of the plurality of wavelength shifting fibers is less than 200 micro meters.

The present specification also discloses a detector comprising a plurality of wavelength shifting fibers physically bound together by molded sheets and scintillator powder embedded between each of the plurality of wavelength shifting fibers to thereby form a detector sheet.

Optionally, a distance between each of the plurality of wavelength shifting (WSF) fibers is approximately 3 mm.

Optionally, each of the plurality of wavelength shifting fibers comprises a first end and a second end wherein at least one of the first end or the second end are in optical communication with a photomultiplier tube.

Optionally, the distance is a function of a concentration of the scintillator powder.

The present specification also discloses a method of forming a detector having a predefined signal response, comprising positioning a plurality of wavelength shifting fibers to define a detector sheet; establishing a variability of the predefined signal response by changing a space between each of the plurality of wavelength shifting fibers in the detector sheet; binding together the plurality of wavelength shifting fibers using molded sheets of a transparent, flexible plastic binder; and embedding scintillator powder between each of the plurality of wavelength shifting fibers to thereby form the detector sheet.

Optionally, the method of claim 19 further comprises decreasing the variability of the signal response by decreasing the space between each of the plurality of wavelength shifting fibers.

The present specification also discloses a detector for an X-ray imaging system, the detector comprising: a scintillation screen defining a detection region; at least one high resolution layer, optically coupled to the scintillation screen, comprising a first plurality of wavelength-shifting optical fibers wherein each of the first plurality of wavelength-shifting optical fibers is defined by a first fiber radius and a first spacing between adjacent ones of the first plurality of wavelength-shifting optical fibers, wherein each of the first plurality of wavelength-shifting optical fibers extends through the detection region and under the scintillation screen, and wherein the first plurality of wavelength-shifting optical fibers is configured to receive radiation and generate signals; at least one low resolution layer comprising a second plurality of wavelength-shifting optical fibers wherein each of the second plurality of wavelength-shifting optical fibers is defined by a second fiber radius and a second spacing between adjacent ones of the second plurality of wavelength-shifting optical fibers, and wherein at least one of the second fiber radius is larger than the first fiber radius or the second spacing is greater than the first spacing, and wherein the second plurality of wavelength-shifting optical fibers is configured to receive the radiation that passes through the at least one high resolution layer and generate signals; and a segmented multi-channel photomultiplier tube configured to receive signals obtained from the at least one low resolution layer and to receive signals obtained from the at least one high resolution layer.

Optionally, each of the second plurality of wavelength-shifting optical fibers in the detection region is placed parallel to each other.

Optionally, each of the first plurality of wavelength-shifting optical fibers in the detection region is placed parallel to each other.

Optionally, each of the first plurality of wavelength-shifting optical fibers extends through and out of a detection region and loops back into the detection region under the scintillation screen.

Optionally, each of the first plurality of wavelength-shifting optical fibers occupies a distinct region of the detector.

Optionally, each of the second plurality of wavelength-shifting optical fibers is configured to shift wavelengths of received radiation.

Optionally, the first radius is in a range of 0.2 mm to 2 mm high resolution fibers.

Optionally, the second radius is in a range of 1 mm to 3 mm.

Optionally, the segmented multi-channel photomultiplier tube comprises 8 to 16 channels.

Optionally, the detector comprises at least one scintillator layer optically coupled to the at least one high resolution layer.

Optionally, each of the first plurality of wavelength-shifting optical fibers and each of the second plurality of wavelength-shifting optical fibers comprise plastic.

Optionally, the first radius and the second radius are each less than 200 micrometers.

Optionally, the detector further comprises a scintillator layer between the at least one high resolution layer and the at least one low resolution layer.

Optionally, the detector further comprises one or more scintillator filters embedded in at least one of the at least one high resolution layer or the at least one low resolution layer.

The present specification also discloses a method of forming a detector with at least one high resolution layer and at least one low resolution layer, wherein the at least one high resolution layer has a first predefined signal response and wherein the at least one low resolution layer has a second predefined signal response, the method comprising: positioning a first plurality of wavelength shifting fibers to define the at least one high resolution layer; establishing a variability of the first predefined signal response by changing a first space between each of the first plurality of wavelength shifting fibers; binding together the first plurality of wavelength shifting fibers using molded sheets of a transparent, flexible plastic binder; embedding scintillator powder between each of the first plurality of wavelength shifting fibers to form the at least one high resolution layer; positioning a second plurality of wavelength shifting fibers to define the at least one low resolution layer; establishing a variability of the second predefined signal response by changing a second space between each of the second plurality of wavelength shifting fibers; binding together the second plurality of wavelength shifting fibers using molded sheets of a transparent, flexible plastic binder; and embedding scintillator powder between each of the second plurality of wavelength shifting fibers to form the at least one low resolution layer, wherein the first space is less than the second space.

Optionally, the method further comprises decreasing the variability of the first signal response by decreasing the first space between each of the first plurality of wavelength shifting fibers.

Optionally, the method further comprises decreasing the variability of the second signal response by decreasing the second space between each of the second plurality of wavelength shifting fibers.

The present specification also discloses a detector for an X-ray imaging system, the detector comprising: at least one high resolution layer comprising a first plurality of wavelength-shifting optical fibers wherein each of the first plurality of wavelength-shifting optical fibers is defined by a first fiber radius and a first spacing between adjacent ones of the first plurality of wavelength-shifting optical fibers, wherein each of the first plurality of wavelength-shifting optical fibers extends through the detection region and under the scintillation screen, and wherein the first plurality of wavelength-shifting optical fibers is coated with scintillation material and is configured to receive radiation and generate signals; at least one low resolution layer comprising a second plurality of wavelength-shifting optical fibers wherein each of the second plurality of wavelength-shifting optical fibers is defined by a second fiber radius and a second spacing between adjacent ones of the second plurality of wavelength-shifting optical fibers, and wherein at least one of the second fiber radius is larger than the first fiber radius or the second spacing is greater than the first spacing, and wherein the second plurality of wavelength-shifting optical fibers is coated with scintillation material and is configured to receive the radiation that passes through the at least one high resolution layer and generate signals; and a segmented multi-channel photomultiplier tube configured to receive signals obtained from the at least one low resolution layer and to receive signals obtained from the at least one high resolution layer.

Optionally, the second plurality of wavelength-shifting optical fibers is coated with scintillation material.

In a first embodiment of the present specification, a detector of penetrating radiation is provided that has an unpixelated volume of scintillation medium for converting energy of incident penetrating radiation into scintillation light. The detector has multiple optical waveguides, aligned substantially parallel to each other over a scintillation light extraction region that is contiguous with the unpixelated volume of the scintillation medium. The optical waveguides guide light derived from the scintillation light to a photodetector for detecting photons guided by the waveguides and for generating a detector signal.

In other embodiments of the present specification, the detector may also have an integrating circuit for integrating the detector signal over a specified duration of time.

In an alternate embodiment of the specification, a detector of penetrating radiation is provided that has a volume of scintillation medium for converting energy of incident penetrating radiation into scintillation light and a plurality of optical waveguides, aligned substantially parallel to each other over a scintillation light extraction region contiguous with the volume of the scintillation medium. The optical waveguides guide light derived from the scintillation light to a photo-detector that generates a detector signal. Finally, an integrating circuit for integrating the detector signal over a specified duration of time.

In further embodiments of the specification, the optical waveguides in the foregoing detectors may be adapted for wavelength shifting of the scintillation light and, more particularly, may be wavelength-shifting optical fibers. The scintillation medium may include a lanthanide-doped barium mixed halide such as barium fluorochloride. The photo-detector may include a photomultiplier.

In yet further embodiments of the specification, the square of the thickness of any of the foregoing detectors, divided by the area of the detector, may be less than 0.001. At least one of the plurality of waveguides may lack cladding and the scintillation medium may be characterized by an index of refraction of lower value than an index of refraction characterizing the waveguide. The optical waveguides may be disposed in multiple parallel planes, each of the parallel planes containing a subset of the plurality of optical waveguides.

In other embodiments of the specification, the detector may have a plurality of layers of scintillator medium successively encountered by an incident beam, and the layers may be characterized by distinct spectral sensitivities to the incident beam. Alternating layers of scintillator may include Li6F:ZnS(Ag) alternating with at least one of fiber-coupled BaFCl(Eu) and fiber-coupled BaFI(Eu). A first of the plurality of layers of scintillator medium may be a wavelength-shifting fiber-coupled detector preferentially sensitive to lower-energy X rays, and a last of the plurality of layers of scintillator medium may be a plastic scintillator.

Segments of scintillator medium may be disposed in a plane transverse to a propagation direction of an incident beam and may be distinctly coupled to photo-detectors via optical fibers.

In accordance with another aspect of the present specification, a method for manufacturing a scintillation detector, the method comprising extruding a shell of scintillating material around an optical waveguide, and, in a particular embodiment, the optical waveguide is a wavelength-shifting optical fiber.

In an alternate embodiment, a method for detecting scattered X-ray radiation has steps of: providing a detector characterized by a plurality of individually read-out segments; and summing a signal from a subset of the individually read-out segments, wherein the subset is selected on a basis of relative signal-to-noise.

In another aspect of the specification, a method is provided for detecting scattered X-ray radiation. The method has steps of: providing a detector characterized by a plurality of individually read-out segments; and summing a signal from a subset of the individually read-out segments, wherein the subset is selected on a basis of a known position of a primary illuminating beam.

A mobile X-ray inspection system is provided in accordance with another embodiment. The inspection system has a source of X-ray radiation disposed upon a conveyance having a platform and ground-contacting members, and a fiber-coupled scintillation detector deployed outside the conveyance during inspection operation for detecting X rays that have interacted with the inspected object.

The mobile X-ray inspection system may also have a fiber-coupled scintillation awning detector deployed above the inspected object during a course of inspection, and the awning detector may slide out from a roof of the conveyance prior to inspection operation. There may also be a skirt detector deployed beneath the platform of the conveyance, and a roof detector for detection of spaces higher than the conveyance, as well as substantially horizontal and substantially upright fiber-coupled scintillator detector segments. The substantially horizontal and substantially upright fiber-coupled scintillator detector segments may be formed into an integral structure.

In accordance with another aspect of the present specification, an apparatus is provided for detecting radiation incident upon the apparatus, the apparatus comprising: a plurality of substantially parallel active collimation vanes comprising wavelength-shifted fiber-coupled scintillation detectors sensitive to the radiation for generating at least a first detection signal; a rear broad area detector for detecting radiation that passes between substantially parallel active collimation vanes of the plurality of active collimator vanes and generating a second detection signal; and a processor for receiving and processing the first and second detection signals.

In accordance with an alternate embodiment of the specification, a top-down imaging inspection system is provided for inspecting an object disposed on an underlying surface. The top-down imaging inspection system has a source of substantially downward pointing X rays and a linear detector array disposed within a protrusion above the underlying surface. The linear detector array may include wavelength-shifted fiber-coupled scintillation detectors.

In accordance with another aspect of the specification, an X-ray inspection system is provided for inspecting an underside of a vehicle. The X-ray inspection system has a source of substantially upward pointing X-rays coupled to a chassis and a wavelength-shifting fiber-coupled scintillator detector disposed on the chassis for detecting X-rays scattered by the vehicle and by objects concealed under or within the vehicle. The chassis may be adapted to be maneuvered under the vehicle by at least one of motor and manual control.

The aforementioned and other embodiments of the present specification shall be described in greater depth in the drawings and detailed description provided below.

BRIEF DESCRIPTION OF THE DRAWINGS

These and other features and advantages of the present specification will be further appreciated, as they become better understood by reference to the detailed description when considered in connection with the accompanying drawings:

FIG. 6C is a cross-sectional view of an extruder for co-extruding a cylindrical scintillator with a WSF, in accordance with an embodiment of the present specification;

FIG. 15 is a cross-sectional view of a scintillation detector with multi-energy resolution, in accordance with an embodiment of the present specification;

FIG. 16 shows a multi-layer scintillation detector for detection of both X-rays and thermal neutrons, in accordance with an embodiment of the present specification;

FIG. 18A shows a perspective view of a WSF-detector used as an active collimated detector in accordance with an embodiment of the present specification;

FIG. 18B shows a cross-sectional view of a WSF-detector used as an active collimated detector in accordance with an embodiment of the present specification;

FIG. 19A shows multiple detectors folding out of a hand-held scanner, in a stored condition, in accordance with an embodiment of the present specification;

FIG. 19B shows multiple detectors folding out of a hand-held scanner, in a deployed condition, in accordance with an embodiment of the present specification;

FIG. 24A illustrates a 16 channel PMT coupling signals obtained from all high resolution fibers and low resolution fibers of the detector illustrated in FIG. 22A, in accordance with an embodiment of the present specification;

FIG. 25 is a block diagram illustrating the layers of an exemplary multi-layer high-resolution detector, in accordance with an embodiment of the present specification;

FIG. 26A illustrates a detector panel placed in direct beam of scanning radiation emitted by a small portable scanner being used to scan an object, in accordance with an embodiment of the present specification;

FIG. 26B illustrates a backscatter image obtained by the scanner of FIG. 26A, in accordance with an embodiment of the present specification;

FIG. 26C illustrates a transmission image obtained by a built-in detector of the scanner of FIG. 26A by using the detector panel as shown in FIG. 26A, in accordance with an embodiment of the present specification;

FIG. 26D illustrates transmission images of a gun placed behind steel walls of different thickness obtained by using the detector panel shown in FIG. 26A;

DETAILED DESCRIPTION

Figure 1A:
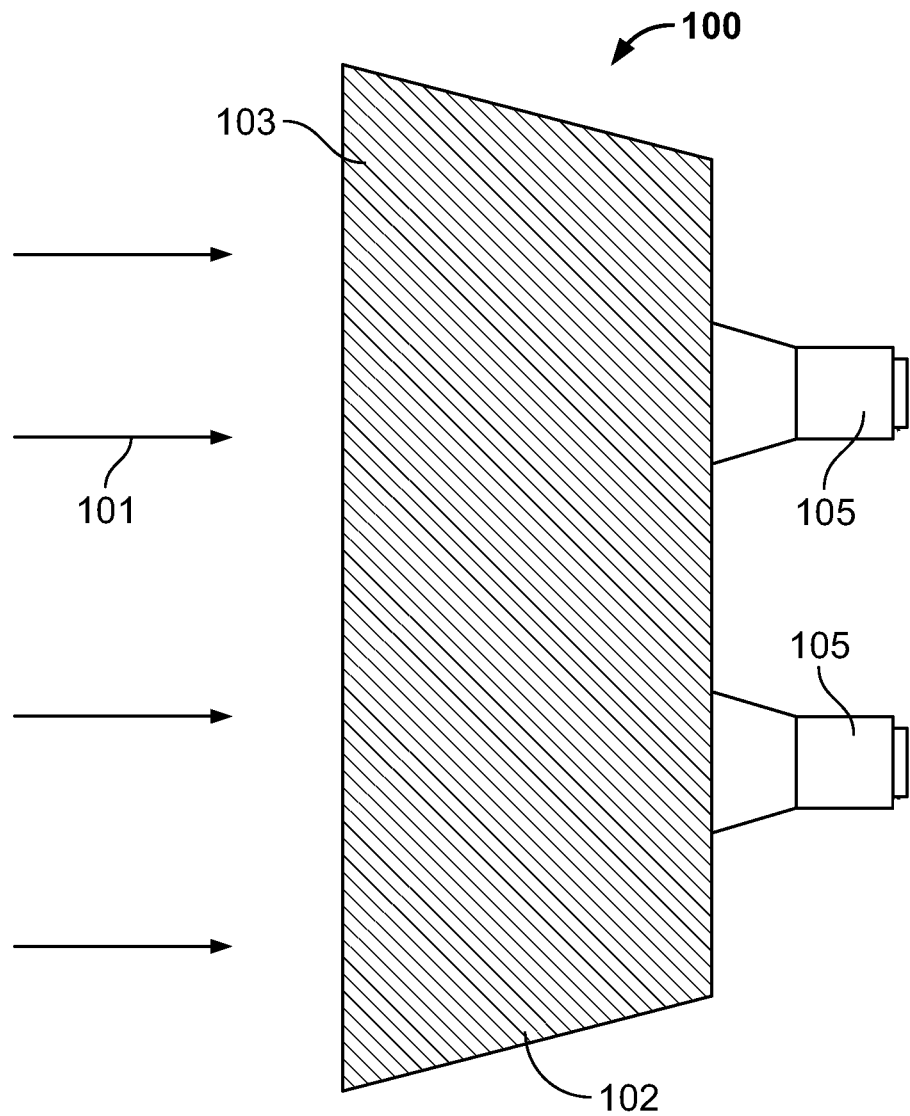
FIGS. 1A and 1B show side and front cross-sectional views, respectively, of a "box-type" prior art scintillation detector.
Figure 1B:
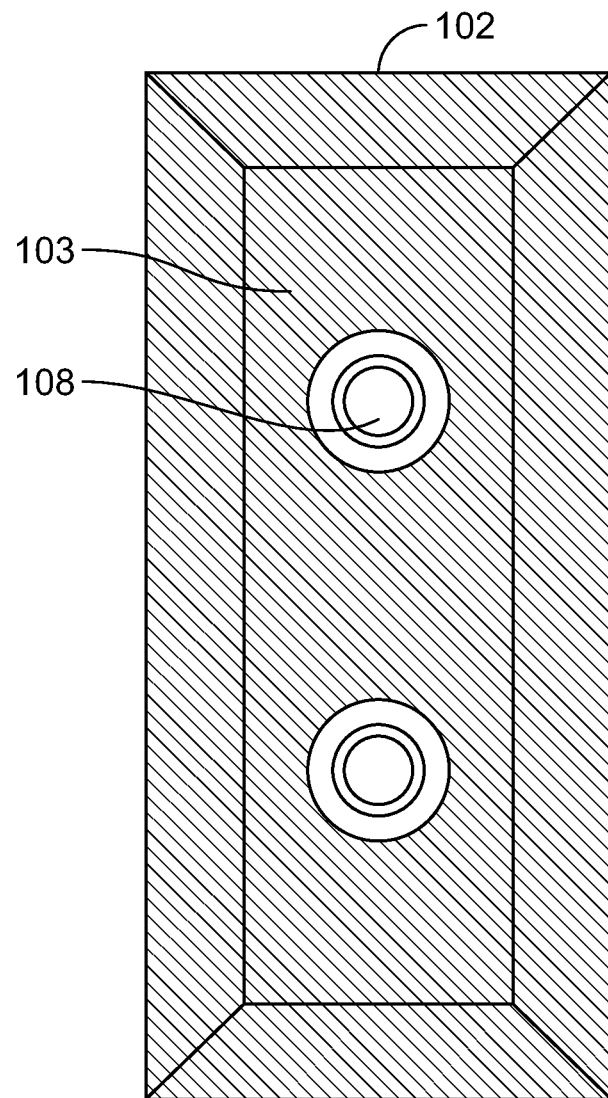
Figure 2:
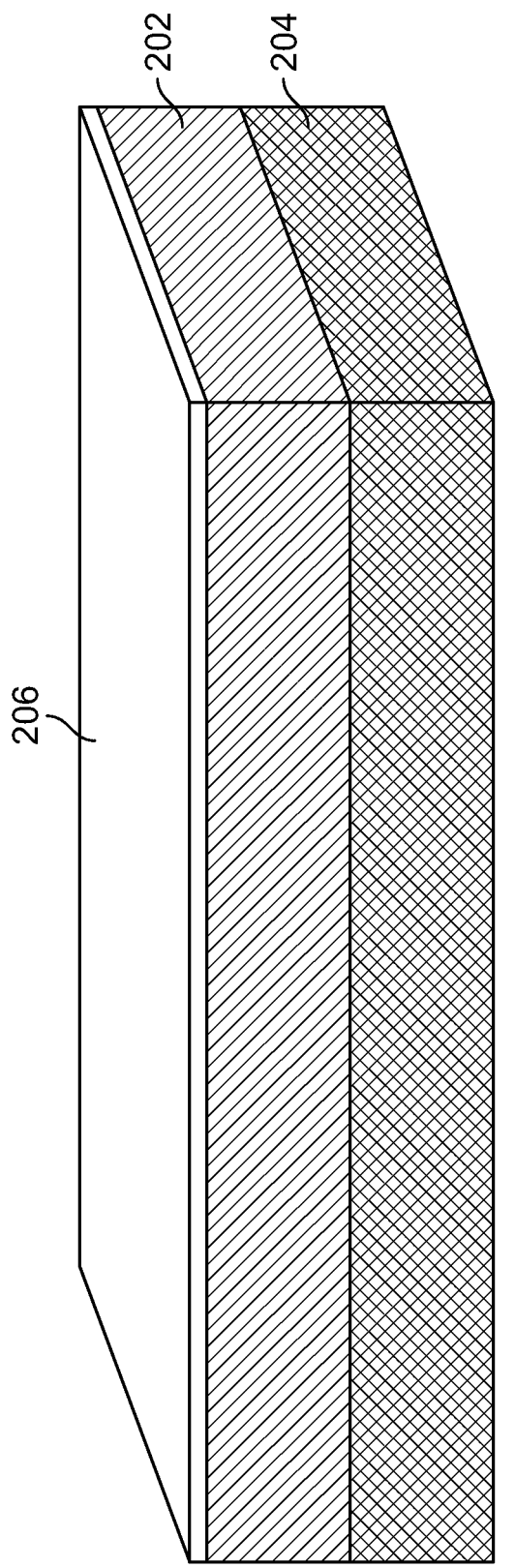
FIG. 2 is a schematic view of a prior art scintillator screen.
Figure 3A:
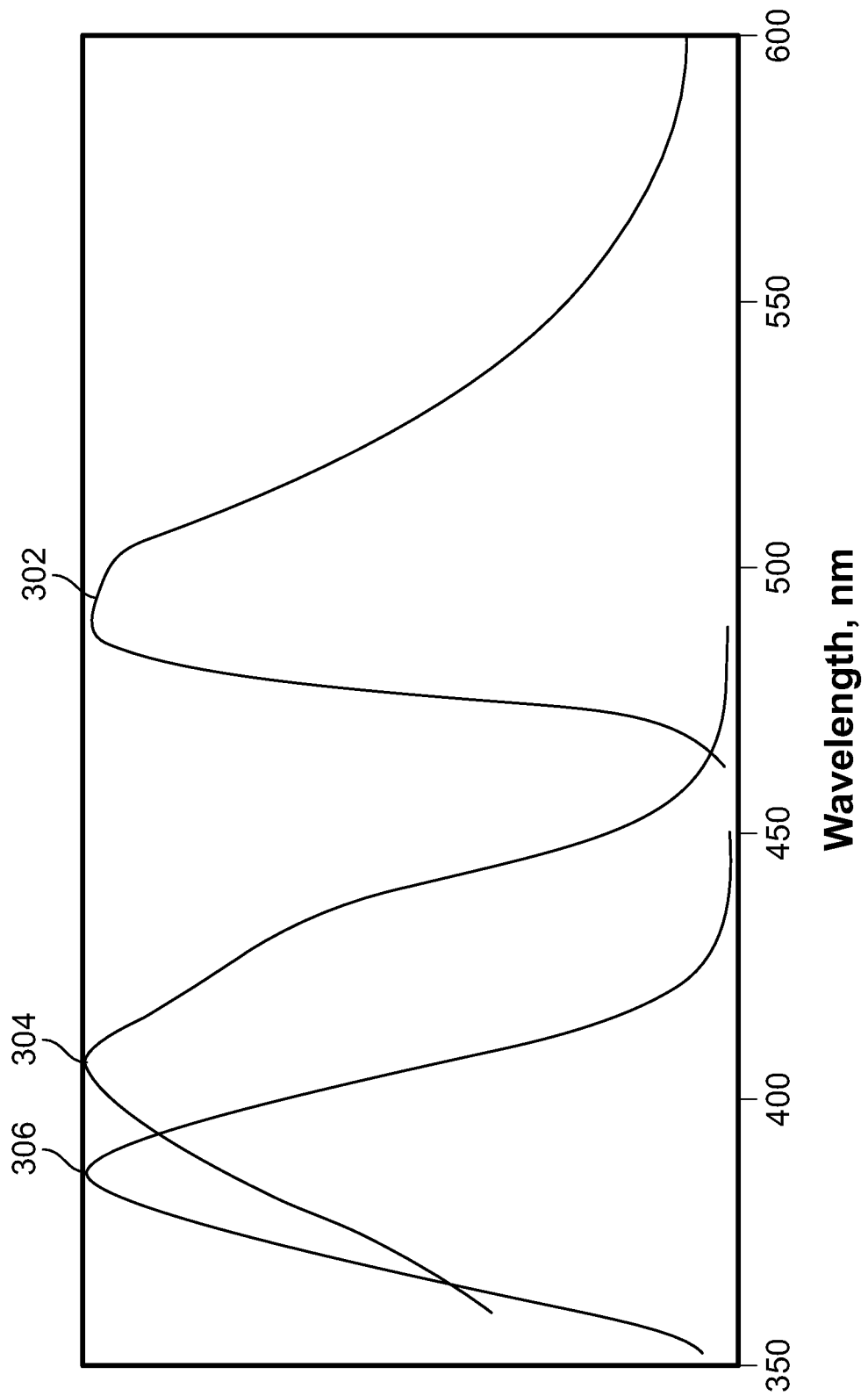
FIG. 3A depicts spectral relationships among scintillation light and typical wavelength-shifting fiber absorption and emission spectra.
Figure 3B:
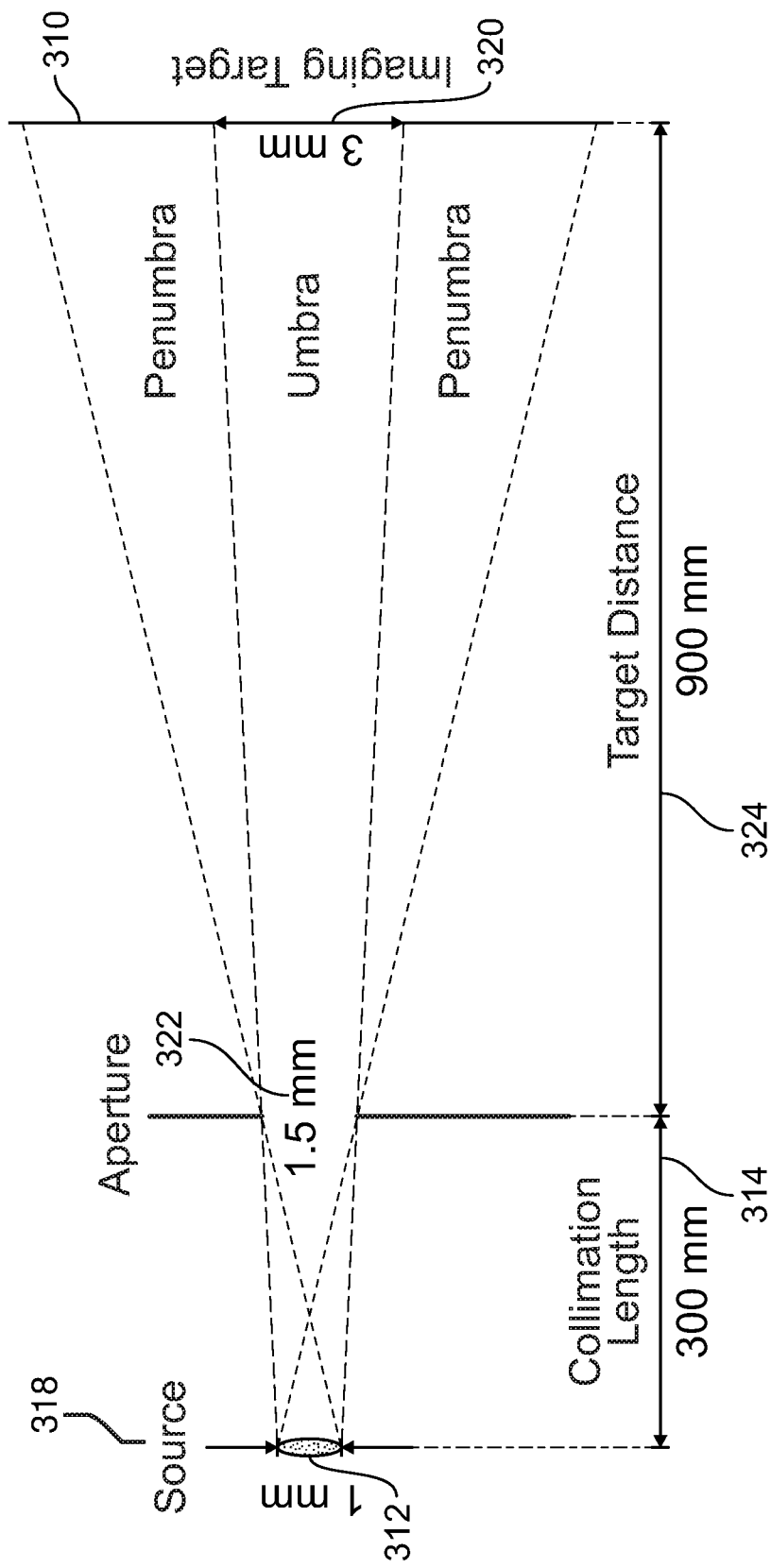
FIG. 3B illustrates the relationship between focal length and umbra and penumbra diameters with light and dark regions reversed.

In accordance with embodiments of the present specification, the optical coupling of scintillator material to optical waveguides, and, more particularly, to wavelength-shifting fibers, advantageously enables objectives including those peculiar to the demands of X-ray scatter detection.

The term "image" shall refer to any unidimensional or multidimensional representation, whether in tangible or otherwise perceptible form, or otherwise, whereby a value of some characteristic (such as fractional transmitted intensity through a column of an inspected object traversed by an incident beam, in the case of X-ray transmission imaging) is associated with each of a plurality of locations (or, vectors in a Euclidean space, typically R2) corresponding to dimensional coordinates of an object in physical space, though not necessarily mapped one-to-one there onto. An image may comprise an array of numbers in a computer memory or holographic medium. Similarly, "imaging" refers to the rendering of a stated physical characteristic in terms of one or more images.

For purposes of the present description, in some embodiments, a 'high resolution layer' is defined as a layer of a detector comprising a first plurality of wavelength-shifting optical fibers, wherein each of the first plurality of wavelength-shifting optical fibers is defined by a first fiber radius and a first spacing between adjacent ones of the first plurality of wavelength-shifting optical fibers, wherein each of the first plurality of wavelength-shifting optical fibers extends through a detection region and under a scintillation screen of the detector, and wherein the first plurality of wavelength-shifting optical fibers is configured to receive radiation and generate signals.

For purposes of the present description, in some embodiments, a 'low resolution layer' is defined as a layer of a detector comprising a second plurality of wavelength-shifting optical fibers wherein each of the second plurality of wavelength-shifting optical fibers is defined by a second fiber radius and a second spacing between adjacent ones of the second plurality of wavelength-shifting optical fibers, and wherein at least one of the second fiber radius is larger than the first fiber radius of the 'high resolution layer' or the second spacing is greater than the first spacing of the 'high resolution layer', and wherein the second plurality of wavelength-shifting optical fibers is configured to receive the radiation that passes through the 'high resolution layer' and generate signals.

For purposes of the present description, and in any appended claims, the term "thickness," as applied to a scintillation detector, shall represent the mean extent of the detector in a dimension along, or parallel to, a centroid of the field of view of the detector. The term area, as applied to a detector, or, equivalently, the term "active area" shall refer to the size of the detector measured in a plane transverse to centroid of all propagation vectors of radiation within the field of view of the detector.

Terms of spatial relation, such as "above," "below," "upper," "lower," and the like, may be used herein for ease of description to describe the relationship of one element to another as shown in the figures. It will be understood that such terms of spatial relation are intended to encompass different orientations of the apparatus in use or operation in addition to the orientation described and/or depicted in the figures.

As used herein, and in any appended claims, the term "large-area detector" shall refer to any single detector, or to any detector module, subtending an opening angle of at least 30° in each of two orthogonal transverse directions as viewed from a point on an object undergoing inspection, equivalently, characterized by a spatial angle of at least $\pi$ steradians.

A "conveyance" shall be any device characterized by a platform borne on ground-contacting members such as wheels, tracks, treads, skids, etc., used for transporting equipment from one location to another.

Where an element is described as being "on," "connected to," or "coupled to" another element, it may be directly on, connected or coupled to the other element, or, alternatively, one or more intervening elements may be present, unless otherwise specified.

The terminology used herein is for the purpose of describing particular embodiments and is not intended to be limiting. The singular forms "a," "an," and "the," are intended to include the plural forms as well.

In the description and claims of the application, each of the words "comprise" "include" and "have", and forms thereof, are not necessarily limited to members in a list with which the words may be associated. It should be noted herein that any feature or component described in association with a specific embodiment may be used and implemented with any other embodiment unless clearly indicated otherwise.

The present specification is directed towards multiple embodiments. The following disclosure is provided in order to enable a person having ordinary skill in the art to practice the specification. Language used in this specification should not be interpreted as a general disavowal of any one specific embodiment or used to limit the claims beyond the meaning of the terms used therein. The general principles defined herein may be applied to other embodiments and applications without departing from the spirit and scope of the specification. Also, the terminology and phraseology used is for the purpose of describing exemplary embodiments and should not be considered limiting. Thus, the present specification is to be accorded the widest scope encompassing numerous alternatives, modifications and equivalents consistent with the principles and features disclosed. For purpose of clarity, details relating to technical material that is known in the technical fields related to the specification have not been described in detail so as not to unnecessarily obscure the present specification.

It should be noted herein that any feature or component described in association with a specific embodiment may be used and implemented with any other embodiment unless clearly indicated otherwise.

WSF Detectors

Figure 4:
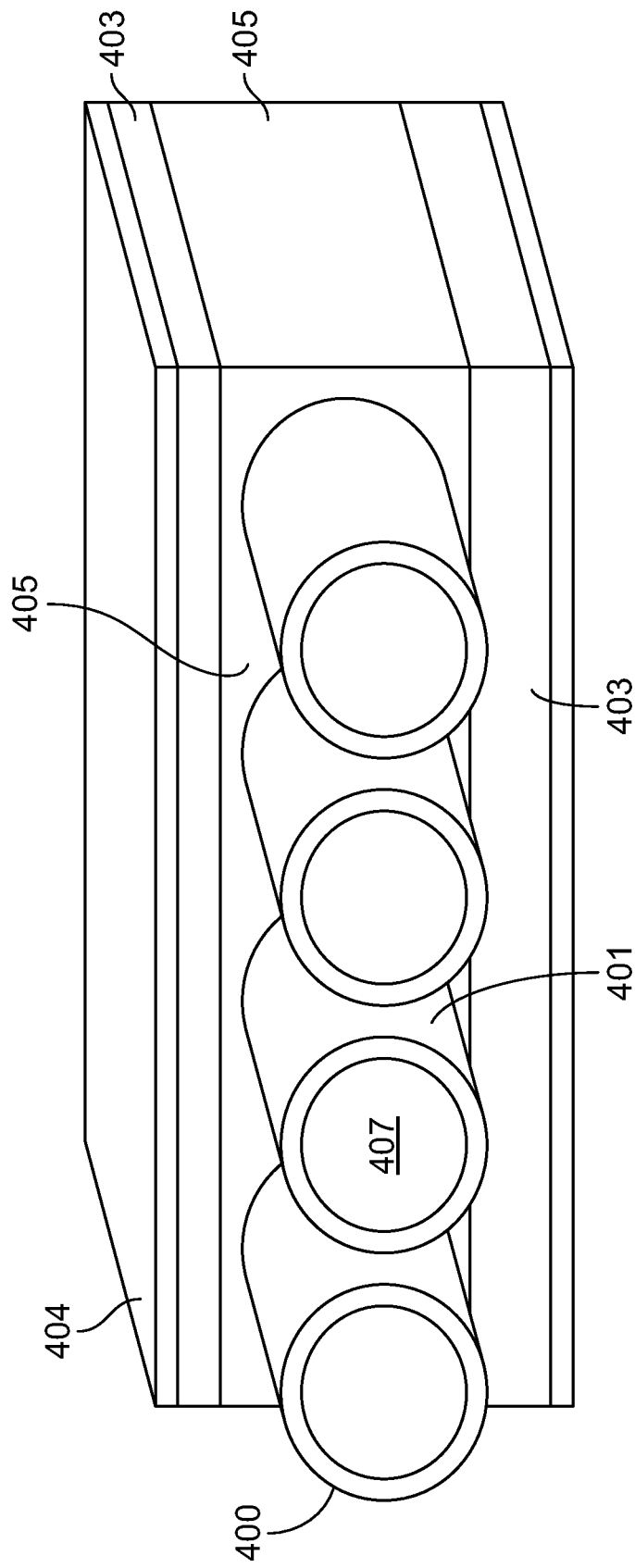
FIG. 4 is a perspective schematic view of an array of wavelength-shifting fibers sandwiched between scintillator material, in accordance with an embodiment of the present specification.

Referring, first, to FIG. 4, in one embodiment of the specification, a layer of closely spaced parallel wavelength-shifting fibers 400 is sandwiched between two layers 403 of composite scintillating screen. The preferred scintillator material is europium-doped barium fluorochloride (BaFCl:Eu), although other scintillators, such as BaFI:Eu, or other lanthanide-doped barium mixed halides (including, by way of further example, BaBrI:Eu and BaCsI:Eu), may be used within the scope of the present specification. Since scintillator materials employed for X-ray detection typically exhibit very strong self-absorption of scintillation photons, embodiments in accordance with the present specification advantageously allow unusually large volumes of scintillator 403 to be employed while still efficiently coupling out scintillation signal.

One advantage to using composite scintillation screen in the present application is that it allows for fabrication by extrusion of a fiber-coupled scintillation detector.

Composite scintillator 403 is structurally supported by exterior layers 404 of plastic, or other material, providing mechanical support. Optical contact between the fiber cladding 401 and the composite scintillator 403 is established by filling the voids with index-matching material 405 of suitable refractive index which is transparent to the scintillation light. The refractive index of the filling material is chosen to optimize the collection of primary light photons into the WSF and the capture of wavelength-shifted photons in the fiber. Filling material 405 may be optical grease or optical epoxy, for example, though any material is within the scope of the present specification.

Figure 8:
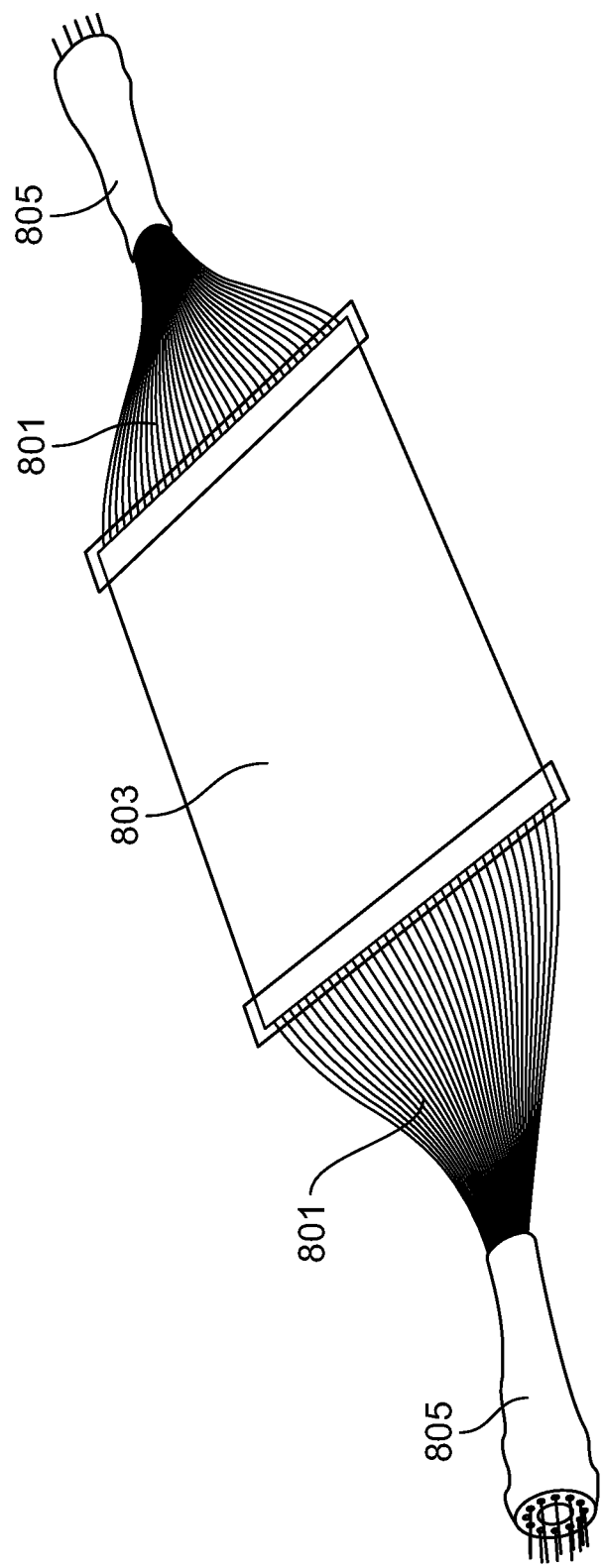
FIG. 8 is a top view of a wavelength-shifted fiber-coupled scintillation detector in accordance with an embodiment of the present specification.

Upon incidence of X-ray photons, scintillation light emitted by scintillator 403 is coupled via cladding 401 into core 407 of the respective fibers, down-shifted in frequency (i.e., red-shifted) and propagated to one or more photo-detectors 805 (shown in FIG. 8, for example). Light from the fiber cores 407 is converted into a current via photo-detector 805, and the current is integrated for an interval of time, typically in the range of 1-12 μs, to obtain the signal strength for each pixel. Integration of the detector signal may be performed by an integrating circuit (not shown), such as an integrating pre-amplifier, for example.

Figure 5:
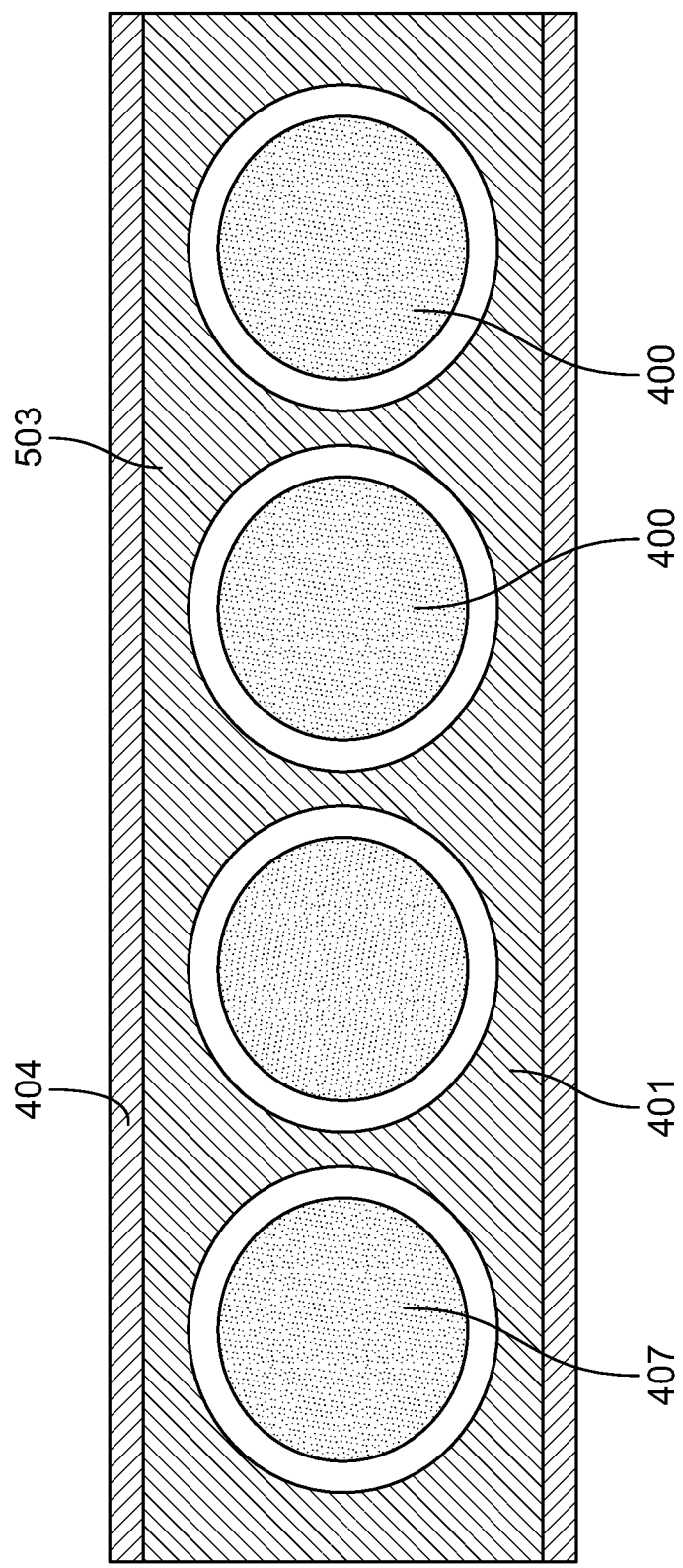
FIG. 5 is a cross-sectional schematic view of an array of wavelength-shifting fibers embedded within a matrix of scintillator material, in accordance with an embodiment of the present specification.

Referring now to FIG. 5, wavelength-shifting fibers 400 are embedded in the matrix of the scintillating screen 503. Embedding the WSF into the scintillating medium creates the best optical contact.

Figure 6A:
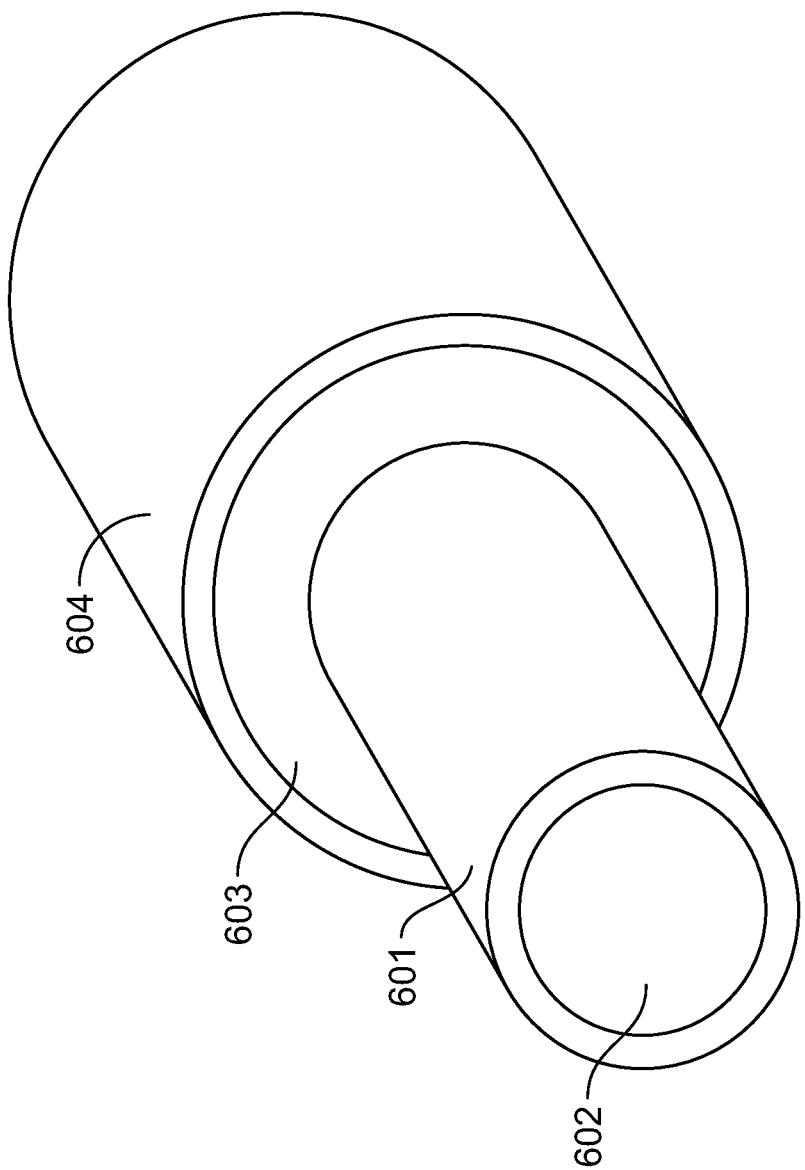
FIG. 6A is a perspective view of a cylindrical scintillator extruded about a WSF, in accordance with an embodiment of the present specification.

In yet another embodiment of the specification, described now with reference to FIG. 6A, composite scintillator material 603 is applied like a cladding or shell around a WSF 601 with core 602. This application lends itself to an extrusion-style manufacturing process and allows making the most effective use of costly scintillator material 603. The scintillator material 603 is sealed off with a protective layer 604 which also acts as a reflector to the scintillation light. Within the scope of the present specification, the cladding is optional and may be omitted when the scintillator has a lower index of refraction than the fiber and the scintillator-fiber bond has the necessary smoothness and robustness.

Figure 6B:
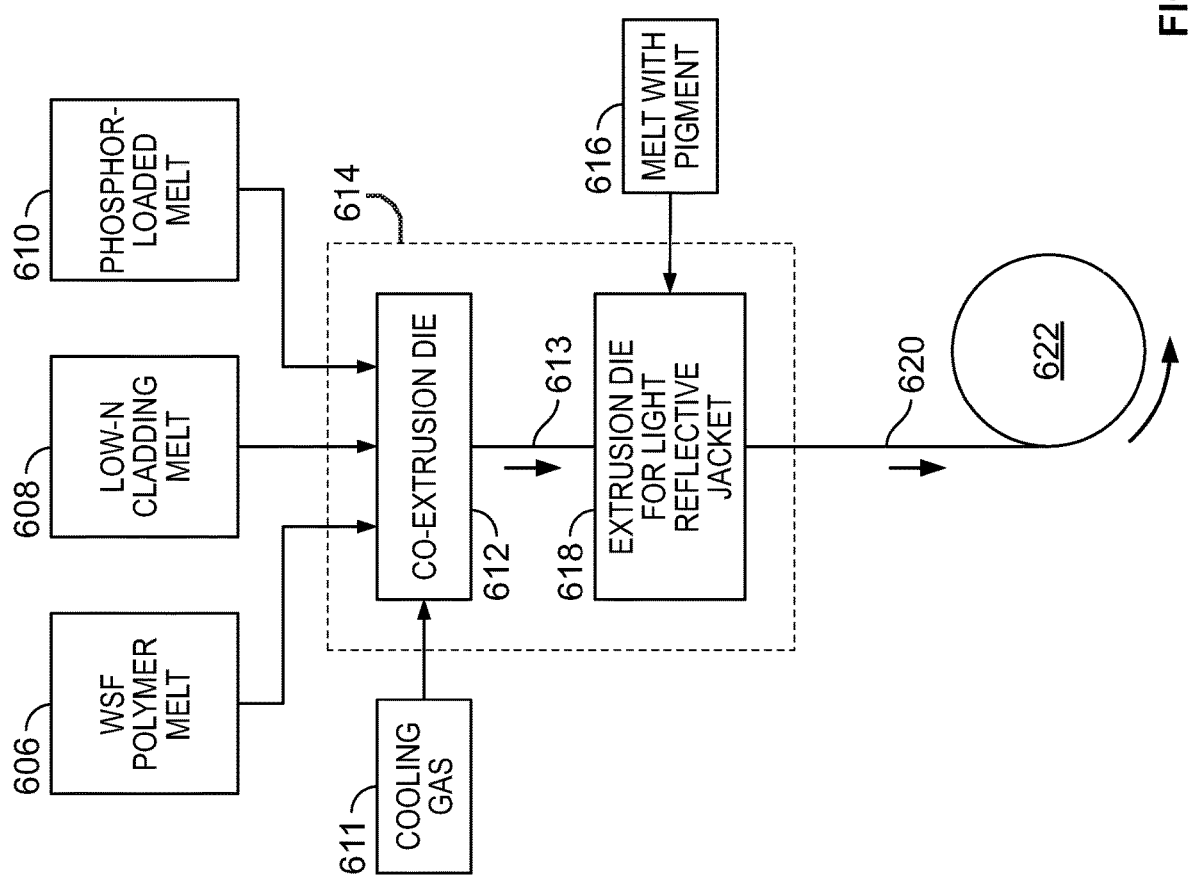
FIG. 6B is a schematic depiction of a system for extruding a cylindrical scintillator about a WSF, in accordance with an embodiment of the present specification.

A wavelength-shifting polymer optical fiber may be manufactured, in accordance with an embodiment of the specification now described with reference to the system schematic depicted in FIG. 6B. Sources of WSF polymer melt 606, low-refractive-index cladding polymer melt 608, and phosphor-embedded optically transparent polymer melt 610, all under pressure, are fed into a co-extrusion die 612 within extrusion zone 614, and co-extruded. Dry gas 611, such as dry air or nitrogen, for example, is sprayed onto the extruded fiber for cooling. Polymer melt with a light-reflective pigment (such as TiO2, for example) 616 is fed under pressure into an extrusion die 618 for a light-reflective jacket over the scintillator-coated WSF 613. The resultant scintillator-loaded WSF 620 is wound for storage by winder 622. FIG. 6C shows a cross-sectional view of a co-extrusion system, for use in accordance with embodiments of the present specification, for the manufacture of scintillator-coated WSF. The WSF polymer melt 606 is injected, along with the low-refractive-index cladding polymer melt 608 and phosphor-embedded optically transparent polymer melt 610, into co-extrusion die 612. Polymer melt with a light-reflective pigment 616 is fed under pressure into extrusion die 618. The completed fiber has a WSF core 602, a low-index cladding 601, a scintillator-loaded cladding 603, and a reflective coating 604.

For all embodiments of a scintillation detector in accordance with the present specification, it is advantageous that the thickness of the scintillator material be optimized for the energy of the radiation to be detected. The design should ensure sufficient light collection to avoid a secondary quantum sink. In particular, embodiments of the specification described herein provide for detectors of extraordinary thinness relative to their area.

Embodiments of the present specification, even those with as many as 8 WSF layers, have ratios of the square of detector thickness to the active detector areas that are less than 0.001. For example, an 8-layer detector with an area of 48"×12" has a thickness no greater than 0.5", such that the ratio of the square of the thickness to the detector area is 0.0005. This thickness-squared-to-area ratio is typically an order of magnitude, or more, smaller than the comparable ratio for backscatter detectors where scintillator light is directly detected by a photo-detector.

Figure 7A:
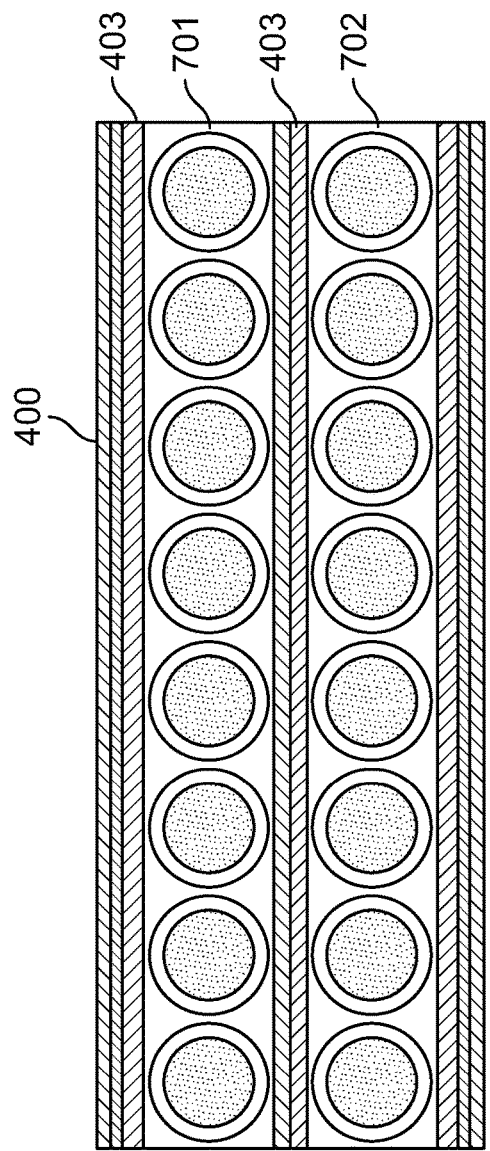
FIG. 7A is a schematic cross-section of a scintillation detector with multiple rows of WSF, in accordance with an embodiment of the present specification.
Figure 7B:
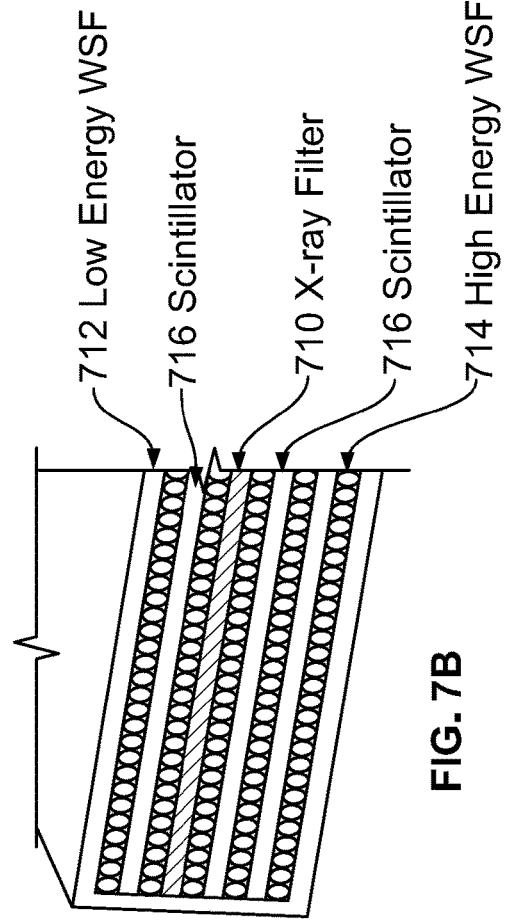
FIG. 7B illustrates a schematic cross-section of a scintillation detector with multiple rows of WSF, in accordance with another embodiment of the present specification.

In accordance with a further embodiment of the specification depicted in FIG. 7A, the useful stopping power of the detector can be increased by combining multiple layers 701, 702 of WSF 400 (or other optical waveguides) thereby increasing the depth of scintillator material 403 along the path of the incident radiation. FIG. 7B illustrates a schematic cross-section of a scintillation detector with multiple rows of WSF, in accordance with another embodiment of the present specification. As shown in the figure, in order to produce image data with materials separation, multiple layers of WSF detectors are stacked, and are separated by a metallic material which functions as a filter and hardens an incident X-ray beam. An X-ray filter 710 is inserted between layers of low energy WSF 712, high energy WSF 714 and scintillator material 716. In an embodiment, copper is used as a filter due to its good performance and cost over alternative materials. In an embodiment, a copper filter having a thickness ranging from 0.5 mm to 1.0 mm is used, which may shift the X-ray beam's peak energy by 20 kV to 30 kV.

An embodiment of a wavelength-shifted scintillator detector in accordance with the present specification is shown in FIG. 8. Wavelength-shifting fibers 801 are embedded within scintillator material 803, coupling light, and downshifting it in frequency for detection by photomultiplier tubes 805. In accordance with various of the embodiments heretofore described, the ends of the WSF are bundled and optically coupled to at least one photo-detector. Examples of suitable photo detectors include PMTs and silicon photomultipliers (SiPMs).

Advantages of the detector, the specification of which is described herein, include the efficiency of detection, and the low geometrical profile of implementation. This allows greater freedom in designing a detection system and it makes entirely new, space constrained applications possible. The mechanical flexibility of the detector structure allows shaping the detector surface to conform to the application, such as an implementation in which an imaged object is surrounded by detector volume. The low profile also makes it relatively easy to orient and shield the detector area in ways to minimize the detection of unwanted scatter radiation (crosstalk) from a nearby X-ray imaging system.

The extraction of scintillation light over a large region of scintillator enables detectors of large width-to-depth aspect ratio. In particular, detectors subtending spatial angles of 0.1 sr, or more, are facilitated by embodiments of the present specification.

In a typical backscatter X-ray imaging system, an X-ray pencil beam scans an imaged target in a linear motion, while elongated radiation detectors are arranged on both sides of an exit aperture of an X-ray source. As the pencil beam moves, the detector area closest to the beam will typically receive the strongest signal and detector area further from the beam less. If the detector area is segmented into individually readable sections the signal to noise ratio of the detection system can be improved by only reading the segments with a good signal to noise ratio and neglecting the segments which would contribute predominantly noise to the summed signal. The selection of contributing detector segments can be made based on the actually detected signal or based on the known position of the pencil beam.

The extrusion, or "automated coating" process, described above with reference to FIGS. 6A-6C, is in stark contrast to typical methods of laying down polycrystalline scintillation material, such as BaFCl(Eu), on a flat backing. The extrusion method of fabricating individual wavelength-shifting fibers coated with a uniform thickness of scintillator, as taught above, produces fibers that can be contoured so that the restrictions on the shape of a Sc-WSF detector is governed primarily by the requirement of full capture in the fiber by total internal reflection. The concept of uniformly coated coupling fibers gives greater freedom to the design of backscatter (BX) detectors, especially hand-held and robot-mounted detectors, where space is at a premium.

Deployable Detectors to Increase the Geometric Efficiency of Scattered X Rays:

Some mobile X-ray systems, such as those described, for example, in U.S. Pat. No. 5,764,683, to Swift, et al. and U.S. Pat. No. 7,099,434, to Chalmers et al., both of which are incorporated herein by reference, use the method of backscattered X rays (BX) to inspect cars and trucks from one side. The former uses detectors deployed outside a conveyance during operation, whereas the latter uses a detector area entirely contained within an enclosure, namely the skin of a conveyance. Both use large-area detectors to maximize the efficiency of detecting the scattered X rays. The areal backscatter detector coverage in the case of a product in accordance with the teachings of the Chalmers '434 Patent covers on the order of 20 square feet of the interior surface of an enclosure that faces the target. This covert detector area has relatively poor geometrical efficiency for collecting the scattered radiation from high or low targets. The intrinsically deep geometrical profile of such detectors, necessary for direct capture of the scintillation light by photomultipliers, is inimical to deployment outside the van.

An Sc-WSF detector, in accordance with embodiments of the present specification, makes practical the unobtrusive storage of large-area detectors that can be quickly deployed outside the van in positions that substantially enhance detection efficiency.

Figure 9:
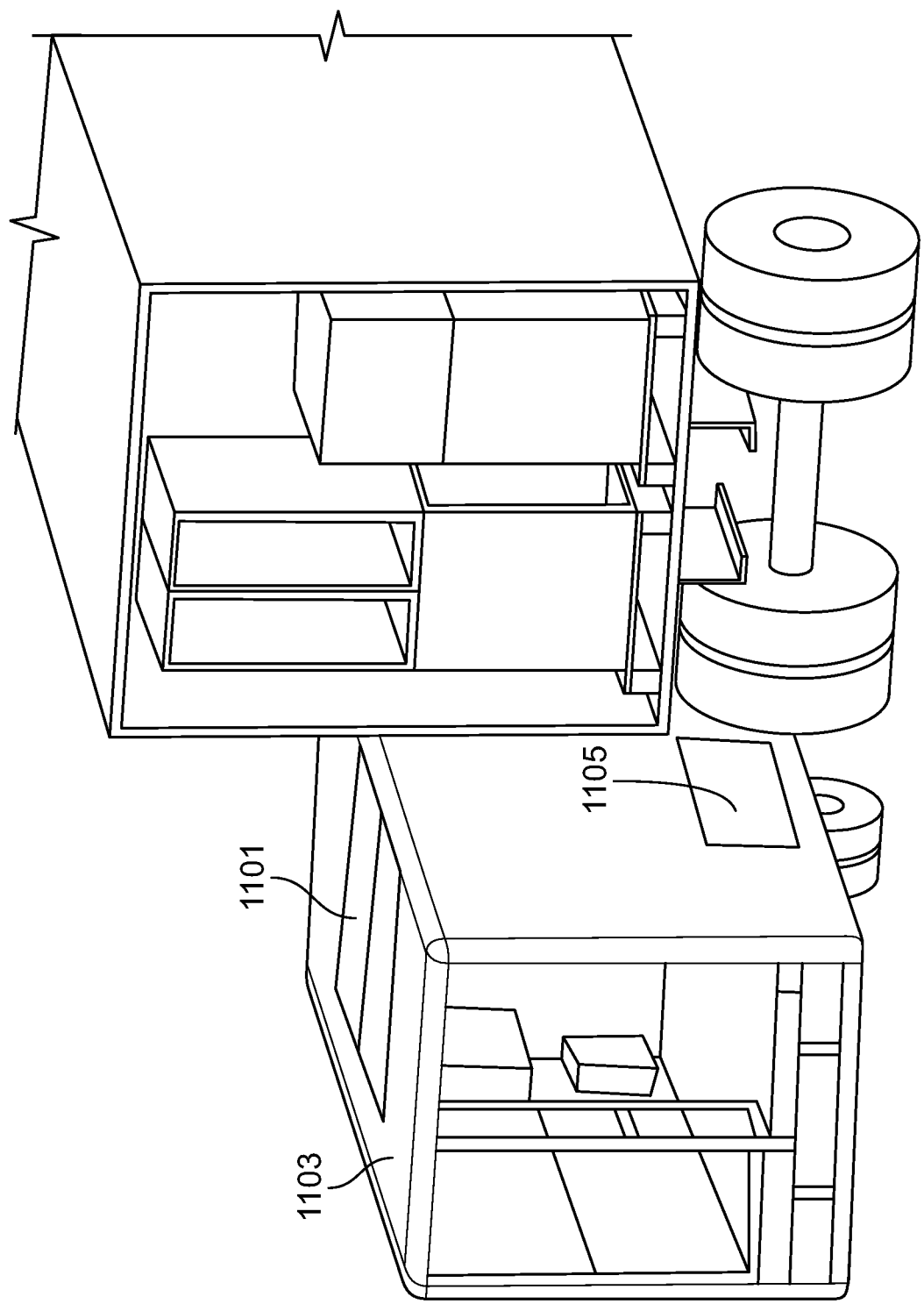
FIG. 9 shows roof and skirt backscatter detectors, stowed in accordance with embodiments of the present specification.
Figure 10:
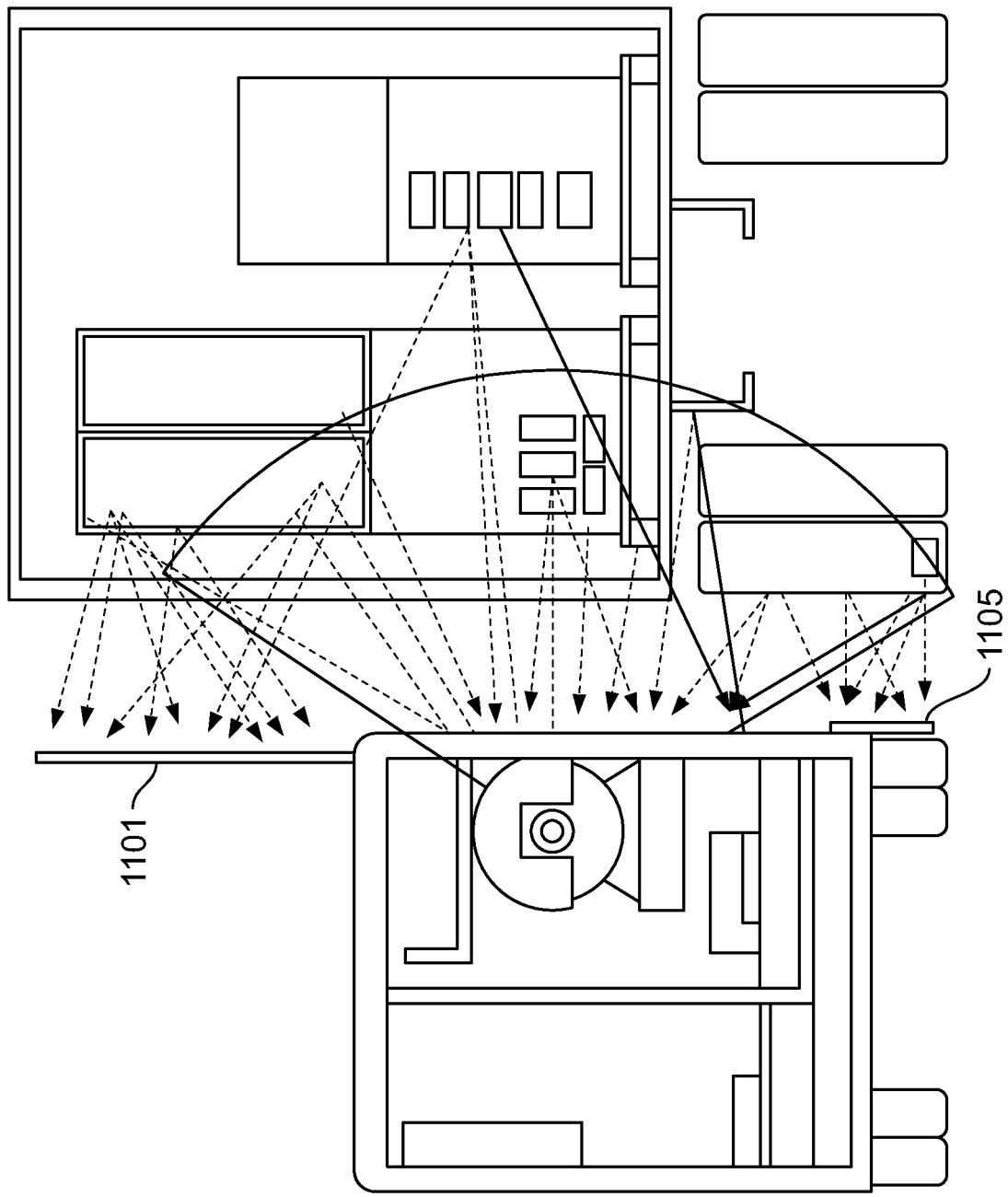
FIG. 10 illustrates the detectors shown in FIG. 9 deployed during the course of inspection operations.
Figure 11:
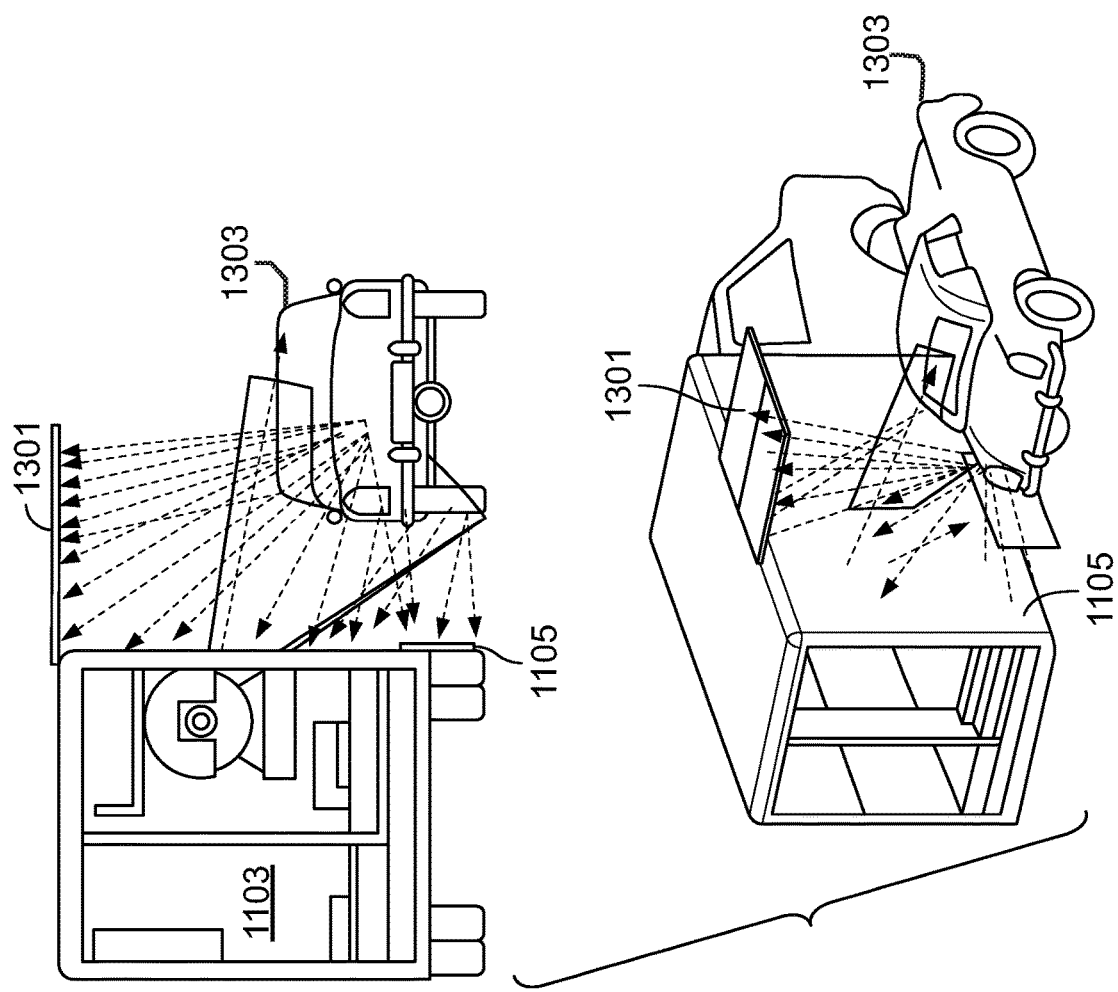
FIG. 11 shows an awning detector and a skirt detector for use with a backscatter inspection system in accordance with embodiments of the present specification.

Referring, now, to FIG. 9, a large-area Sc-WSF awning detector 1101 is shown in a stowed position, stored on the roof of a backscatter inspection van 1103, and a thin skirt detector 1105 is shown in a stowed position above a wheel of the backscatter inspection van. In FIG. 10, both the roof and skirt detectors are shown as deployed to increase the solid angle for detecting higher and lower targets, respectively; the awning detector is deployed above an inspected object during the course of inspection, while the skirt detector is deployed, at least in part, beneath the platform of the conveyance. In another embodiment of the specification, described with reference to FIG. 11, an awning detector 1301 may be deployed for low, close targets, such as for detection of contraband in the trunk or far side of a car 1303. Awning detector 1301 may slide out from a roof of the conveyance prior to inspection operation. FIG. 11 also shows the deployment of Sc-WSF skirt detectors 1105 used to efficiently examine the tires, wheel wells, and the interior of close vehicles.

Scanning pencil beams of X rays not only reveal interior objects by analyzing the backscattered radiation but, in some applications, can obtain additional information by the simultaneous analysis of transmission (TX) and forward scattered (FX) radiation. The TX and FX detectors need not be segmented since the cross-sectional area of the pencil beam, together with the integration time of the signal, defines the pixel size. Moreover, the TX and FX detectors only need to be total energy detectors since, in most applications, the flux of the TX or FX X rays is too high for pulse counting. Scintillation screens are the traditional detectors for such scanning beam applications. Sc-WSF detectors substantially extend the range of applications of present TX and FX scintillation detectors, as the following examples make clear.

Figure 12:
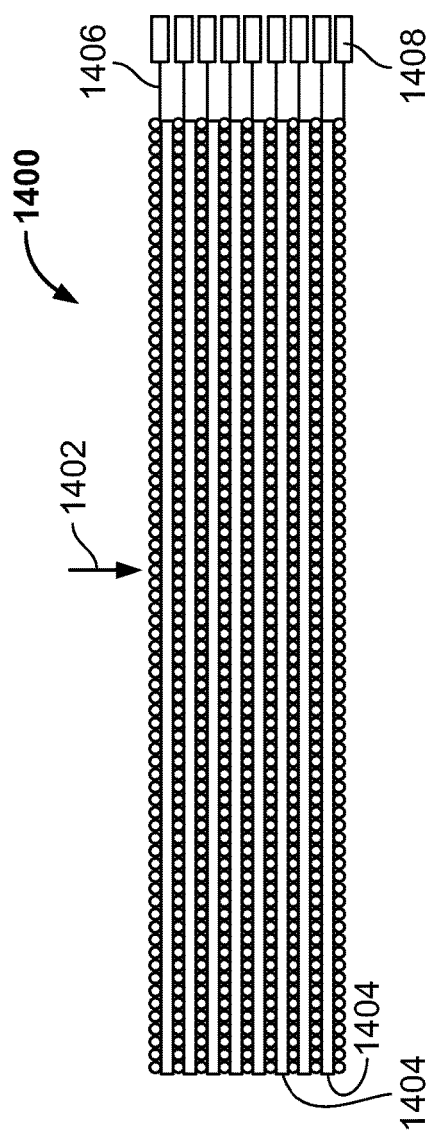
FIG. 12 is a cross-sectional schematic view of a stack of scintillator layers for use as a high-energy X-ray transmission detector, in accordance with an embodiment of the present specification.

TX for X-Ray Beams Up to at Least 250 keV:

The absorption efficiency of traditional scintillation screens, made, for example, of BaFCl(Eu) or Gadox, drops below 50% for X-ray energies above ~80 keV. The 50% point for two layers is about 100 keV. By way of distinction, Sc-WSF detector can be made with more than two layers of scintillators without substantially increasing the profile of the detector. A cost-effective Sc-WSF detector, with 4 layers, can be used for TX with scanning X-ray beams generated by a standard 140 keV X-ray tube. A multi-layer detector such as the 9-layer detector, as shown in FIG. 12, and designated there generally by numeral 1400, can be highly effective for a detecting X rays 1402 emitted by a standard 225 keV X-ray tube (not shown), such as that used in the X-ray inspection of vehicles through portals. Layers 1404 of scintillator material are shown, and WSF fibers 1406 coupled to photo-detectors 1408.

Figure 13A:
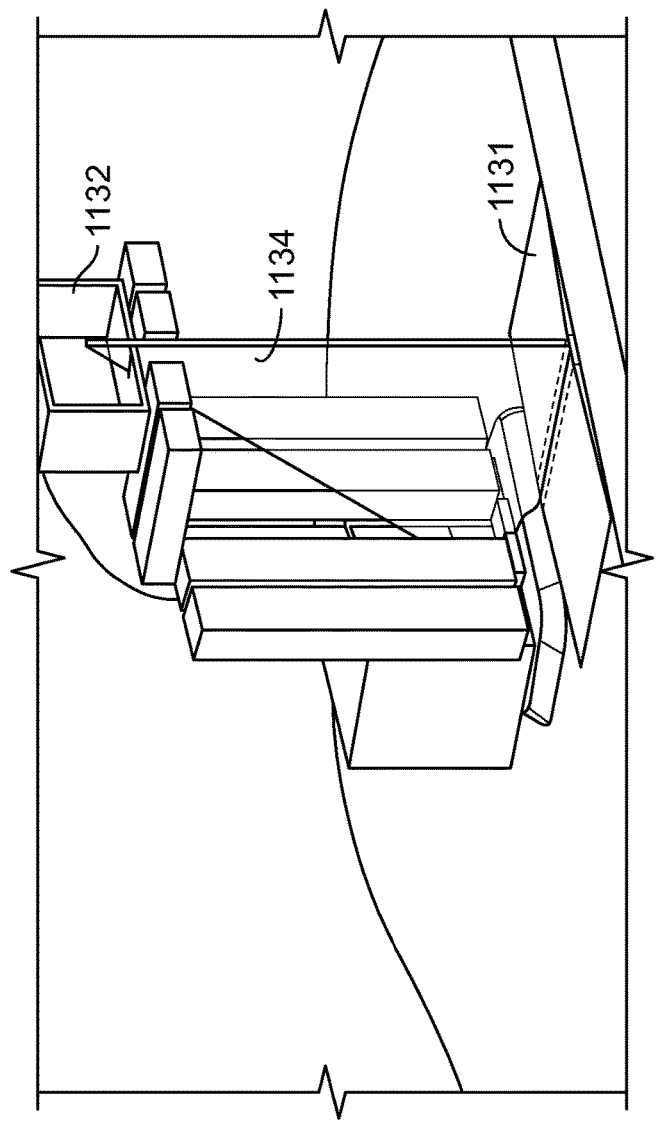
FIG. 13A shows a layered transmission detector inside a 2-inch-high speed bump, in accordance with an embodiment of the present specification.
Figure 13B:
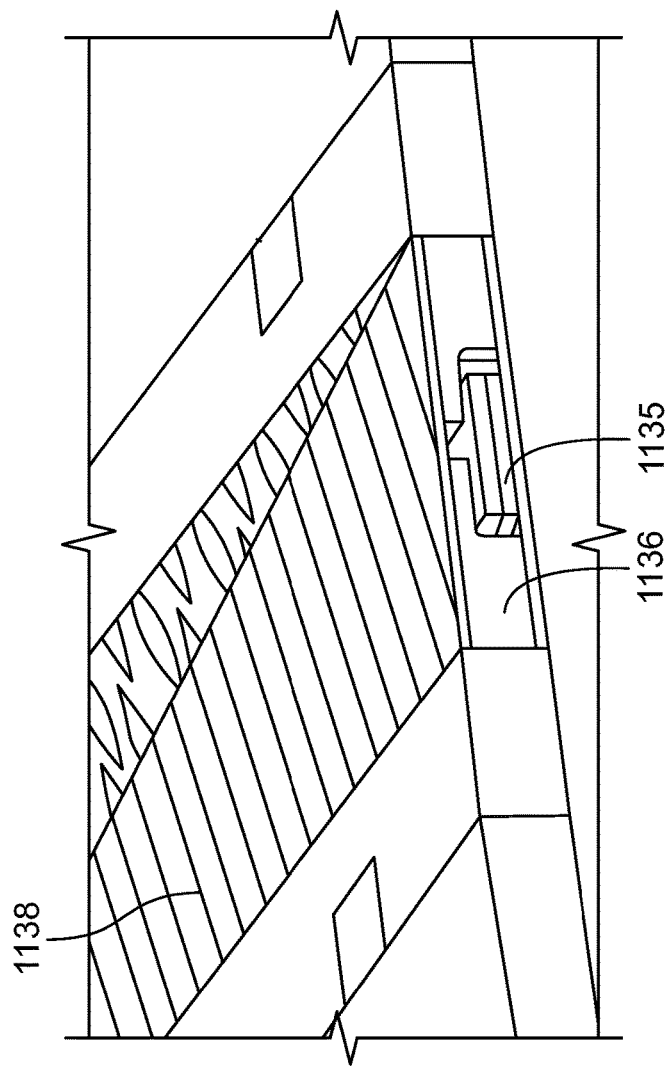
FIG. 13B shows a layered transmission detector inside a 2-inch-high speed bump, in accordance with an embodiment of the present specification.
Figure 13C:
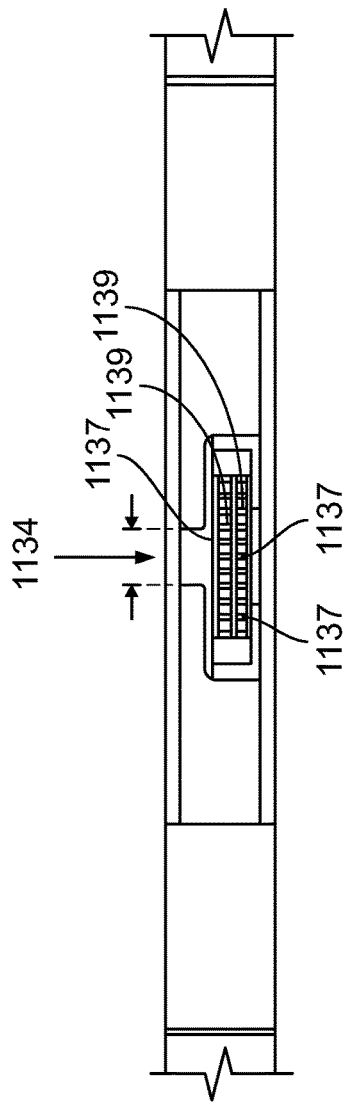
FIG. 13C shows a cross-section of the detector assembly shown in FIGS. 13A and 13B inserted into the speed bump frame.

Transportable TX Detector for a Top-Down Imager in Three-Sided Portal Inspection:

The thin profile of the multi-layer transmission (TX) detector makes practical a top-of-the-road transmission (TX) detector. FIGS. 13A and 13B show such a detector inside a 2-inch-high speed bump 1131 strong enough to support a fully-loaded tractor trailer, and requiring no excavation of the ground for deployment. Source 1132 of penetrating radiation emits fan beam 1134 incident upon a linear detector assembly 1135 within frame 1136 of speed bump 1131 or a similar protrusion above an underlying surface. Detector assembly 1135 includes segments of scintillator material 1137 separated by vanes 1138 of high atomic number. As described above, for example with reference to FIG. 4, scintillation light is coupled to photo-detectors by means of wave-length shifting optical fibers 1139.

Figures 14A, 14B, 14C:
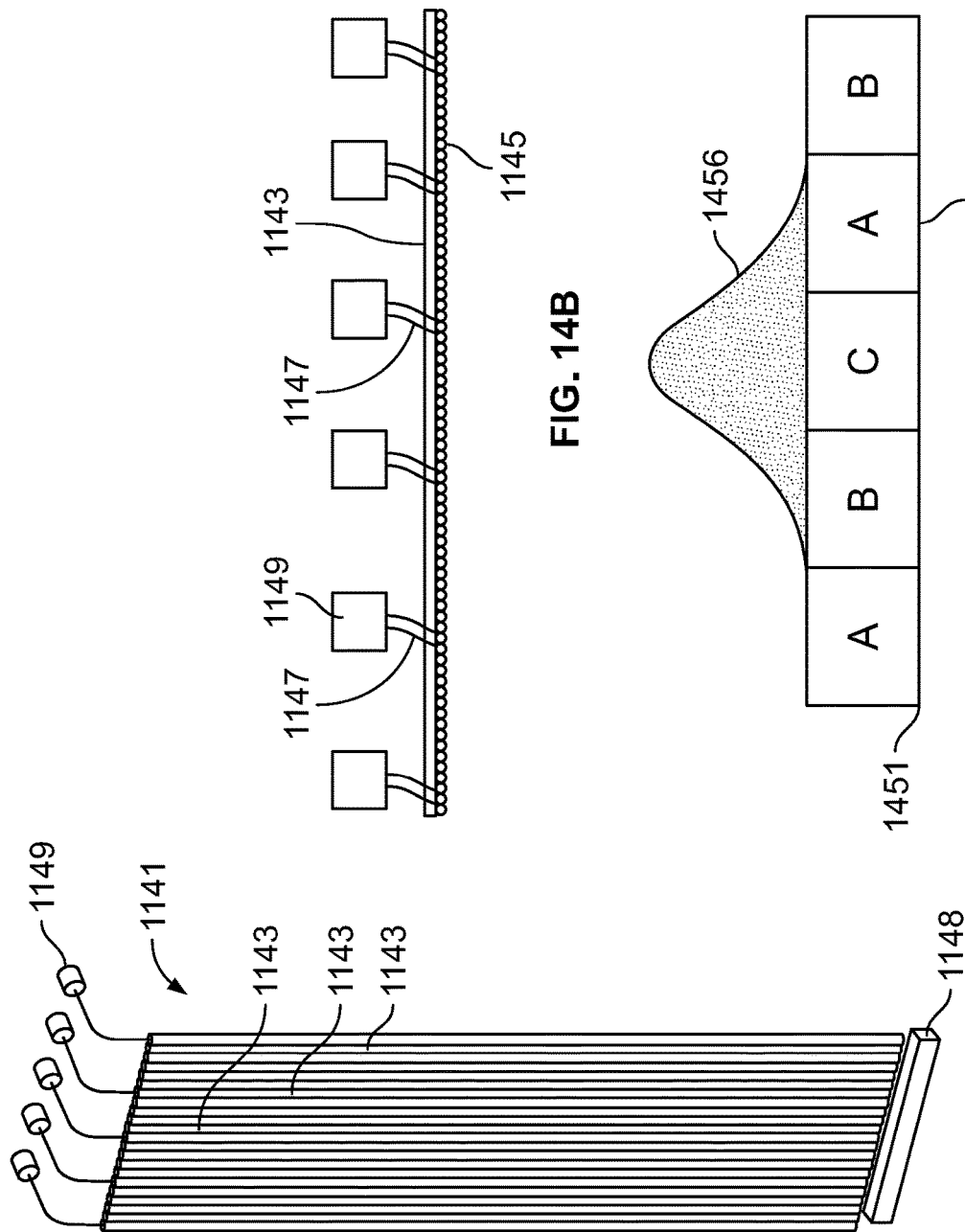
FIG. 14A shows a perspective view of a segmented X-ray transmission detector for measurement of the distribution of detected intensity across the width of an X-ray beam, in accordance with an embodiment of the present specification.
FIG. 14B shows an end-on cross-section and a typical beam profile of the detector of FIG. 14A.
FIG. 14C shows an end-on cross-section and a typical beam profile of the detector of FIG. 14A.

Segmented TX Detector for Determining the Scan Beam Intensity Profile:

Referring now to FIGS. 14A and 14B, a segmented transmission detector, designated generally by numeral 1141, is shown for measuring a scan beam intensity profile of incident X rays 1143. Alignment of the Sc-WSF detector 1141 (used in transmission) with the plane of a scanning pencil beam presents a significant challenge when the TX detector is deployed for a mobile security system. FIG. 14B shows a cross section of a vertical Sc-WSF detector 1141 (otherwise referred to herein, when appropriate, as a "transmission detector" or "TX detector") with independent read-out of the fibers 1145 of the WSFs, provides the means to simultaneously measure both the transmitted intensity of each pixel and the linear distribution across the beam width to determine its centroid position. Fibers 1145 are routed in bundles 1147 to individual photo-detectors 1149 such as PMTs. The distribution of the intensity can extend out to obtain the forward scattered intensity, which contains useful information as to the scattering material, and gives a measure of the in-scattered radiation that is being counted as Transmission intensity.

The relative position of the detector plane and the plane of scanning X rays can be controlled automatically. The detector for this concept is shown schematically in FIG. 14A. A reflecting surface 1148 may be provided at an end of detector 1141 distal to photo-detectors 1149.

With a single data channel for a transmission signal, the spatial resolution along the traffic direction (transverse to a fan-shaped illuminating X-ray beam) is determined by the smaller of the following two dimensions: the width of the sensitive detector area or the beam size across the TX detector. (For heuristic purposes, the case of undersampling is not considered in this description.) Spatial resolution may be improved, however, by narrowing the sensitive detector area, as now described with reference to FIG. 14C. In accordance with embodiments of the present specification, the spatial resolution across the direction of traffic (along the detector line) is enhanced by employing multiple detectors of a detector array 1450 associated with a plurality of channels (A, B, C, in FIG. 14C) and interlacing their sensitive areas. The pitch of the interlace pattern depends on the beam width along the detector. Ideally the pitch (i.e., the spacing between two detectors 1451 and 1454 associated with a single channel "A") has to be large enough so that two detector segments of the same detection channel do not receive direct radiation from the beam at the same time. The beam intensity profile is depicted by numeral 1456. For practical purposes the requirement is not as stringent, since some amount of crosstalk between pixels is acceptable. The multiple, resulting images need to be interlaced, employing any method, including methods well-known in the art, to create one higher-resolution image. It should be noted that improvement of the spatial resolution at the detector comes at the expense of flux and is, thus, limited by signal-to-noise considerations.

Another configuration within the scope of the present specification include a combination of the vertical detector 1141 shown in FIG. 14A with horizontal road detector 1135 of FIG. 13B to form an L-shaped detector that is advantageously easily set up and aligned.

In yet another embodiment of the specification, a transmission detector array 1450 (regardless of geometrical orientation, whether vertical, horizontal, L-shaped, etc.) is segmented into a plurality of units; such as B, C and A of FIG. 14C. As shown, the beam profile 1456 is symmetric with respect to B and A so that the ratio of the measured intensities is unity. If, for any reason, the alignment changes, that ratio changes dramatically. If the alignment skews as an illuminating X-ray pencil beam scans up and down, the change in the ratio of B/A measures the both the skewness and the lateral shift. Collected data can then be corrected for such a shift on a line-by-line basis.

Dual-Energy and Multi-Energy TX Detectors for Material Identification:

Separating the signals from front and back layers of scintillators allows the front layer to give a measure of the low-energy component of each pixel while the back layer gives a measure of the high-energy components. Putting a layer of absorbing material between the front and back scintillators is a standard way to enhance the difference between low and high energy components, and that is easily done with a Sc-WSF detector.

The Sc-WSF detector makes practical a dual-energy detector consisting of a layer of Sc-WSF, such as BaFCl-WSF, on top of a plastic scintillator detector; the BaFCl is sensitive to the low-energy X rays and not the high-energy X rays, while the plastic detector is sensitive to the high-energy X rays and very insensitive to low energy X rays.

An alternative and potentially more effective material discriminator can be made by using more than two independent layers of Sc-WSF, with separate readouts for each layer. A passive absorber, such as an appropriate thickness of copper, can be inserted after the top Sc-WSF to enhance dual energy application, as is practiced with segmented detectors. Alternatively, the middle scintillator can be used as an active absorbing layer. The measurement of three independent parameters allows one to get a measure of both the average atomic number of the traversed materials and the extent of beam hardening as well. The Sc-WSF can be further extended to obtain more than three energy values for each pixel, the limit being the statistical uncertainties, which increase with the number of components. Detector 1400 shown in FIG. 12 is an extreme example of such a detector.

An important application of Dual-Energy TX is for X-ray personnel scanners at airport terminals. Providing TX images simultaneously with BX has proved useful for inspection. Adding dual-energy to the TX images has hitherto been impractical primarily because of size constraints imposed by conventional detectors. Sc-WSF eliminates those constraints and promises to significantly improve performance, since multiple detectors, with distinct energy sensitivities, may be stacked, as shown in FIG. 15, where a dual- (or multi-) energy detector 1500 includes an Sc-WSF detector 1508, sensitive to a lower energy component of incident X rays, positioned in front of a slab of plastic scintillator 1502, which is sensitive to the higher energy X rays. Sc-WSF detector 1508 contains a scintillator 1504 read out by two layers of WS fibers 1506.

Compact Radiation Detector for Gamma and Neutron Radiation:

The Sc-WSF method makes practical a small, lightweight, inexpensive, monitor of neutrons and gamma rays 1601. BaFCl(Eu)-WSF is quite sensitive to gamma radiation while being insensitive to neutrons, while Li6F:ZnS(Ag)-WSF is insensitive to gamma rays and quite sensitive to detecting thermal neutrons. FIG. 16 shows a multi-layer "Dagwood" sandwich consisting of one or more layers 1602 of BaFCl (Eu), read out by a single photo-detector (not shown) via optical fibers 1604, and one or more layers 1606 of Li6F: ZnS(Ag)-WSF, read out by a second, independent, photo-detector (not shown), with the active elements occupying a thickness of no more than one or two centimeters. An appropriate layer of neutron moderator 1612, such as polyethylene, may be placed on either side of the Li6F:ZnS(Ag)-WSF to enhance the efficiency for detecting neutrons. Optically reflective foil 1608, such as aluminum foil, confines scintillation to respective detector regions.

Figure 17:
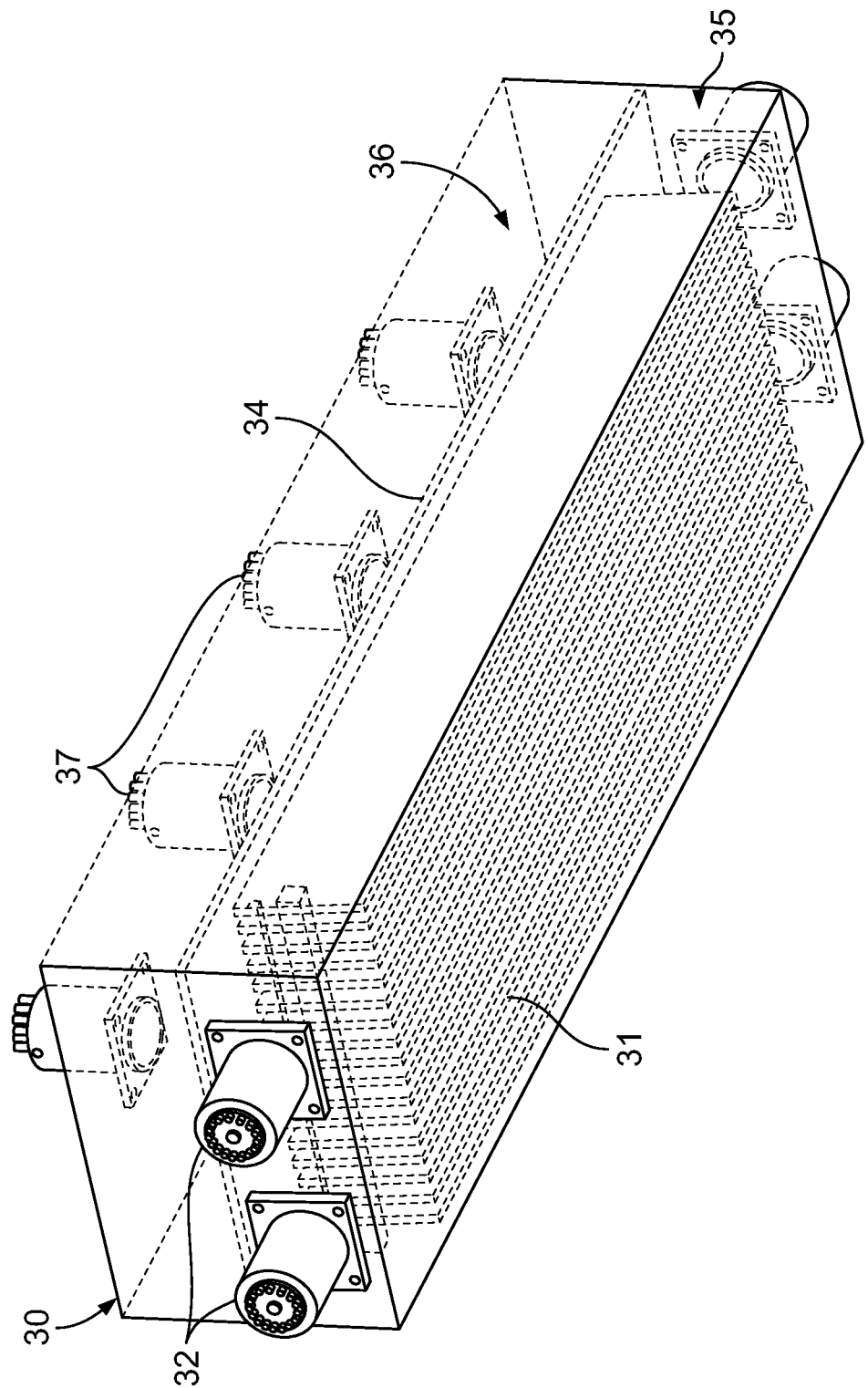
FIG. 17 shows a perspective view of a detector with active collimators.

U.S. patent application Ser. No. 13/163,854 (to Rothschild), entitled "Detector with Active Collimators," and incorporated herein by reference, describes a backscatter detector module 30 that increases the depth of inspection by distinguishing scatter from the near and far field of inspected objects, as depicted in FIG. 17. The angle of a set of active collimating vanes 31 may either be adjusted once at the factory, or may be attached to any kind of electro-mechanical device provided to dynamically adjust them, depending on the type and/or distance of the object being scanned. The scintillation light from the collimating vanes is detected by one or more photo-detectors (for example, by PMTs 32 located at the top and bottom of the front compartment of the detector). A rear compartment 36 of the detector is optically isolated from a front compartment 35 by a light baffle 34, and scintillation light from X rays detected in rear compartment 36 are collected by a second set of one or more photo-detectors (for example, PMTs 37 mounted on the rear face of the detector. The rear compartment may be lined with scintillating phosphor screen, for example, or, in other embodiments of the specification, may contain plastic or liquid scintillator.

A useful addition to a standard backscatter unit would be a "venetian blind" collimator made of scintillator. The slats intercept radiation that does not enter directly through the gaps between the slats so that the box detectors preferentially detect deeper interior objects. The active collimators record the rejected radiation. The light from the active collimators is detected by PMTs, whose collection efficiency decreases rapidly as the gap between collimators decrease. Replacing the PMTs and scintillator vanes with vanes consisting of Sc-WSF detectors solves major shortcomings and makes venetian-blind collimators practical. First, light collection is independent of the gap width between vanes. Second, the active area of the PMTs or silicon photomultipliers used to collect the light from the active collimators is generally much smaller than the active area of needed PMTs, so that the cost of the photo-detectors is less. Third, the placement of the photo-detector at the end of the WSF bundles is not critical to the efficiency of the light collection. Fourth, the signals from the WSFs from each slat can be processed independently, giving considerable scope for maximizing the information about the interior of the inspected object. Fifth, the light from the thin scintillator screens on the front and back of each vane can be collected by independent WSFs, which can significantly improve the depth discrimination.

Figure 18D:
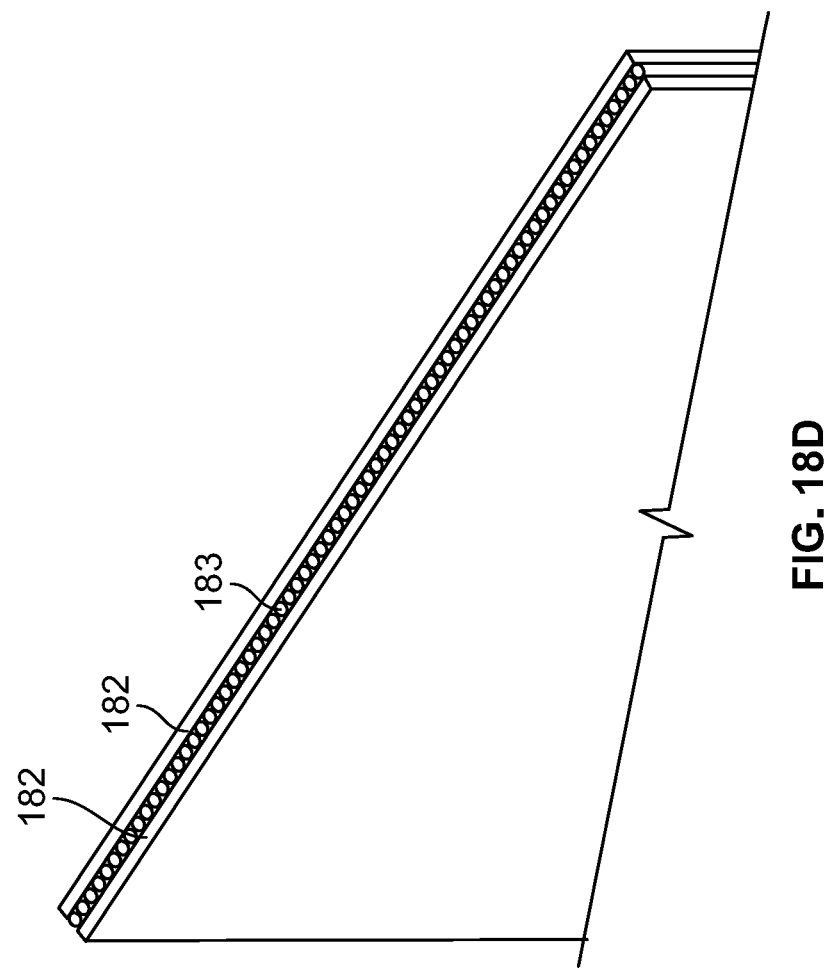
FIG. 18D shows an arrangement with independent read-out separated by a light-tight X-ray absorber to distinguish radiation striking each face, in accordance with a further embodiment of the present specification.
Figure 18C:
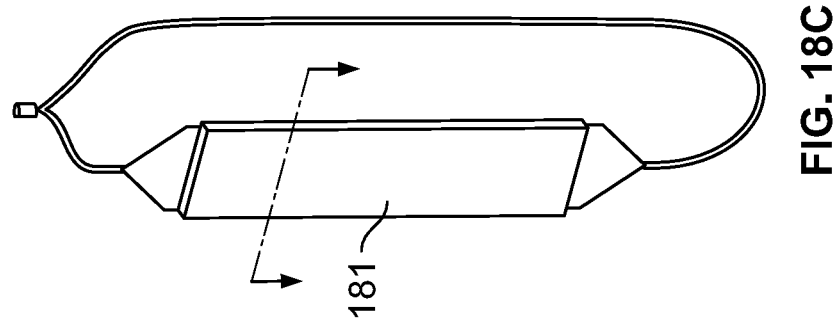
FIG. 18C shows an arrangement with independent read-out separated by a light-tight X-ray absorber to distinguish radiation striking each face, in accordance with a further embodiment of the present specification.

FIGS. 18C and 18D depict (in perspective and in cross section, respectively) an active WSF collimated detector 181 sensitive to X rays impinging from either side of the scintillator. Scintillation light from both scintillator regions 182 is coupled to photo-detectors via waveshifting optical fibers 183. FIGS. 18A and 18B show (in perspective and in cross section, respectively) an active WSF collimated detector 185 with independent readouts 187 separated by a light-tight X-ray absorber 189 to distinguish radiation striking each face. For example, each collimated detector 185 may consist, in one embodiment, of two layers of Sc-WSF detectors 182, each containing an areal density of 60 mg BaFCl:Eu per cm2. The light-tight X-ray absorber 189 may consist of a thin layer of tin, which also provides structural support.

Detectors for Mini-Backscatter Inspection Systems:

The thinness of Sc-WSF detectors provides a unique potential for applications in which low weight and power are drivers. Referring to FIGS. 19A and 19B, a hand-held imaging system 193 is an example of such an application. The power requirements, inspection time, and, quality of the image, are all affected by the solid angle of detection. A traditional detector with, for example, a cross-section of 10 cm×10 cm (100 cm2), weighs about a half a kilogram. A 10-cm cube of Sc-WSF, weighing no more than twice as much, can be made of individual Sc-WSF 10 cm×10 cm detectors, each less than 5 mm thick, that can be unfolded to present a backscatter detection area of at least 2,000 cm2, a twenty-fold increase in this example. The additional detection coverage can make an order of magnitude improvement in the hand-held system's performance.

The thin profile of Sc-WSF detectors described herein provide for fitting contoured detectors into tight spaces. For example, detectors may be adapted for personnel scanners constrained to fit into constricted airport inspection spaces.

FIGS. 19A and 19B show an example in which four detectors 191 fold or slide out of hand-held scanner 193 to substantially increase the detection efficiency, especially for items concealed deeper in the object being inspected. Backscatter detectors 195 straddle irradiating beam 197;

Back-Scatter Inspection of the Underside of Stationary Vehicles:

The inspection of the underside of vehicles by a portable X-ray backscattering system presents special problems. The road clearance of cars is not more than 8" and can be as little as 6". Fixed inspection systems, such as portals, can place a detector in the ground, or, as described above, can be placed on the ground using Sc-WSF. Mobile under-vehicle inspection systems, however, which are needed for security in many areas, have never been developed. Inspectors rely on passive inspection tools such as mirrors and cameras, which miss contraband in the gas tank or are camouflaged to appear innocuous.

Figure 20A:
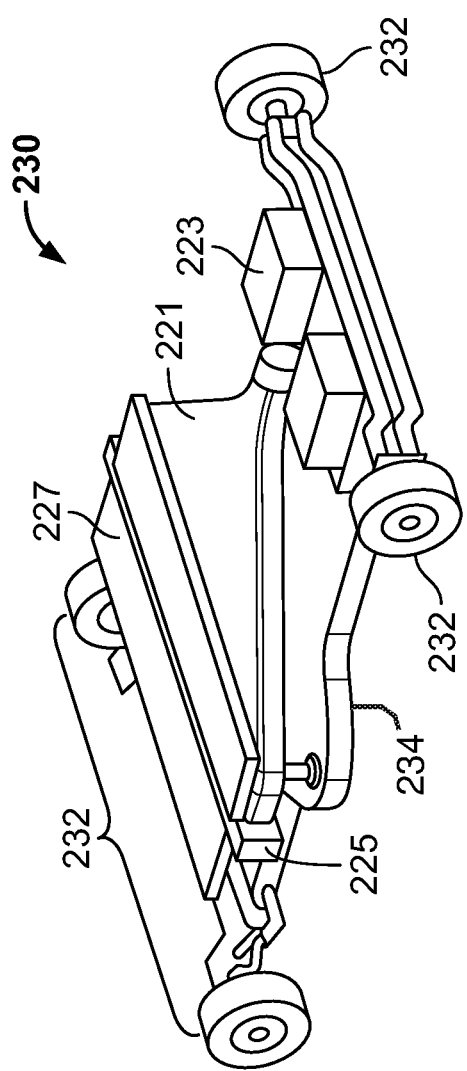
FIG. 20A shows a backscatter unit that, by virtue of Sc-WSF detectors in accordance with the present specification, may be slid under a vehicle for under-chassis inspection.
Figure 20B:
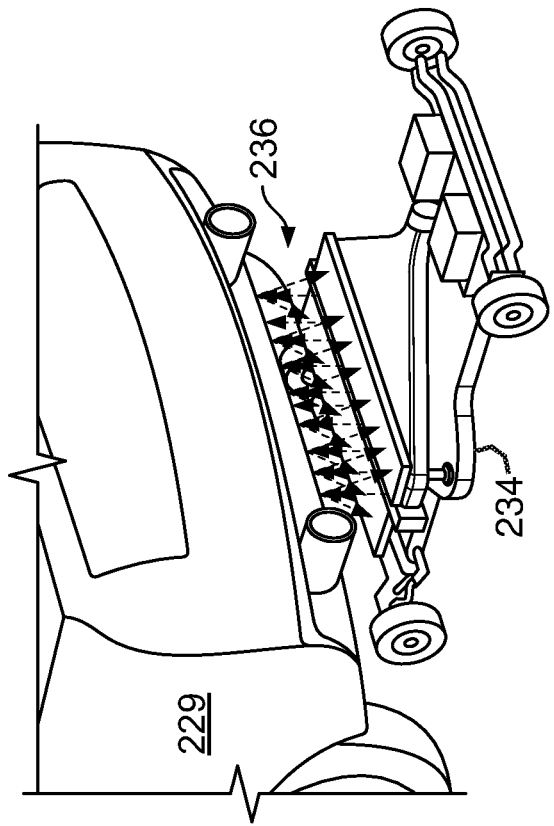
FIG. 20B shows a backscatter unit that, by virtue of Sc-WSF detectors in accordance with the present specification, may be slid under a vehicle for under-chassis inspection.

The Sc-WSF detectors make practical an X-ray backscatter system that is not more than 6" high. A sketch of a practical system is now described with reference to FIGS. 20A and 20B. The X-ray source consists of an electromagnetic scanner 221 of an electron beam across an anode. Electromagnetic scanner 221 is driven by electronics module 223. The X rays are collimated by a linear array of apertures 225 that span, for example, 30" of the underside in one pass. The Sc-WSF detectors 227 are mounted on each side of the X-ray tube so as detect X rays 236 backscattered from vehicle 229. Power supplies, pulse and image processors can be mounted appropriately. Chassis 234 of inspection unit 230 on wheels 232 may be adapted to be maneuvered under vehicle 229 by motor or manual control.

Figure 21A:
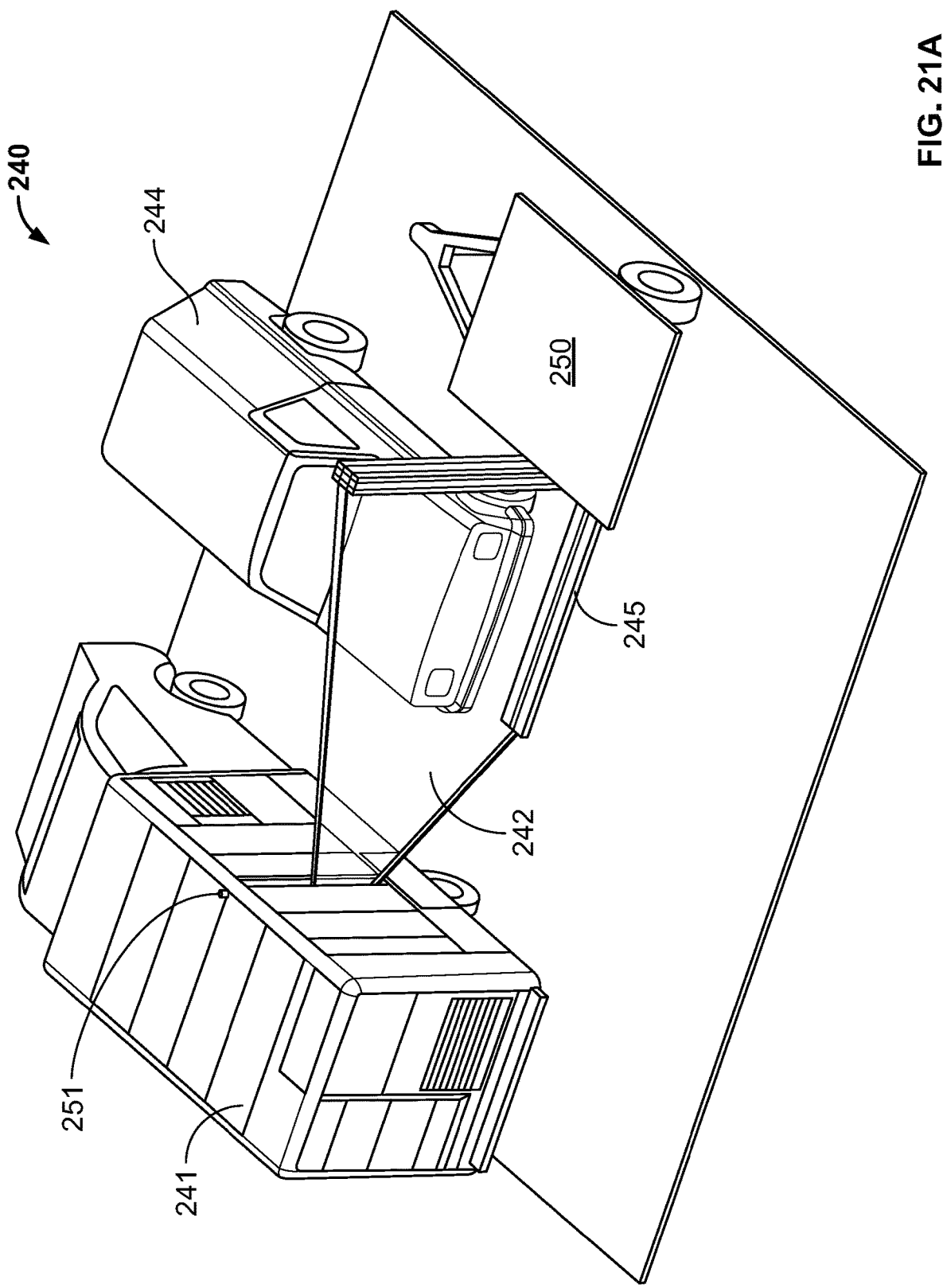
FIG. 21A depicts the use of a right-angled combination of detectors based on Sc-WSF technology in conjunction with a mobile inspection system and in accordance with an embodiment of the present specification.
Figure 21B:
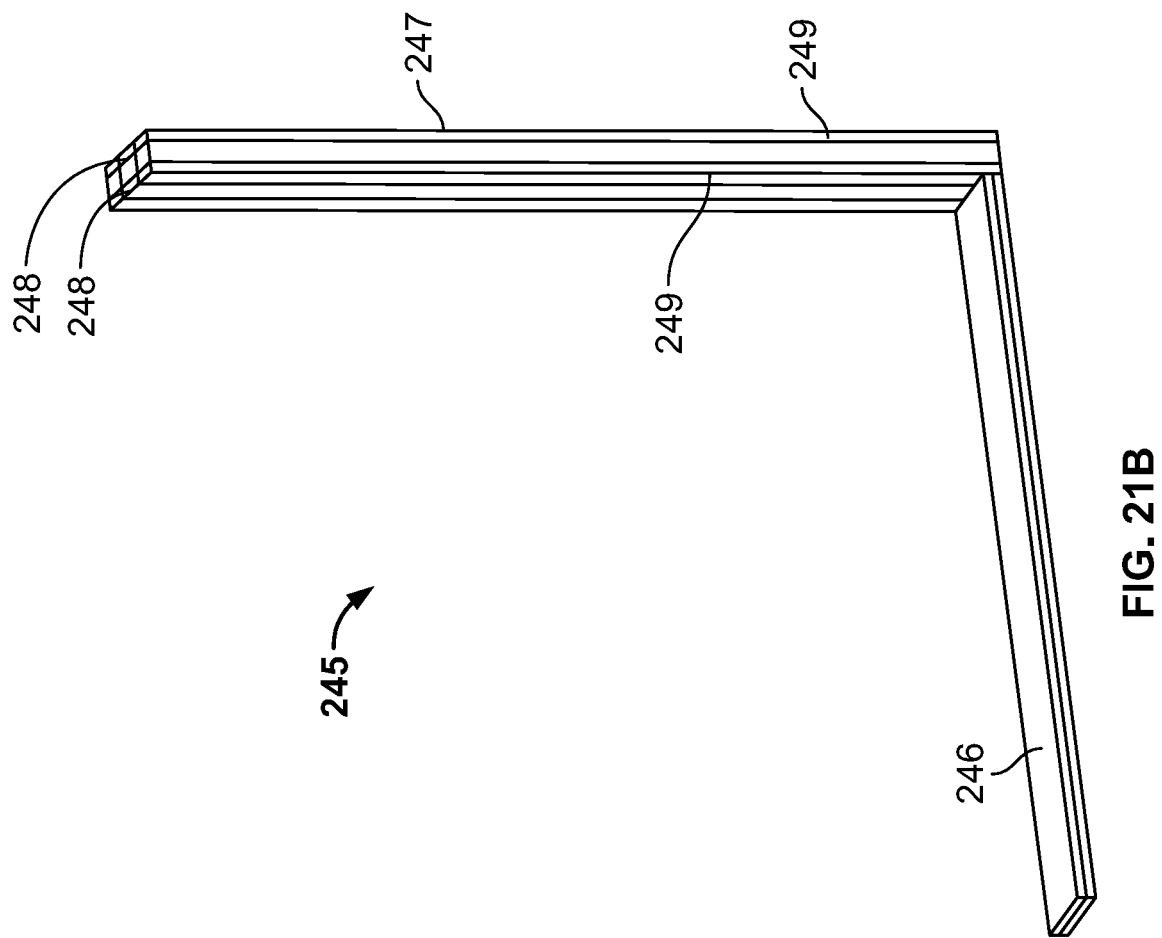
FIG. 21B depicts the use of a right-angled combination of detectors based on Sc-WSF technology in conjunction with a mobile inspection system and in accordance with an embodiment of the present specification.

Mobile Transmission Inspection with L-Shaped Detector Array Segments:

In accordance with another aspect of the present specification, a mobile inspection system, designated generally by numeral 240, is now described with reference to FIGS. 21A and 21B. A source of penetrating radiation (not shown, and described, herein, without limitation, in terms of X rays) is conveyed within a mobile inspection unit 241, which, typically, is capable of motion under its own power, although it may also be towed or otherwise transported, within the scope of the present specification. A beam 242 of penetrating radiation is emitted from mobile inspection unit 241, either as a swept pencil beam or as a fan beam, in either case emitted in the plane designated as representing beam 242 in FIG. 21A. Inspected object 244, which may be a vehicle as shown, or otherwise (such as hauled cargo), traverses beam 242 during the course of inspection, and, in the course of traversal, passes over an integral L-shaped detector unit 245, as now further described. Detector unit 245 has a horizontal segment 246 and an upright segment 247, as indicated in FIG. 21B.

Each of the horizontal and upright segments 246 and 247 of L-shaped detector unit 245 may be comprised of multiple parallel layers 249, providing for dual- or, more generally, multiple-, energy resolution of detected X rays, so as to provide material identification, as described above with reference to FIG. 12. Additionally, upright detector array segment 247 may have multiple detector segments 248 in a direction transverse to the direction of beam 242 and substantially along the direction of relative motion between inspected object 244 and beam 242 so as to provide an indication of skewness or lateral shift of the detectors with respect to the beam, as described above with reference to FIGS. 14A-14C. Integral L-shaped detector unit 245 may be conveyed to a site of inspection aboard mobile inspection unit 241 or on a towed, or otherwise accompanying, trailer 250, and may be assembled, in part, upon deployment at the inspection site. Supplemental alignment aids, such as alignment laser 251, may be employed in establishing proper position and orientation of detector unit 245 relative to mobile inspection unit 241 and beam 242.

Enhanced Resolution WSF Detectors:

In an embodiment, the present specification provides a system and method for enhancing the resolution of WSF detectors employed in an X-ray imaging system, and particularly in a flying spot X-ray imaging system. In an embodiment, an enhanced resolution WSF detector comprises at least a high resolution detection layer for detecting the intensities of incident radiation and a low resolution layer for detecting location of incidence radiation; thereby providing enhanced radiation detection.

In an embodiment, the enhanced resolution WSF detector of the present specification increases spatial sensitivity for X-ray detectors in an X-ray imaging system through the use of multiplexed WSF coupled to a multi-anode PMT. In an embodiment, the detector comprises multiple layers of WSF in order to determine both the high resolution content of the image by detecting the intensity captured by individual fibers, as well as low resolution mapping in order to determine a coarse location of the focal spot. In this way, a high resolution image is generated with a minimum of data individual channels, thus saving cost and complexity of the system.

Figure 22A:
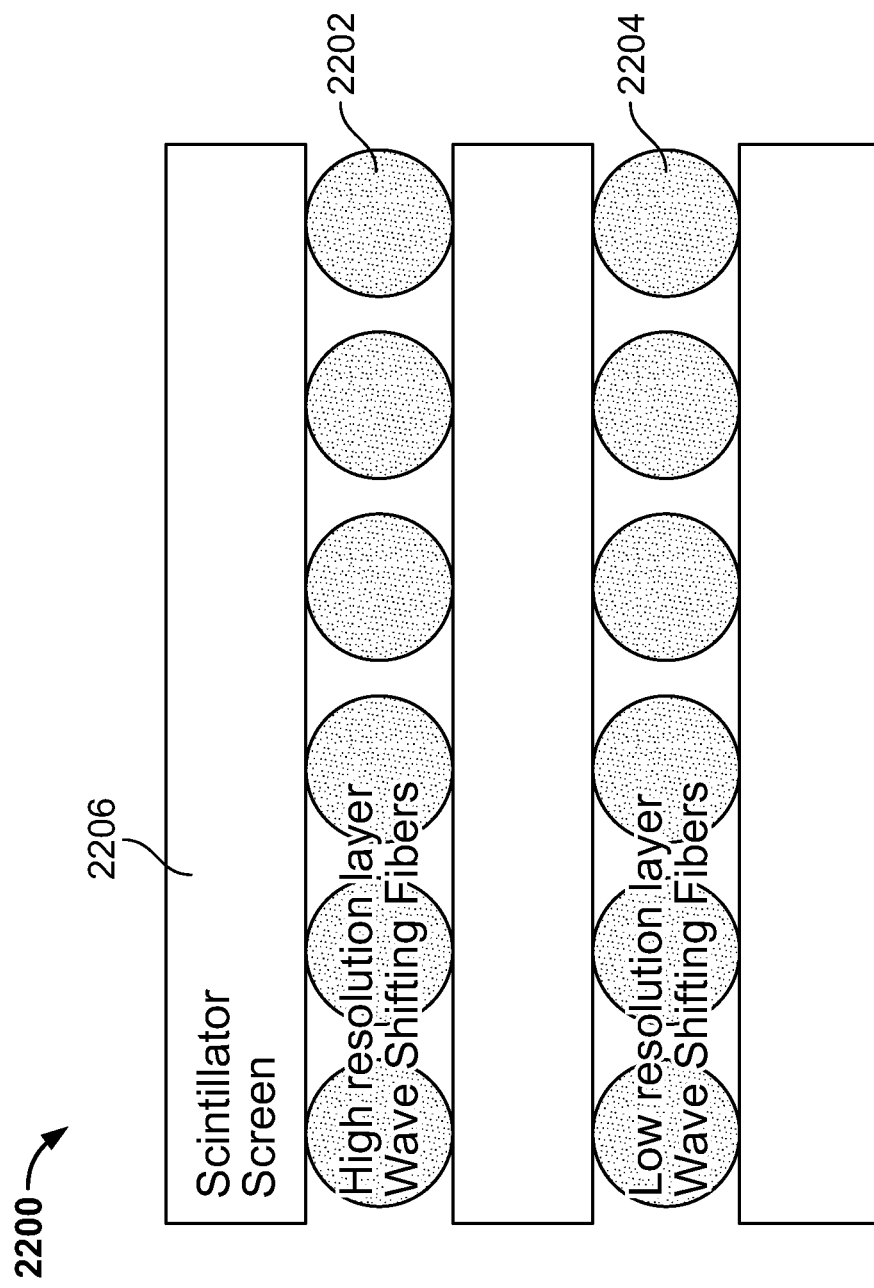
FIG. 22A illustrates a WSF detector with enhanced resolution, in accordance with an embodiment of the present specification.

FIG. 22A illustrates a WSF detector with enhanced resolution, in accordance with an embodiment of the present specification. In an embodiment, as shown in the figure, detector 2200 comprises a high resolution layer 2202 and low resolution layer 2204. In an embodiment, the high resolution layer 2202 has a width equal to the fiber width ranging from 0.25 mm to 2 mm and more specifically 1 mm. In an embodiment, the high resolution layer 2204 has a width equal to the maximum size of a flying spot X-ray beam used in conjunction with the detector, which in embodiments is less than 10 mm.

The low resolution layer 2204 comprises a plurality of parallel positioned fibers that are bundled from each of the low resolution regions of the detector 2200. In an embodiment, a position of an illumination beam spot i.e. the spatial resolution of the detector 2200 is determined by the signal detected in the low resolution layer 2204 of the detector. The signal intensity from the high resolution channels is subsequently placed in a correct spatial location using the information from the low resolution layer. In embodiments, the maximum intensity of the low resolution layer 2204 is used to identify the location of the flying spot X-ray beam on the detector.

Light absorbed in the high resolution fiber layer 2202 spreads, which degrades the spatial resolution of the WSF detector 2200. The spreading of light can be improved by utilizing a thin scintillator material 2206 as well as thin film deposited columnar materials which limit light scatter, coupled with the high resolution layer 2202, as shown in FIG. 22A. In an embodiment, Cesium Iodide is deposited as a thin film for limiting light scatter.

The spatial resolution of the detector 2200 is limited by the fiber diameter and spacing in the direction perpendicular to the fibers in the high resolution layer 2204. The spatial resolution in the orthogonal direction is limited by an illumination width of an incident fan beam of X rays. The fan beam width can be improved by using an X-ray source with a small focal spot size, and by using a narrow fan-beam collimator.

Hence, the spatial resolution of the WSF detector is determined by the fiber geometry of the high resolution layer, including spacing, shape and diameter of the fibers. In various embodiments, plastic wave-shifting optical fibers are made with diameters as low as 200 micro meters. By offsetting the fibers, the one dimensional spacing can further be reduced below 200 micro meters. In various embodiments, the high resolution layer comprises fibers having a diameter no greater than about 1 mm with no spacing between said adjacent fibers. Thus, in embodiments, the adjacent fibers are in physical contact with one another.

In some embodiments of the present specification, detectors for an X-ray imaging system comprise: a scintillation screen defining a detection region; at least one high resolution layer, optically coupled to the scintillation screen, comprising a first plurality of wavelength-shifting optical fibers wherein each of the first plurality of wavelength-shifting optical fibers is defined by a first fiber radius and a first spacing between adjacent ones of the first plurality of wavelength-shifting optical fibers, wherein each of the first plurality of wavelength-shifting optical fibers extends through the detection region and under the scintillation screen, and wherein the first plurality of wavelength-shifting optical fibers is configured to receive radiation and generate signals; at least one low resolution layer comprising a second plurality of wavelength-shifting optical fibers wherein each of the second plurality of wavelength-shifting optical fibers is defined by a second fiber radius and a second spacing between adjacent ones of the second plurality of wavelength-shifting optical fibers, and wherein at least one of the second fiber radius is larger than the first fiber radius or the second spacing is greater than the first spacing, and wherein the second plurality of wavelength-shifting optical fibers is configured to receive the radiation that passes through the at least one high resolution layer and generate signals; and a segmented multi-channel photomultiplier tube configured to receive signals obtained from the at least one low resolution layer and to receive signals obtained from the at least one high resolution layer.

In some embodiments of the present specification, detectors for an X-ray imaging system comprise: at least one high resolution layer comprising a first plurality of wavelength-shifting optical fibers wherein each of the first plurality of wavelength-shifting optical fibers is defined by a first fiber radius and a first spacing between adjacent ones of the first plurality of wavelength-shifting optical fibers, wherein each of the first plurality of wavelength-shifting optical fibers extends through the detection region and under the scintillation screen, and wherein the first plurality of wavelength-shifting optical fibers is coated with scintillation material and is configured to receive radiation and generate signals; at least one low resolution layer comprising a second plurality of wavelength-shifting optical fibers wherein each of the second plurality of wavelength-shifting optical fibers is defined by a second fiber radius and a second spacing between adjacent ones of the second plurality of wavelength-shifting optical fibers, and wherein at least one of the second fiber radius is larger than the first fiber radius or the second spacing is greater than the first spacing, and wherein the second plurality of wavelength-shifting optical fibers is coated with scintillation material and is configured to receive the radiation that passes through the at least one high resolution layer and generate signals; and a segmented multi-channel photomultiplier tube configured to receive signals obtained from the at least one low resolution layer and to receive signals obtained from the at least one high resolution layer.

Figure 22B:
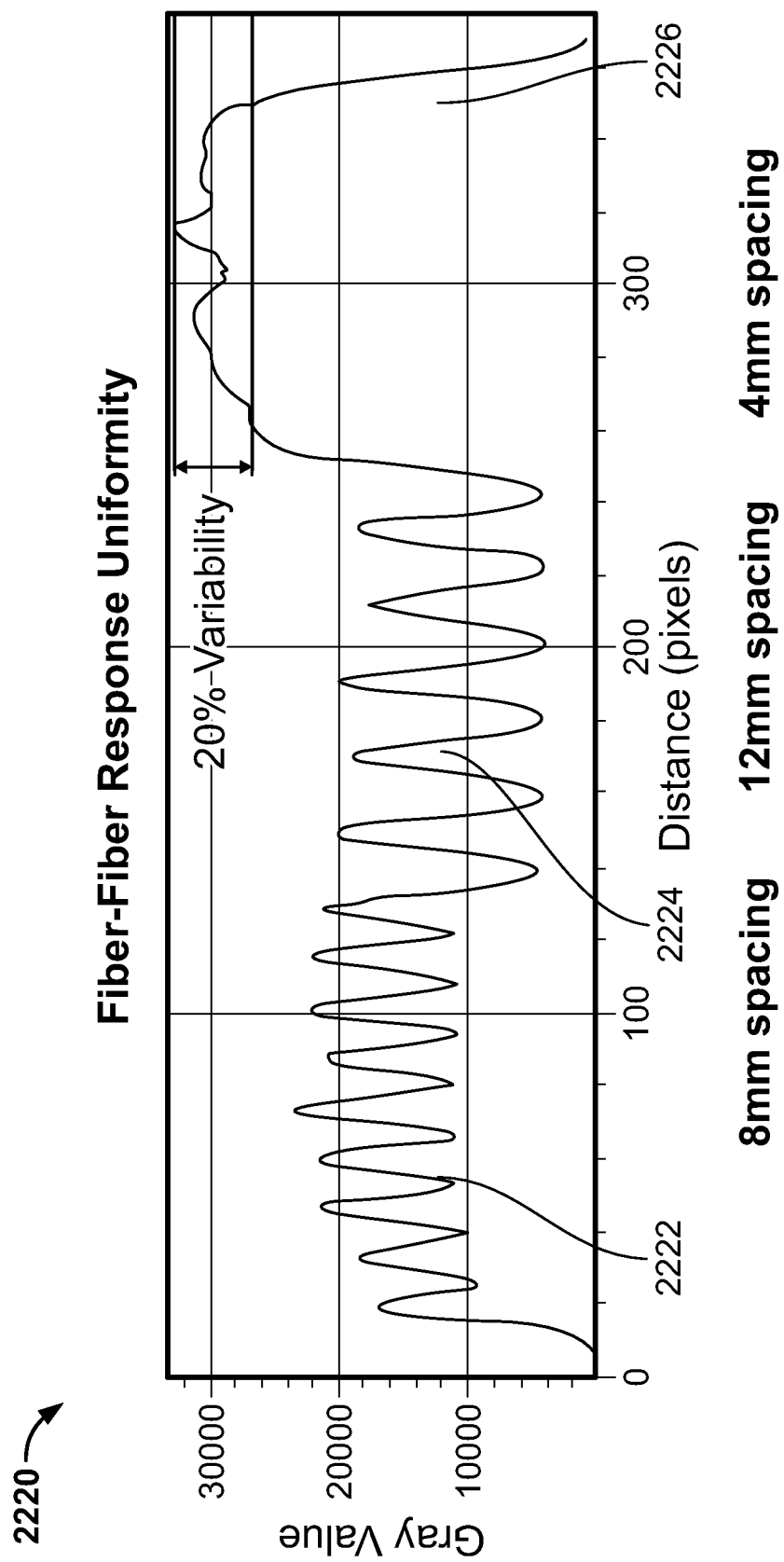
FIG. 22B illustrates a graph depicting the fiber response uniformity of the detector shown in FIG. 22A.

FIG. 22B illustrates a graph 2220 depicting the fiber response uniformity of the detector shown in FIG. 22A. The graph 2220 shows the detector response 2222, 2224 and 2226 when the fibers are separated by a distance of 8 mm, 12 mm and 4 mm respectively. As can be seen, variability in the response 2226 when the WSF fibers of the detector are separated by a distance of 4 mm is minimum, being approximately 20%.

In an embodiment, the high resolution layer 2202 comprises a set of 8 (only 5 shown in FIG. 22A) high resolution fibers which are configured to occupy 8 regions of the detector. In embodiments, the number of fibers is limited by a number of elements in a PMT coupled with said fibers, which must include the high and low resolution detection capabilities. Segmented PMT's typically have 16 elements, so in embodiments, a maximum of 15 elements may be dedicated to the high resolution fibers and one to the low fiber.

Figure 22C:
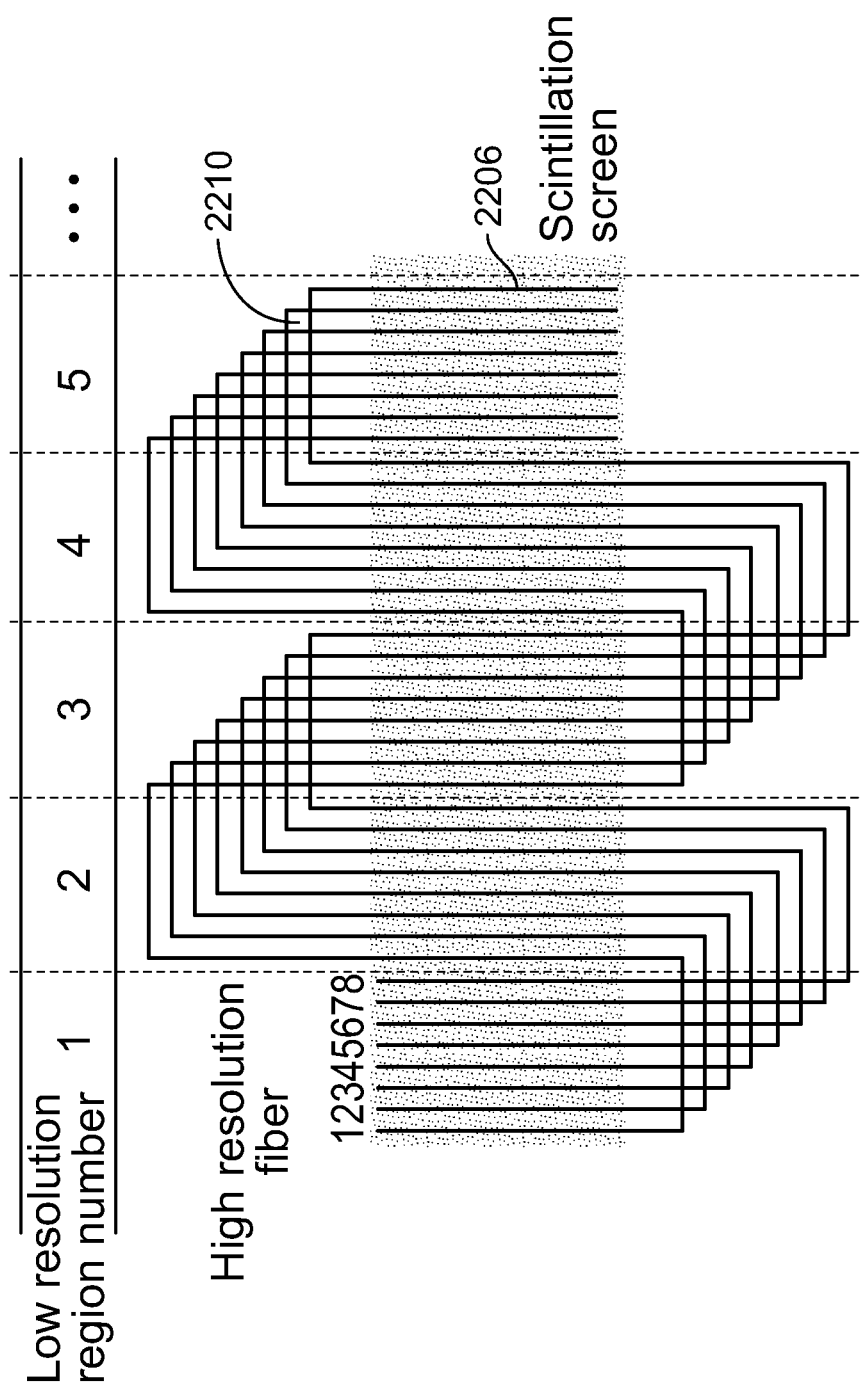
FIG. 22C illustrates a high resolution fiber layout, in accordance with an embodiment of the present specification.

FIG. 22C illustrates a high resolution fiber layout, in accordance with an embodiment of the present specification. FIG. 22C also shows the addressing of detector signals coupled with a segmented PMT (not shown in the FIG.). In the case where the PMT has 16 elements, 8 channels are dedicated to the high resolution fibers and 8 are dedicated to low resolution fibers. In order to obtain a beam placement position for obtaining the intensity distribution at high resolution in the detector 2200, a number of high resolution fibers for each region are required. In an embodiment as shown in FIG. 22C, high resolution fibers comprise a series of WS fibers 2210 placed parallel to each other with minimum or no spacing, where each WS fiber 2210 extends through, out, and back into a detection region under a scintillation screen 2206. This configuration of fibers provides a dense detection area without having too many individual WSFs entering a PMT coupled with the WSF detector. In an embodiment, as shown in FIG. 22C due to repeated usage of 8 WS fibers in and out of the detection region in a serpentine configuration allows for a single WS fiber 2210 to detect multiple instances of impinging light across both the width and breadth of the WSF detector. Hence, this configuration makes the WSF detector more sensitive to intensity of incident radiation in comparison to a detector comprising WSFs laid out in a straight configuration. The high resolution fibers shown in FIG. 22C better detects intensity due to the dense WS coverage provided by using a small number (eight) of looping fibers 2210. In an embodiment, the high resolution layer of WSF comprises fifteen fibers placed in close contact and parallel to each other, to provide in a loop back configuration as shown in FIG. 22C. In various embodiments, a maximum distance between the fibers is 1 mm.

Figure 23:
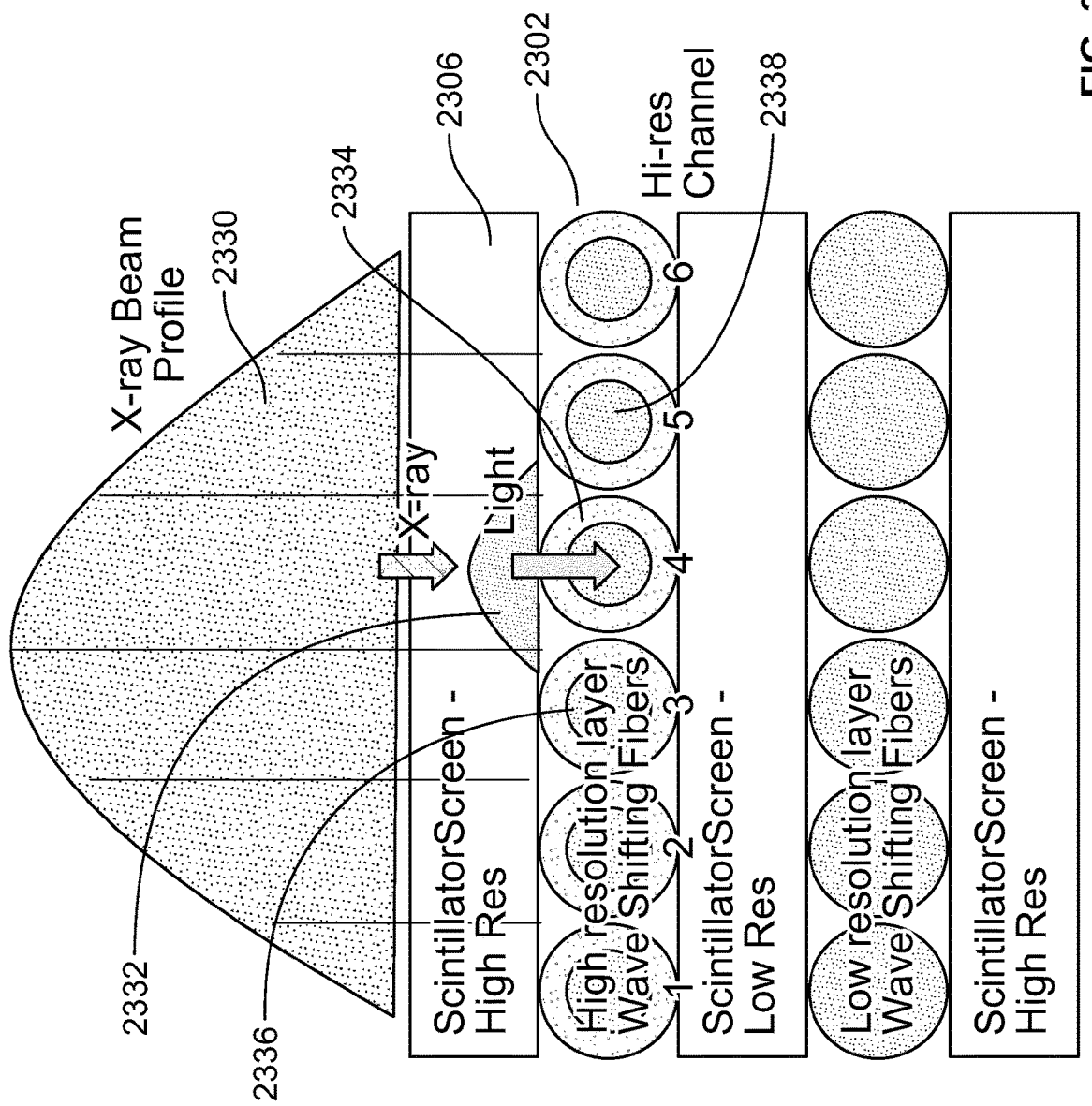
FIG. 23 illustrates X-ray absorption and light collection in a high resolution layer of a WSF detector, in accordance with an embodiment of the present specification.

FIG. 23 illustrates X-ray absorption and light collection in a high resolution layer of a WSF detector, in accordance with an embodiment of the present specification. Incident X ray beam 2330 is absorbed by a scintillator screen 2306 of the WSF detector 2300. Following X-ray absorption, visible scintillation light propagates in the screen 2306 and is scattered or absorbed. As the light spreads due to scattering in the scintillator layer 2306, it is distributed over a spatial area and as a result, a single X-ray event may couple light intensity to multiple fibers. As seen in the figure, the green light plume 2332 spreads beyond the region of fiber 4, 2334 and into fiber 3, 2336 and fiber 5, 2338. In an embodiment, high resolution fibers detection regions may be positioned in predefined areas of a WSF detector array so that an incident X ray beam may also be positioned in said areas only, for improving detection efficiency of the WSF detector.

The density of the scintillators for each layer of the detector 2300 is tuned so that the detector achieves a high resolution in a front scintillator but would allow enough X-ray through to affect detection of both high energy and low energy radiation.

Figure 24B:
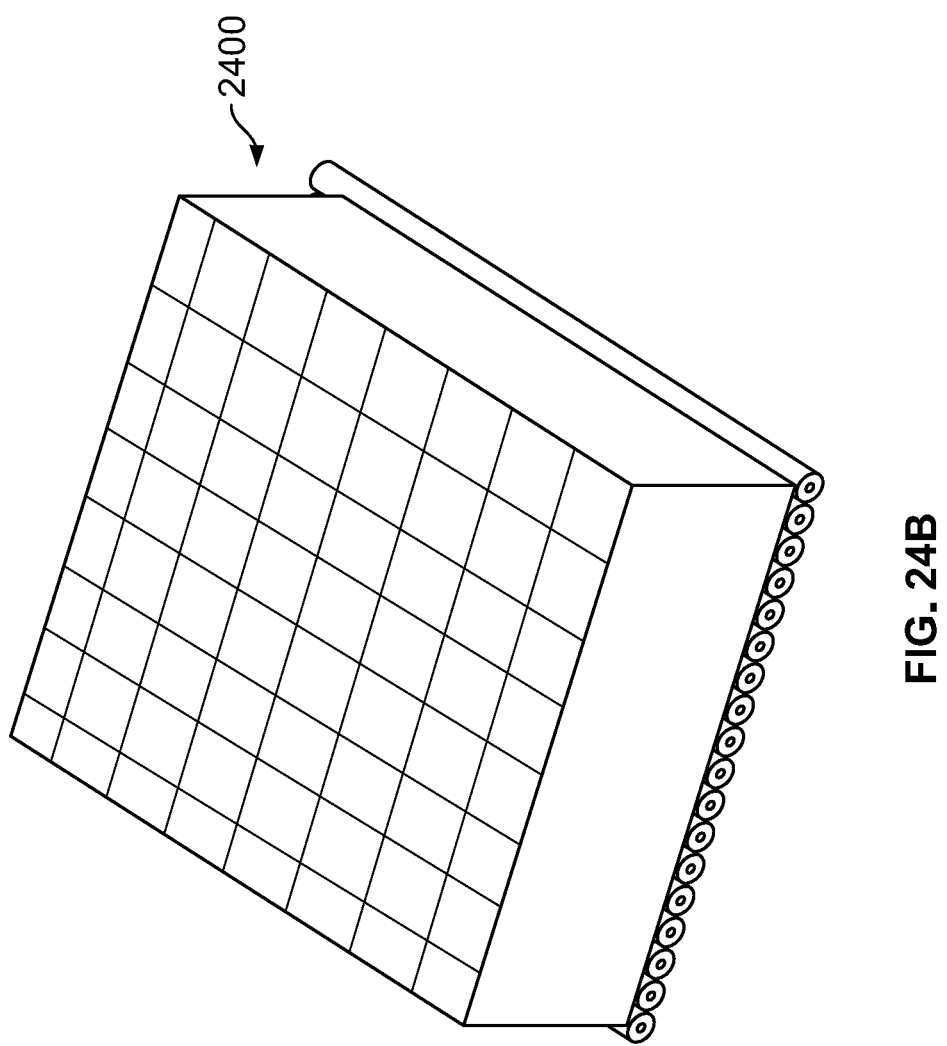
FIG. 24B is a diagrammatical representation of a 64 channel multi-anode PMT assembly that may be used for reading light signals captured by the WSF detector of the present specification.

As described above, the ends of the WSF are bundled and optically coupled to at least one photodetector. In an embodiment the detector resolution is enhanced by detecting the signal intensity for individual WSF fibers with a multi-channel PMT. In an embodiment, in order to reduce the number of channels to a manageable size, individual readouts corresponding to each WSF fiber are multiplexed between high and low resolution layers of the WSF detector. FIG. 24A illustrates a 16-channel PMT coupling signals obtained from all high resolution fibers and low resolution fibers of the detector illustrated in FIG. 22A, in accordance with an embodiment of the present specification. In various embodiments, the multi-layer detector 2200 multiplexes the fibers/channels and provides a detector readout that is cost-effective. In an embodiment, commercially available segmented PMT's may be used. FIG. 24B is a diagrammatical representation of a 64-channel multi-anode PMT assembly 2400 that may be used for reading the light signals captured by the WSF detector of the present specification.

FIG. 25 is a block diagram illustrating the layers of an exemplary multi-layer high-resolution detector, in accordance with an embodiment of the present specification. Detector 2500 comprises a first horizontal detector layer 2502, a second scintillator layer 2504, a third high-resolution WSF layer comprising individual fibers coupled to PMT anodes 2506, a fourth scintillator layer 2508, and a fifth layer 2509 comprising low-resolution WSF groups of fibers coupled to PMT anodes. In an embodiment, one or more scintillator filters are embedded in the multi-layer WSF detector, in order to separate materials in the image data obtained via the detector. In an embodiment, firstly the fibers are placed in a desired configuration and then scintillator is molded around the fiber configuration. In another embodiment, each fiber is first coated with scintillator and then placed in the desired position in the WSF detector.

Enhanced Resolution WSF Detector Panels:

In an embodiment, the present specification provides a detector panel comprising WSF detectors. The detector panel is designed for placement at any position relative to a portable/handheld scanner. In an embodiment where said detector panel is placed in the direct beam of an X-ray source, the detector panel acts as a transmission detector.

FIG. 26A illustrates a detector panel placed in direct beam of scanning radiations emitted by a small portable scanner being used to scan an object, in accordance with an embodiment of the present specification. As shown, detector panel 2602 is placed behind a concrete block 2604 which is being scanned by a portable scanner comprising an X-ray source (not shown in the figure) such that the detector panel 2602 is placed in a direct beam path of the radiation being emitted by said source. The concrete block 2604 contains a steel pipe bomb 2606 (partially visible in FIG. 26A) and a hand grenade (not visible in FIG. 26A). FIG. 26B illustrates a backscatter image obtained by the scanner of FIG. 26A, in accordance with an embodiment of the present specification. A backscatter image 2608 obtained by said hand held scanner, which is obtained using the in-built detectors of said scanner does not show either the steel pipe bomb 2606 or the hand grandee contained within the concrete block 2604. FIG. 26C illustrates a transmission image obtained by a built-in detector of the scanner of FIG. 26A by using the detector panel 2602 as shown in FIG. 26A, in accordance with an embodiment of the present specification. As can be seen in FIG. 26C, the transmission image 2610 clearly shows a hand grenade 2612 and the steel pipe bomb 2606 contained within the concrete block 2604. The spatial resolution of the transmission image 2610 is governed by the scanning beam spot size, however, the beam penetration and SNR is greatly enhanced as compared to the backscatter image 2608. FIG. 26D illustrates transmission images of a gun placed behind steel walls of different thickness obtained by using the detector panel shown in FIG. 26A. Images 2620, 2622, 2624, 2626 illustrates the images of a gun placed behind 3.2 mm, 6.4 mm, 12.7 mm, and 19.1 mm of steel respectively.

With the use of detector panels along with portable/hand held scanners, as shown in FIG. 26A, a challenge is that there is no pre-established physical configuration between the detector and the scanning source. If the position of the source relative to the detector is known/fixed, the location of impurities and irregularities in the detector may be fixed, and hence, any detected data could be automatically corrected for said irregularities. Specifically, the gain could be corrected (increased/decreased) to account for spots or lines due to issues in manufacturing of the scanner/detector. However, with the use of the detector panel as described in the present specification, the relative configuration of the detector panel and the scanning source is changeable, making it difficult to predict precisely the location of non-uniformities in the scanning image. Hence, the non-uniformities that are inherent to the detector response cannot be corrected using known gain correction methods. Without gain calibration the signals received by using the scanner and detector as shown in FIG. 26A will be raw and may include defects such as, but not limited to: gain non-uniformity due to variations in the X-ray absorption in scintillator; non uniformity in the scintillator light production and propagation; and non-uniformity in light collection across the area of detector.

The challenge, therefore, is to create a detector panel where X-ray spot generates same amount of light at a PMT corresponding to any spot that X-ray hits the detector panel so that no gain correction is required. The more uniform the response, the lower the variability. With the use of conventional fixed X-ray source detector configurations, a variability ranging from 30% to 40% may be tolerated. However, for handheld scanner and detector configurations, a variability of 10% or less is required.

Figure 27A:
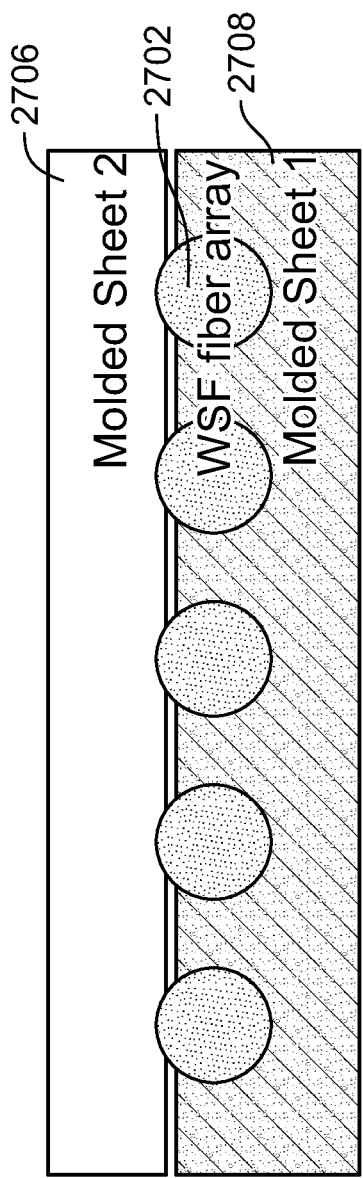
FIG. 27A illustrates a diagrammatical representation of a WSF detector panel, in accordance with another embodiment of the present specification.
Figure 27B:
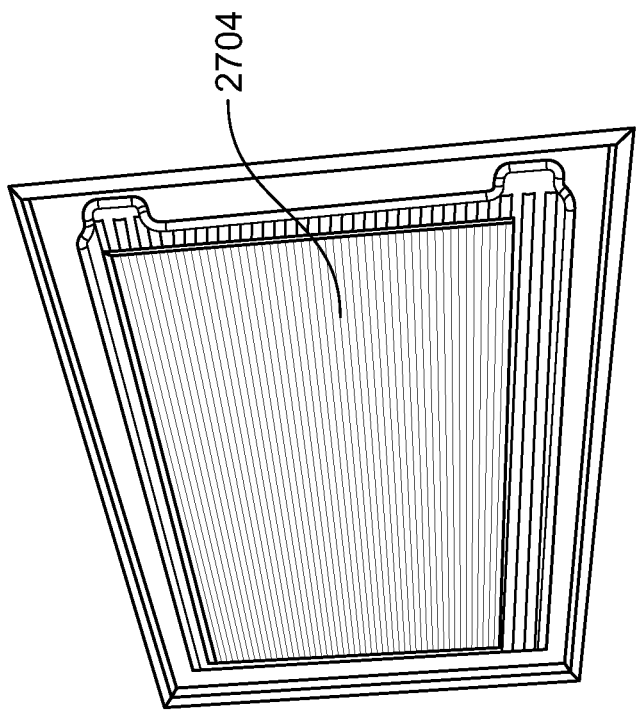
FIG. 27B illustrates the WSF detector panel of FIG. 27A, in accordance with an embodiment of the present specification.

FIG. 27A illustrates a diagrammatical representation of a WSF detector panel, in accordance with another embodiment of the present specification. FIG. 27B illustrates the WSF detector panel of FIG. 27A, in accordance with an embodiment of the present specification. Referring to FIGS. 27A and 27B, a plurality of WSF fibers 2702 are held together at a predefined distance forming a detector panel 2704 by molded sheets of a transparent, flexible plastic binder 2706, 2708 with scintillator powder embedded. In some embodiments, the transparent, flexible plastic binder 2706, 2708 is silicone. In some embodiments, the transparent, flexible plastic binder 2706, 2708 is polyvinyl butyral (PVB) mixed with a plasticizer. In an embodiment, a spacing of 3 mm is maintained between the fibers 2702 by adjusting the scintillator powder concentration. A spacing of 3 mm is used as the variability in light intensity across the detector panel disappears at sizes greater than 4 mm, as shown in FIG. 22B. As the powder concentration in the detector panel decreases, the light is able to travel further, providing a more uniform response. In an embodiment, the ends of fibers 2702 are bundled into PMTs and may be read out from one or both ends, as shown in FIG. 8 above. The detector shown in FIGS. 27A, 27B is easy to manufacture, and minimizes the number of WSF fibers required to obtain a detector of a desired area. The detector also provides a uniform coupling of light in associated PMT leading to a signal detection.

Figure 28:
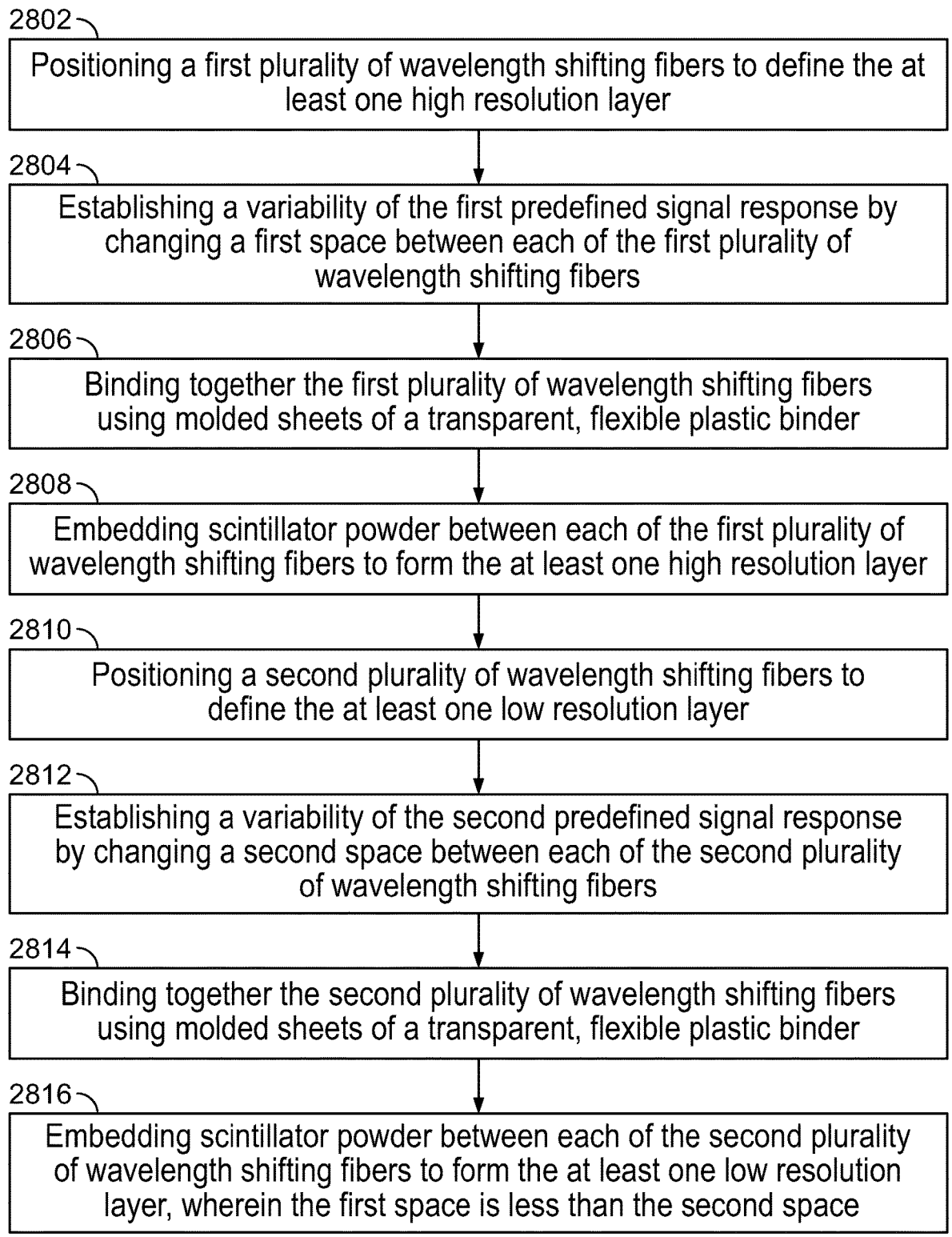
FIG. 28 is a flowchart illustrating the steps in a method of forming a detector with at least one high resolution layer and at least one low resolution layer, in accordance with some embodiments of the present specification.

FIG. 28 is a flowchart illustrating the steps in a method of forming a detector with at least one high resolution layer and at least one low resolution layer, wherein the at least one high resolution layer has a first predefined signal response and wherein the at least one low resolution layer has a second predefined signal response, in accordance with some embodiments of the present specification. In some embodiments, the method comprises: at step 2802, positioning a first plurality of wavelength shifting fibers to define the at least one high resolution layer; at step 2804, establishing a variability of the first predefined signal response by changing a first space between each of the first plurality of wavelength shifting fibers; at step 2806, binding together the first plurality of wavelength shifting fibers using molded sheets of a transparent, flexible plastic binder; at step 2808, embedding scintillator powder between each of the first plurality of wavelength shifting fibers to form the at least one high resolution layer; at step 2810, positioning a second plurality of wavelength shifting fibers to define the at least one low resolution layer; at step 2812, establishing a variability of the second predefined signal response by changing a second space between each of the second plurality of wavelength shifting fibers; at step 2814, binding together the second plurality of wavelength shifting fibers using molded sheets of a transparent, flexible plastic binder; and, at step 2816, embedding scintillator powder between each of the second plurality of wavelength shifting fibers to form the at least one low resolution layer, wherein the first space is less than the second space.

The above examples are merely illustrative of the many applications of the system and method of present specification. Although only a few embodiments of the present specification have been described herein, it should be understood that the present specification might be embodied in many other specific forms without departing from the spirit or scope of the specification. Therefore, the present examples and embodiments are to be considered as illustrative and not restrictive, and the specification may be modified within the scope of the appended claims.

We claim:

1. A handheld backscatter imaging system having a first configuration and a second configuration, comprising:
a first housing having a body and a handle attached to the body, wherein the first housing has a first outer periphery;
a radiation source positioned in the first housing;
a first backscatter detector positioned within the first housing and positioned around an opening through which the radiation source emits X-rays; and
a second plurality of backscatter detectors positioned in a second housing having a first inner periphery, wherein the first inner periphery configured to attach to one or more edges of the first outer periphery,
wherein, in the first configuration, a) the first backscatter detector and the first housing within which the first backscatter detector is positioned, and b) the second plurality of backscatter detectors and the second housing within which the second plurality of backscatter detectors are positioned, do not form a single plane facing an object being scanned by the handheld backscatter imaging system; and
wherein, in the second configuration, a) the first backscatter detector and the first housing within which the first backscatter detector is positioned, and b) the second plurality of backscatter detectors and the second housing within which the second plurality of backscatter detectors are positioned, form a single plane facing the object being scanned by the handheld backscatter imaging system.

2. The handheld backscatter imaging system of claim 1, wherein the second housing containing the second plurality of backscatter detectors is configured to adopt the second configuration in order to detect threat materials.

3. The handheld backscatter imaging system of claim 1, wherein the second plurality of backscatter detectors comprises individual detectors and wherein each of the second plurality of backscatter detectors has a length dimension of approximately 10 cm, a width dimension of approximately 10 cm, and a thickness of approximately 5 mm.

4. The handheld backscatter imaging system of claim 1, wherein a ratio of a) a square of a thickness of each of the second plurality of backscatter detectors to b) an active detector area of each of the second plurality of backscatter detectors is less than 0.001.

5. The handheld backscatter imaging system of claim 1, wherein the first backscatter detector and/or the second plurality of backscatter detectors has a total weight ranging from 0.5 Kg to 1 Kg.

6. The handheld backscatter imaging system of claim 1, wherein the handheld backscatter imaging system has a backscatter detection area of at least 2,000 cm$^2$.

7. The handheld backscatter imaging system of claim 1, wherein the radiation source is adapted to emit a fan beam of X-rays or a pencil beam of X-rays.

8. The handheld backscatter imaging system of claim 7, wherein the opening is adapted to permit radiation to be emitted from the handheld backscatter imaging system and wherein the first backscatter detector is positioned proximate to the opening.

9. The handheld backscatter imaging system of claim 1, wherein the second housing containing the second plurality of detectors is foldably attached to the one or more edges positioned around the first housing within which the first backscatter detector is positioned and wherein, when in the first configuration, the second housing containing each of the second plurality of detectors is in a folded configuration.

10. The handheld backscatter imaging system of claim 1, wherein the housing containing each of the second plurality of detectors is slidably attached to the one or more edges positioned around the first housing within which the first backscatter detector is positioned.

11. A handheld backscatter imaging system, comprising:
a first housing having a first outer periphery;
a source of X-ray radiation positioned in the housing;
a first backscatter detector positioned within the first housing which has a top side, a bottom side, a left side, and a right side, wherein a portion of the first housing proximate the first backscatter detector defines a first plane and wherein the first backscatter detector is adjacent an opening through which the radiation source emits X-rays; and
second backscatter detectors having a first configuration and a second configuration,
wherein, in the first configuration, the first housing containing the first backscatter detector and a second housing containing the second backscatter detectors do not align in the first plane, said second housing having a first inner periphery,
wherein, in the second configuration, the first housing containing the first backscatter detector and the second housing containing the second backscatter detectors are positioned such that they align in the first plane, forming a single plane facing an object being scanned by the handheld backscatter imaging system, and
wherein a portion of the first inner periphery is configured to attach to one or more edges of the first outer periphery.

12. The handheld backscatter imaging system of claim 11, wherein the first housing further comprises a handle.

13. The handheld backscatter imaging system of claim 11, wherein the second backscatter detectors comprise individual detectors and wherein each of the individual second backscatter detectors has a length dimension of approximately 10 cm, a width dimension of approximately 10 cm, and a thickness of approximately 5 mm.

14. The handheld backscatter imaging system of claim 13, wherein a ratio of a) a square of a thickness of each of the individual second backscatter detectors to b) an active detector area of each of the individual second backscatter detectors is less than 0.001.

15. The handheld backscatter imaging system of claim 11, wherein at least one of the first backscatter detector or the second backscatter detectors has a total weight ranging from 0.5 Kg to 1 Kg.

16. The handheld backscatter imaging system of claim 11, wherein the handheld backscatter imaging system has a backscatter detection area of at least 2,000 cm$^2$.

17. The handheld backscatter imaging system of claim 11, wherein the source of X-ray radiation is adapted to emit a fan beam or a pencil beam.

18. The handheld backscatter imaging system of claim 17, wherein the opening is adapted to permit radiation to be emitted from the handheld backscatter imaging system and wherein the first backscatter detector is positioned proximate to the opening.

19. The handheld backscatter imaging system of claim 11, wherein the second housing containing the second backscatter detectors is configured to be foldably attached to the one or more edges of the first housing positioned around the first backscatter detector and wherein, when in the first configuration, the second housing containing the second backscatter detectors is in a folded configuration.

20. The handheld backscatter imaging system of claim 11, wherein the second housing containing the second backscatter detectors is slidably attached to the one or more edges of the first housing positioned around the first backscatter detector.

21. A handheld backscatter imaging system, comprising:
a first housing having a body and a front face defining a first plane, wherein the front face has a first outer periphery having a right side, a left side, a top side, and a bottom side;
a radiation source positioned in the first housing;
a first backscatter detector positioned within the first housing and proximate the front face, wherein the front face has an opening through which the radiation source emits X-rays; and
second backscatter detectors positioned within a second housing having a first configuration and a second configuration,
wherein the second housing has a first inner periphery, wherein the first inner periphery is configured to attach to one or more sides of the first outer periphery,
wherein, in the first configuration, the second housing containing the second backscatter detectors is not positioned such that a detecting surface of each of the second backscatter detectors and a detecting surface of the first backscatter detector form a single plane facing an object being scanned by the handheld backscatter imaging system, wherein, in the second configuration, the second housing containing the second backscatter detectors are positioned such that a detecting surface of each of the second backscatter detectors and a detecting surface of the first backscatter detector form a single plane facing an object being scanned by the handheld backscatter imaging system; and wherein, in the second configuration, the second housing containing a first portion of the second backscatter detectors is positioned adjacent to and configured to attach to the right side of the front face, the second housing containing a second portion of the second backscatter detectors is positioned adjacent to and configured to attach to the left side of the front face, the second housing containing a third portion of the second backscatter detectors is positioned adjacent to and configured to attach to the top side of the front face, and the second housing containing a fourth portion of the second backscatter detectors is positioned adjacent to and configured to attach to the bottom side of the front face.

22. The handheld backscatter imaging system of claim 21, wherein the first housing further comprises a handle.

23. The handheld backscatter imaging system of claim 21, wherein the second backscatter detectors comprise individual detectors and wherein each of the individual second backscatter detectors has a length dimension of approximately 10 cm, a width dimension of approximately 10 cm, and a thickness of approximately 5 mm.

24. The handheld backscatter imaging system of claim 23, wherein a ratio of a) a square of a thickness of each of the individual second backscatter detectors to b) an active detector area of each of the individual second backscatter detectors is less than 0.001.

25. The handheld backscatter imaging system of claim 21, wherein at least one of the first backscatter detector or the second backscatter detectors has a total weight ranging from 0.5 Kg to 1 Kg.

26. The handheld backscatter imaging system of claim 21, wherein the handheld backscatter imaging system has a backscatter detection area of at least 2,000 cm$^2$.

27. The handheld backscatter imaging system of claim 21, wherein the radiation source is adapted to emit a fan beam of X-rays or a pencil beam of X-rays.

28. The handheld backscatter imaging system of claim 27, wherein the opening is adapted to permit X-ray radiation to be emitted from the handheld backscatter imaging system and wherein the first backscatter detector is positioned proximate the opening.

29. The handheld backscatter imaging system of claim 21, wherein the second housing containing the second backscatter detectors is configured to be foldably attached to one or more edges of the first housing positioned around the first backscatter detector and wherein, when in the first configuration, the second housing containing the second backscatter detectors is in a folded configuration.

30. The handheld backscatter imaging system of claim 21, wherein the second housing containing the second backscatter detectors is slidably attached to one or more edges of the first housing positioned around the first backscatter detector.

31. A handheld backscatter imaging system having a first configuration and a second configuration, comprising:
a first housing having a body and a handle attached to the body, wherein the first housing has a first outer periphery;
a source of X-ray radiation positioned in the first housing;
a first backscatter detector positioned within the first housing and positioned around an opening through which the radiation source emits X-rays; and
a second plurality of backscatter detectors external to the first housing and positioned in a second housing having a first inner periphery, wherein the first inner periphery is positioned adjacent to and configured to attach to one or more edges of the first outer periphery, wherein the second plurality of detectors has a first configuration and a second configuration,
wherein, in the first configuration, a) the first backscatter detector and the first housing within which the first backscatter detector is positioned, and b) the second plurality of backscatter detectors and the second housing within which the second plurality of backscatter detectors are positioned, do not form a single plane facing an object being scanned by the handheld backscatter imaging system; and
wherein, in the second configuration, a) the first backscatter detector and the first housing within which the first backscatter detector is positioned, and b) the second plurality of backscatter detectors and the second housing within which the second plurality of backscatter detectors are positioned, form a single plane facing an object being scanned by the handheld backscatter imaging system.

32. The handheld backscatter imaging system of claim 31, wherein the second housing containing the second plurality of backscatter detectors is configured to adopt the second configuration in order to detect threat materials.

33. The handheld backscatter imaging system of claim 31, wherein the second plurality of backscatter detectors comprises individual detectors and wherein each of the second plurality of backscatter detectors has a length dimension of approximately 10 cm, a width dimension of approximately 10 cm, and a thickness of approximately 5 mm.

34. The handheld backscatter imaging system of claim 31, wherein a ratio of a) a square of a thickness of each of the second plurality of backscatter detectors to b) an active detector area of each of the second plurality of backscatter detectors is less than 0.001.

35. The handheld backscatter imaging system of claim 31, wherein the first backscatter detector and/or the second plurality of backscatter detectors has a total weight ranging from 0.5 Kg to 1 Kg.

36. The handheld backscatter imaging system of claim 31, wherein the handheld backscatter imaging system has a backscatter detection area of at least 2,000 cm$^2$.

37. The handheld backscatter imaging system of claim 31, wherein the radiation source is adapted to emit a fan beam of X-rays or a pencil beam of X-rays.

38. The handheld backscatter imaging system of claim 37, wherein the opening is adapted to permit radiation to be emitted from the handheld backscatter imaging system and wherein the first backscatter detector is positioned proximate to the opening.

39. The handheld backscatter imaging system of claim 31, wherein the second housing containing the second plurality of detectors is configured to be foldably attached to the one or more edges positioned around the first housing within which the first backscatter detector is positioned and wherein, when in the first configuration, the second plurality of detectors are in a folded configuration.

40. The handheld backscatter imaging system of claim 31, wherein the second housing containing the second plurality of detectors is slidably attached to the one or more edges positioned around the first housing within which the first backscatter detector is positioned.

41. A handheld backscatter imaging system having a first configuration and a second configuration, comprising:
a first housing having a body and a handle attached to the body, wherein the first housing has a first outer periphery;
a source of X-ray radiation positioned in the first housing;
a first backscatter detector positioned within the first housing and positioned around an opening through which the radiation source emits X-rays; and
a second plurality of backscatter detectors positioned in a second housing having a first inner periphery, wherein the first inner periphery is configured to attach to one or more edges of the first outer periphery and wherein the second housing containing the second plurality of backscatter detectors is positioned adjacent to one or more edges of the first housing within which the first backscatter detector is positioned,
wherein, in a first configuration, a) the first backscatter detector and the first housing within which the first backscatter is positioned, and b) the second plurality of backscatter detectors and the second housing within which the second plurality of backscatter detectors are positioned, do not form a single plane facing an object being scanned by the handheld backscatter imaging system; and,
wherein, in a second configuration, a) the first backscatter detector and the first housing within which the first backscatter is positioned, and b) the second plurality of backscatter detectors and the second housing within which the second plurality of backscatter detectors are positioned, form a single plane facing the object being scanned by the handheld backscatter imaging system.

42. The handheld backscatter imaging system of claim 41, wherein the second housing containing the second plurality of backscatter detectors is configured to adopt the second configuration in order to detect threat materials.

43. The handheld backscatter imaging system of claim 41, wherein the second plurality of backscatter detectors comprises individual detectors and wherein each of the second plurality of backscatter detectors has a length dimension of approximately 10 cm, a width dimension of approximately 10 cm, and a thickness of approximately 5 mm.

44. The handheld backscatter imaging system of claim 41, wherein a ratio of a) a square of a thickness of each of the second plurality of backscatter detectors to b) an active detector area of each of the second plurality of backscatter detectors is less than 0.001.

45. The handheld backscatter imaging system of claim 41, wherein the first backscatter detector and/or the second plurality of backscatter detectors has a total weight ranging from 0.5 Kg to 1 Kg.

46. The handheld backscatter imaging system of claim 41, wherein the handheld backscatter imaging system has a backscatter detection area of at least 2,000 cm$^2$.

47. The handheld backscatter imaging system of claim 41, wherein the radiation source is adapted to emit a fan beam of X-rays or a pencil beam of X-rays.

48. The handheld backscatter imaging system of claim 47, wherein the opening adapted to permit radiation to be emitted from the handheld backscatter imaging system and wherein the first backscatter detector is positioned proximate to the opening.

49. The handheld backscatter imaging system of claim 41, wherein the second housing containing the second plurality of detectors is foldably attached to the one or more edges positioned around the first housing within which the first backscatter detector is positioned and wherein, when in the first configuration, the second housing containing the second plurality of detectors is in a folded configuration.

50. The handheld backscatter imaging system of claim 41, wherein the second housing containing the second plurality of detectors is slidably attached to the one or more edges positioned around the first housing within which the first backscatter detector is positioned.

51. A handheld backscatter imaging system having a first configuration and a second configuration, comprising:
a first housing having a body and a handle attached to the body, wherein the first housing has a first outer periphery;
a source of X-ray radiation positioned in the first housing;
a first backscatter detector positioned within the first housing and positioned around an opening through which the radiation source emits X-rays;
wherein said first housing within which the first backscatter detector is positioned includes one or more edges, said one or more edges being configured to support a second housing containing a second plurality of backscatter detectors external to the first housing within which the first backscatter detector is positioned,
wherein the second housing has a first inner periphery;
wherein, in the first configuration, a) the first backscatter detector and the first housing within which the first backscatter detector is positioned, and b) the second plurality of backscatter detectors and the second housing within which the second plurality of backscatter detectors are positioned, do not form a single plane facing an object being scanned by the handheld backscatter imaging system; and,
wherein, in the second configuration, a) the first backscatter detector and the first housing within which the first backscatter detector is positioned, and b) the second plurality of backscatter detectors and the second housing within which the second plurality of backscatter detectors are positioned, form a single plane facing the object being scanned by the handheld backscatter imaging system; and,
wherein the first inner periphery is configured to attach to one or more edges of the first outer periphery.

52. The handheld backscatter imaging system of claim 51, wherein the second housing containing the second plurality of backscatter detectors is configured to adopt the second configuration in order to detect threat materials.

53. The handheld backscatter imaging system of claim 51, wherein the second plurality of backscatter detectors comprises individual detectors and wherein each of the second plurality of backscatter detectors has a length dimension of approximately 10 cm, a width dimension of approximately 10 cm, and a thickness of approximately 5 mm.

54. The handheld backscatter imaging system of claim 51, wherein a ratio of a) a square of a thickness of each of the second plurality of backscatter detectors to b) an active detector area of each of the second plurality of backscatter detectors is less than 0.001.

55. The handheld backscatter imaging system of claim 51, wherein the first backscatter detector and/or the second plurality of backscatter detectors has a total weight ranging from 0.5 Kg to 1 Kg.

56. The handheld backscatter imaging system of claim 51, wherein the handheld backscatter imaging system has a backscatter detection area of at least 2,000 cm$^2$.

57. The handheld backscatter imaging system of claim 51, wherein the radiation source is adapted to emit a fan beam of X-rays or a pencil beam of X-rays.

58. The handheld backscatter imaging system of claim 57, wherein opening is adapted to permit radiation to be emitted from the handheld backscatter imaging system and wherein the first backscatter detector is positioned proximate to the opening.

59. The handheld backscatter imaging system of claim 51, wherein second the housing containing the second plurality of detectors is foldably attached to the one or more edges positioned around the first housing within which the first backscatter detector is positioned and wherein, when in the first configuration, the second housing containing the second plurality of detectors is in a folded configuration.

60. The handheld backscatter imaging system of claim 51, wherein second the housing containing the second plurality of detectors is slidably attached to the one or more edges positioned around the first housing within which the first backscatter detector is positioned.

* * * * *